(12) United States Patent
Saito et al.

(10) Patent No.: US 8,013,360 B2
(45) Date of Patent: Sep. 6, 2011

(54) SEMICONDUCTOR DEVICE HAVING A JUNCTION OF P TYPE PILLAR REGION AND N TYPE PILLAR REGION

(75) Inventors: Wataru Saito, Kanagawa-ken (JP); Syotaro Ono, Kanagawa-ken (JP); Masakatsu Takashita, Kanagawa-ken (JP); Yasuto Sumi, Kanagawa-ken (JP); Masaru Izumisawa, Kanagawa-ken (JP); Hiroshi Ohta, Tokyo (JP); Wataru Sekine, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/764,763

(22) Filed: Apr. 21, 2010

(65) Prior Publication Data

US 2010/0200936 A1 Aug. 12, 2010

Related U.S. Application Data

(62) Division of application No. 11/748,869, filed on May 15, 2007, now Pat. No. 7,737,469.

(30) Foreign Application Priority Data

| May 16, 2006 | (JP) | 2006-137050 |
| Jun. 20, 2006 | (JP) | 2006-170689 |
| Apr. 6, 2007 | (JP) | 2007-100460 |

(51) Int. Cl.
*H01L 29/66* (2006.01)

(52) U.S. Cl. .............................. 257/197; 257/341
(58) Field of Classification Search .................. 257/197, 257/341
See application file for complete search history.

(56) References Cited

U.S. PATENT DOCUMENTS

| 5,438,215 A | 8/1995 | Tihanyi |
| 6,300,171 B1 | 10/2001 | Frisina |
| 6,844,592 B2 | 1/2005 | Yamaguchi et al. |
| 6,870,201 B1 | 3/2005 | Deboy et al. |
| 6,888,195 B2 | 5/2005 | Saito et al. |
| 7,161,209 B2 | 1/2007 | Saito et al. |
| 2001/0032998 A1* | 10/2001 | Iwamoto et al. ............... 257/330 |
| 2004/0043565 A1 | 3/2004 | Yamaguchi et al. |
| 2004/0056306 A1 | 3/2004 | Saito et al. |
| 2006/0043480 A1 | 3/2006 | Tsuchitani et al. |

FOREIGN PATENT DOCUMENTS

| JP | 2000-183350 | 6/2000 |
| JP | 2000-277726 | 10/2000 |

* cited by examiner

*Primary Examiner* — Thanh V Pham
*Assistant Examiner* — Caleb Henry
(74) *Attorney, Agent, or Firm* — Oblon, Spivak, McClelland, Maier & Neustadt, L.L.P.

(57) ABSTRACT

A semiconductor device includes: a semiconductor layer of a first conductivity type; a first semiconductor pillar region of the first conductivity type provided on a major surface of the semiconductor layer; a second semiconductor pillar region of a second conductivity type provided adjacent to the first semiconductor pillar region on the major surface of the semiconductor layer, the second semiconductor pillar region forming a periodic arrangement structure substantially parallel to the major surface of the semiconductor layer together with the first semiconductor pillar region; a first main electrode; a first semiconductor region of the second conductivity type; a second semiconductor region of the first conductivity type; a second main electrode; a control electrode; and a high-resistance semiconductor layer provided on the semiconductor layer in an edge termination section surrounding the first semiconductor pillar region and the second semiconductor pillar region. The high-resistance semiconductor layer has a lower dopant concentration than the first semiconductor pillar region. A boundary region is provided between a device central region and the edge termination section. The first semiconductor pillar region and the second semiconductor pillar region adjacent to the high-resistance semiconductor layer in the boundary region have a depth decreasing stepwise toward the edge termination section.

8 Claims, 45 Drawing Sheets

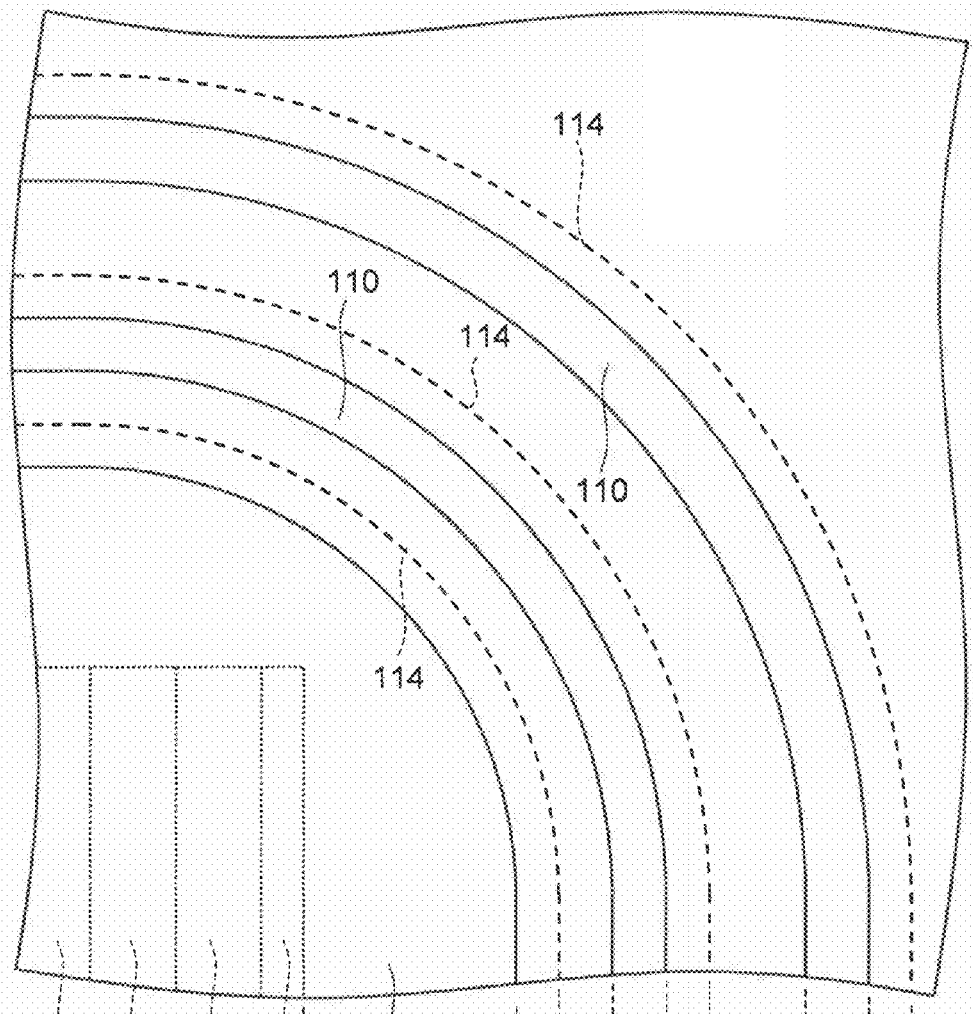
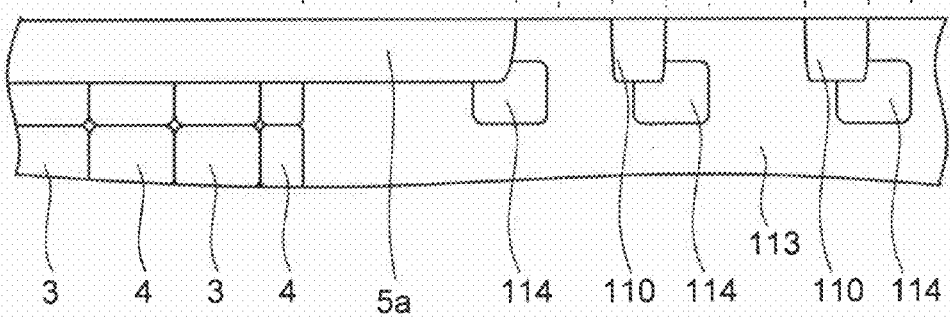

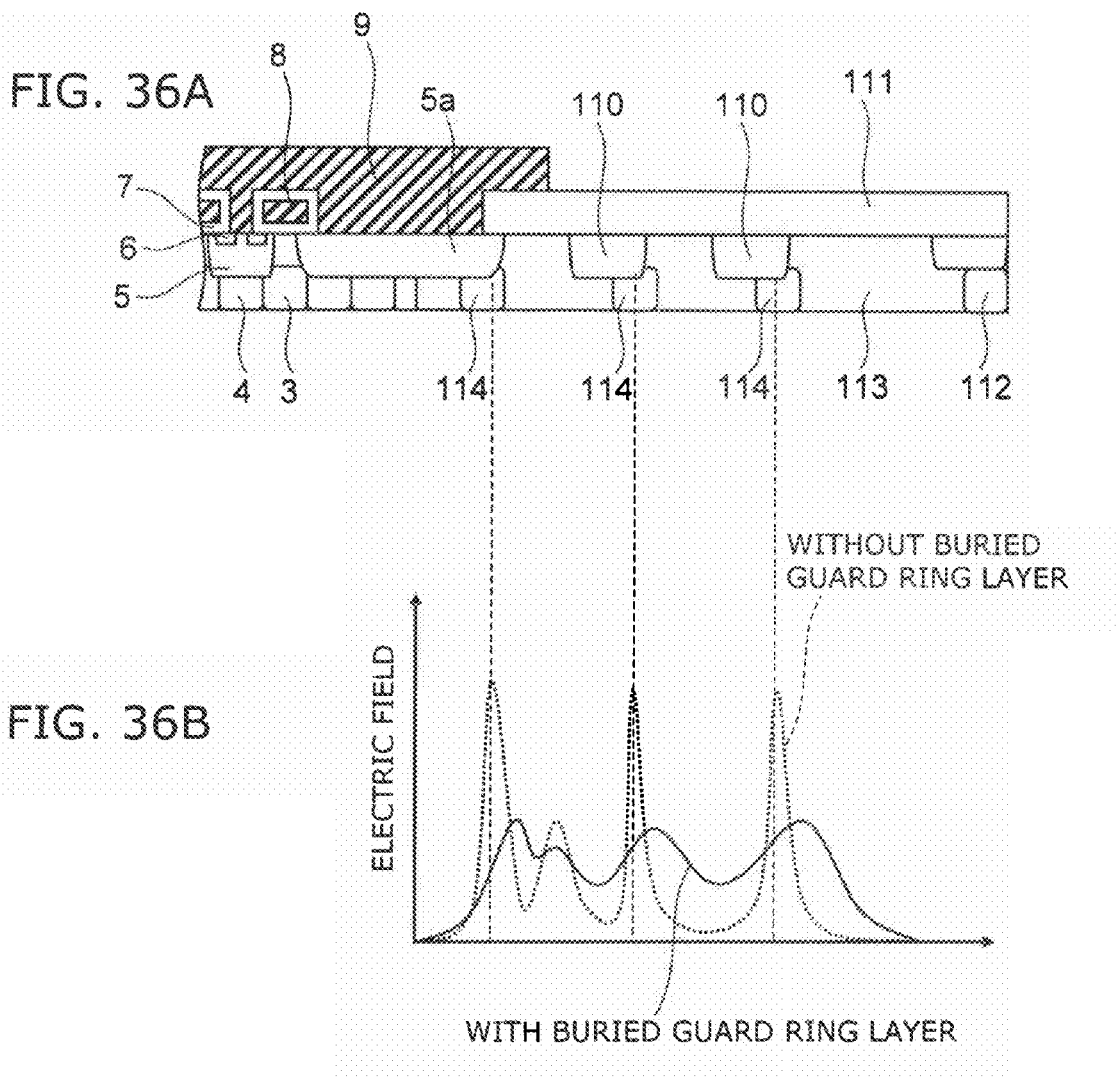

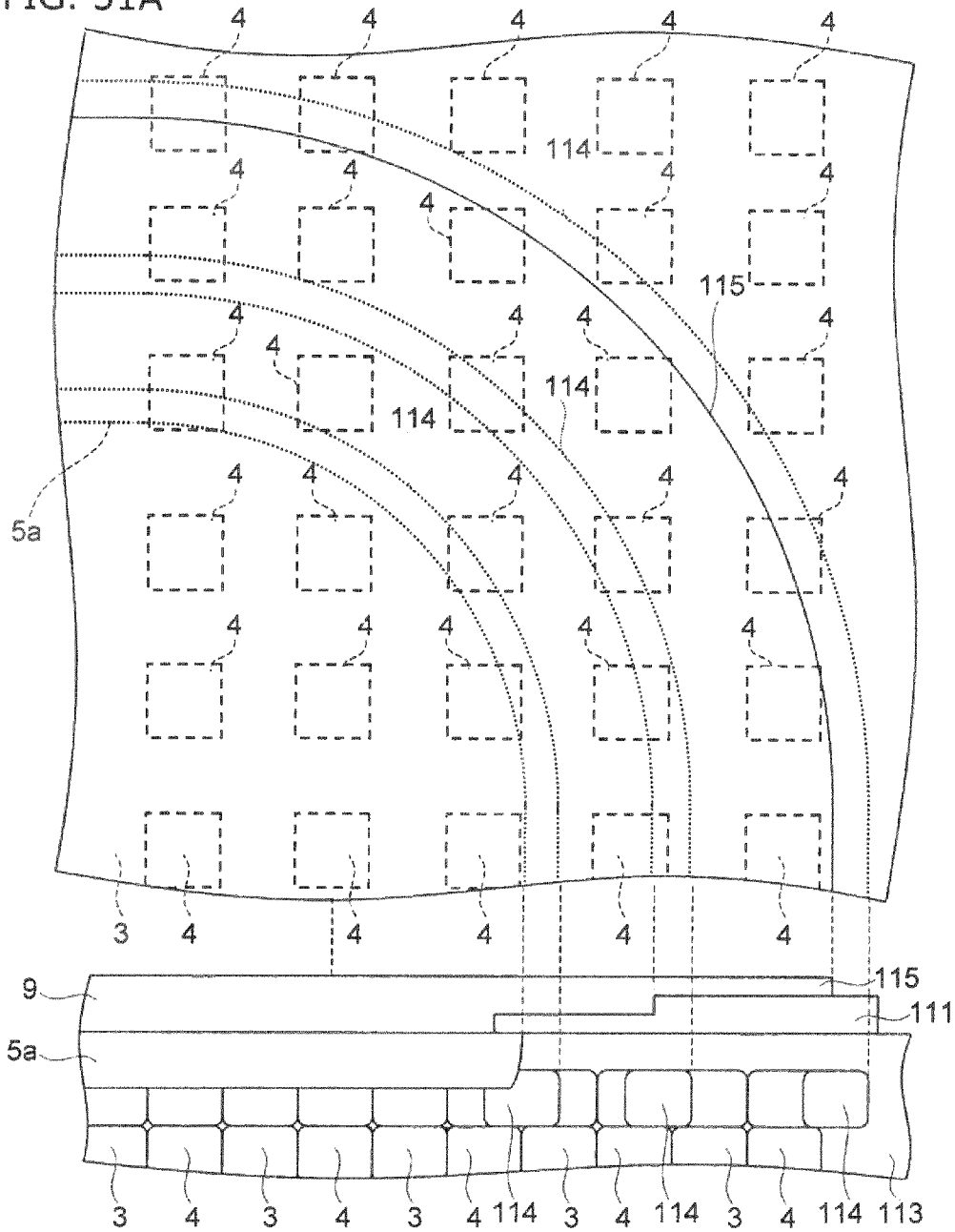

SEMICONDUCTOR DEVICE HAVING A JUNCTION OF P TYPE PILLAR REGION AND N TYPE PILLAR REGION

CROSS-REFERENCE TO RELATED APPLICATIONS

This application is a division of and claims the benefit of priority under 35 U.S.C. §120 from U.S. Ser. No. 11/748,869 filed May 15, 2007, and claims the benefit of priority under 35 U.S.C. §119 from Japanese Patent Applications No. 2006-137050 filed May 16, 2006, No. 2006-170689 filed Jun. 20, 2006, and No. 2007-100460 filed Apr. 6, 2007; the entire contents of each of which are incorporated herein by reference.

BACKGROUND OF THE INVENTION

1. Field of the Invention

This invention relates to a semiconductor device, and more particularly to a semiconductor device suitable to power electronics and other applications.

2. Background Art

The ON resistance of a vertical power MOSFET (Metal-Oxide-Semiconductor Field Effect Transistor) greatly depends on the electric resistance of its conduction layer (drift layer). The dopant concentration that determines the electric resistance of the drift layer cannot exceed a maximum limit, which depends on the breakdown voltage of a p-n junction formed by the base and the drift layer. Thus there is a tradeoff between the device breakdown voltage and the ON resistance. Improving this tradeoff is important for devices with low power consumption. This tradeoff has a limit determined by the device material. Overcoming this limit is the way to realizing devices with low ON resistance beyond existing power devices.

As an example MOSFET for solving this problem, a structure is known as a "superjunction structure", which is formed by p-type pillar regions and n-type pillar regions buried in the drift layer. In the superjunction structure, a non-doped layer is artificially produced by equalizing the amount of charge (amount of dopant) contained in the p-type pillar region and the n-type pillar region. Thus, with holding high breakdown voltage, a current is allowed to flow through the highly doped n-type pillar region, thereby realizing low ON resistance beyond the material limit. For holding high breakdown voltage, it is necessary to accurately control the amount of dopant in the n-type pillar region and the p-type pillar region.

In such a MOSFET with a superjunction structure formed in the drift layer, the design of the edge termination structure is also different from that of conventional power MOSFETs. Because the edge termination section as well as the device section needs to hold high breakdown voltage, the superjunction structure is formed also in the edge termination section. In this case, when the amount of dopant in the n-type pillar region is equal to that in the p-type pillar region, the breakdown voltage of the edge termination section decreases more significantly than that of the device section (cell section). JP 2000-277726A proposes a structure for preventing the decrease of breakdown voltage of the edge termination section where the edge termination section is formed from a high-resistance layer without a superjunction structure.

However, in this structure, the superjunction structure is discontinuous between the device section and the edge termination section. In the outermost portion of the superjunction structure, the dopant concentration in the p-type pillar region or n-type pillar region must be decreased to about half that in the cell section. For realizing such dopant concentration in the pillar region varied with position, the dose amount of ion implantation must be varied with position, or the opening width of the implantation mask must be varied. Varying the dose amount with position leads to decreased throughput such as implantation being divided into twice. On the other hand, varying the mask width can be easily realized by varying the lithography mask width. However, a conversion difference occurs between the lithography mask and the resist mask used for actual implantation. Dispersion in this conversion difference is equivalent to dispersion in the amount of dopant. Thus, unfortunately, the edge termination structure promising for high breakdown voltage in principle is difficult to realize and susceptible to process dispersion.

In the edge termination section without the "superjunction structure", the depletion layer extends vertically and horizontally. Hence the electric field concentrates at the edge of the base connected to the source electrode. Even if a guard ring structure or a field plate structure is used for preventing electric field concentration at the base edge, electric field concentration occurs at the edge of the guard ring layer or the edge of the field plate electrode in the semiconductor layer of the edge termination section.

Even if a high breakdown voltage can be held by forming a high-resistance layer in the edge termination section without the "superjunction structure", a sharp electric field peak may occur in the edge termination section. In this case, hot carriers generated by the high electric field degrades the field insulating film, and is likely to cause reliability degradation such as leak current variation, breakdown voltage variation, and breakdown. Furthermore, if an avalanche breakdown occurs in the edge termination section during application of high voltage, carriers due to the avalanche current further increases the electric field peak, and unfortunately, is likely to cause current concentration and device breakdown. Hence it is difficult to achieve high avalanche withstanding capability. Also in the recovery state after operation of the body diode, the vicinity of the base edge in the edge termination section is carrier-rich. Hence, with a high electric field peak, a local avalanche breakdown occurs, and is likely to cause device breakdown. Thus it is difficult to achieve high recovery capability.

In a structure disclosed in JP 2000-183350A, the edge termination section has a superjunction structure where the depth of p-type pillar regions is varied stepwise. However, in JP 2000-183350A, the edge termination section has no high-resistance layer, but has the same superjunction structure as the device section. Thus the decrease of breakdown voltage is likely to occur in the edge termination section because of variation in the amount of pillar dopant in the superjunction structure of the edge termination section.

SUMMARY OF THE INVENTION

According to an aspect of the invention, there is provided a semiconductor device including: a semiconductor layer of a first conductivity type; a first semiconductor pillar region of the first conductivity type provided on a major surface of the semiconductor layer; a second semiconductor pillar region of a second conductivity type provided adjacent to the first semiconductor pillar region on the major surface of the semiconductor layer, the second semiconductor pillar region forming a periodic arrangement structure substantially parallel to the major surface of the semiconductor layer together with the first semiconductor pillar region; a first main electrode provided on a side opposite to the major surface of the semiconductor layer; a first semiconductor region of the second conductivity type selectively provided on the first semiconductor pillar region and the second semiconductor pillar region; a second semiconductor region of the first conductivity type selectively provided in a surface of the first semiconductor region; a second main electrode provided in contact with the first semiconductor region and the second semiconductor region; a control electrode provided on the first semiconductor region, the second semiconductor region, and the first semiconductor pillar region via an insulating film; and a high-resistance semiconductor layer provided on the semiconductor layer in an edge termination section surrounding the first semiconductor pillar region and the second semiconductor pillar region, the high-resistance semiconductor layer having a lower dopant concentration than the first semiconductor pillar region, a boundary region being provided between a device central region and the edge termination section, and the first semiconductor pillar region and the second semiconductor pillar region adjacent to the high-resistance semiconductor layer in the boundary region having a depth decreasing stepwise toward the edge termination section.

According to another aspect of the invention, there is provided a semiconductor device including: a first semiconductor layer of a first conductivity type; a first semiconductor pillar region of the first conductivity type provided on a major surface of the first semiconductor layer; a second semiconductor pillar region of a second conductivity type provided adjacent to the first semiconductor pillar region on the major surface of the first semiconductor layer, the second semiconductor pillar region forming a periodic arrangement structure substantially parallel to the major surface of the first semiconductor layer together with the first semiconductor pillar region; a first main electrode provided on a side opposite to the major surface of the first semiconductor layer; a first semiconductor region of the second conductivity type selectively provided on the first semiconductor pillar region and the second semiconductor pillar region; a second semiconductor region of the first conductivity type selectively provided in a surface of the first semiconductor region; a second main electrode provided in contact with the first semiconductor region and the second semiconductor region; a control electrode provided on the first semiconductor region, the second semiconductor region, and the first semiconductor pillar region via an insulating film; a second semiconductor layer of the first conductivity type provided on the first semiconductor layer in an edge termination section outside a device section including the periodic arrangement structure of the first semiconductor pillar region and the second semiconductor pillar region, the second semiconductor layer having a lower dopant concentration than the first semiconductor pillar region; and a buried guard ring layer of the second conductivity type semiconductor selectively buried in the second semiconductor layer.

According to another aspect of the invention, there is provided a semiconductor device including: a first semiconductor layer; a second semiconductor layer of a first conductivity type provided on a major surface side of the first semiconductor layer; a first main electrode provided on a side opposite to the major surface of the first semiconductor layer; a semiconductor region of a second conductivity type selectively provided in a surface of the second semiconductor layer; a second main electrode provided in contact with the semiconductor region; and a buried guard ring layer of the second conductivity type semiconductor selectively buried in the second semiconductor layer in an edge termination section outside the semiconductor region, the buried guard ring layer being depleted upon application of high voltage.

BRIEF DESCRIPTION OF THE DRAWINGS

FIG. 34A is a schematic view showing an example planar pattern of the main part in FIG. 33, and FIG. 34B is an enlarged view of the main part.

FIG. 36A is a schematic cross-sectional view of the surface portion of the device section and the edge termination section, and FIG. 36B is a schematic diagram showing the electric field distribution in the portion extending from the outermost base region to the edge termination section.

FIG. 51A is a schematic view showing another example planar pattern of the main part in FIG. 49, and FIG. 51B is an enlarged view of the main part as in FIG. 50B.

DETAILED DESCRIPTION OF THE INVENTION

Figure 1:
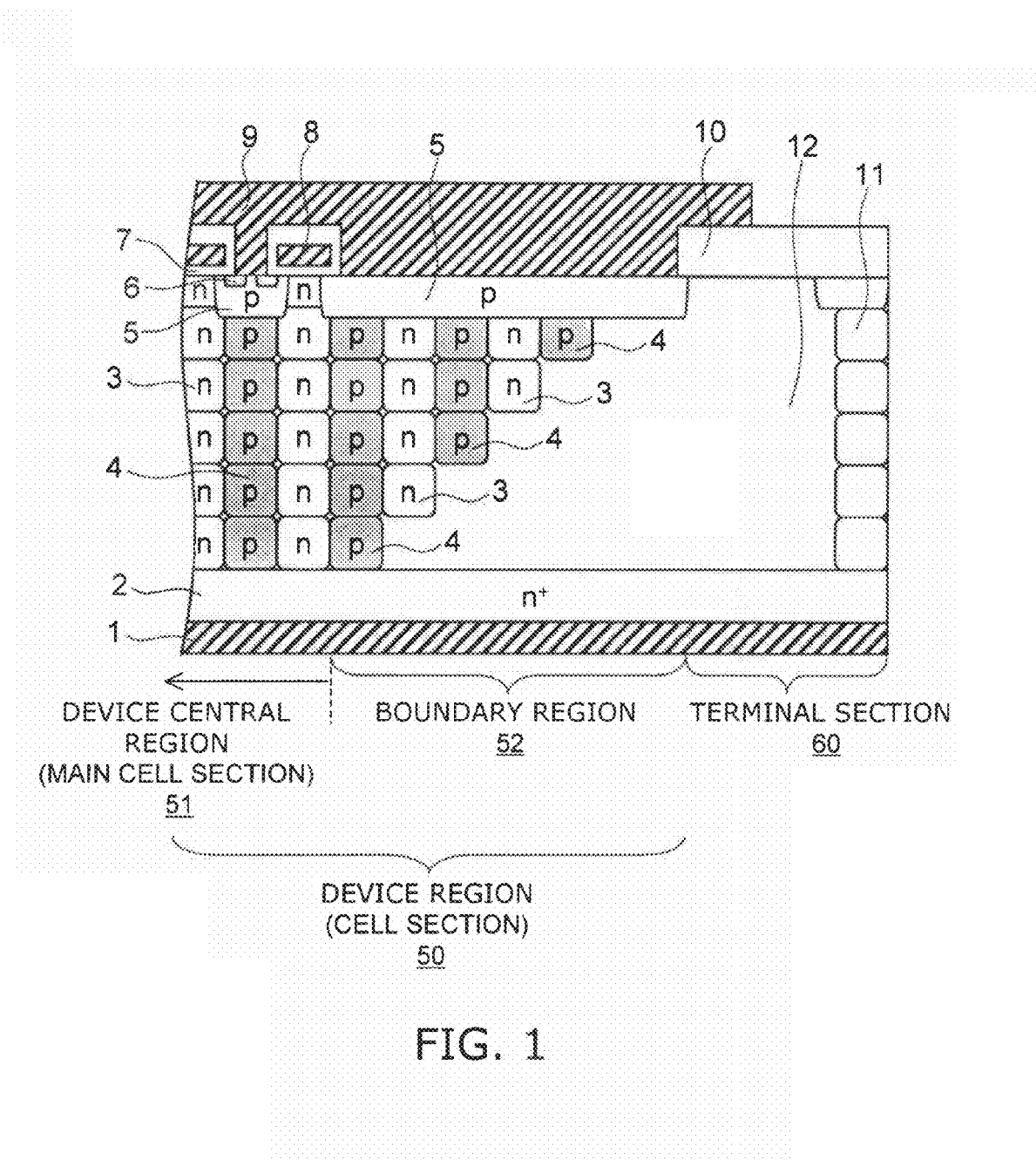
FIG. 1 is a schematic view illustrating the cross-sectional structure of the main part of a semiconductor device according to a first embodiment of the invention.

Embodiments of the invention will now be described with reference to the drawings. The following embodiments assume the first conductivity type as n-type and the second conductivity type as p-type. Like elements in the drawings are marked with like reference numerals.

First Embodiment

FIG. 1 is a schematic view illustrating the cross-sectional structure of the main part of a semiconductor device according to a first embodiment of the invention.

Figure 2:
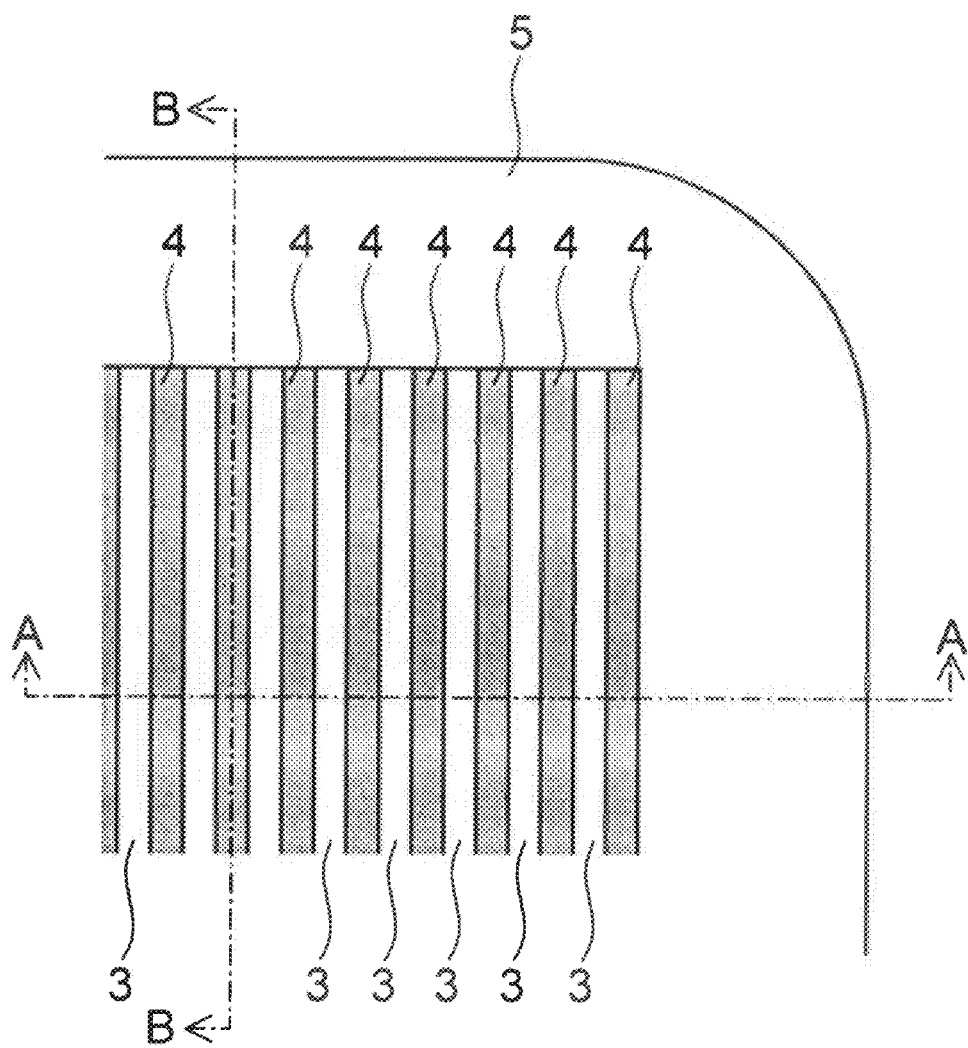
FIG. 2 is a schematic view showing an example planar pattern of pillar regions in the semiconductor device according to the embodiment of the invention.

FIG. 2 is a schematic view showing an example planar pattern of pillar regions in the semiconductor device according to this embodiment.

Here, FIG. 1 shows the A-A cross section in FIG. 2.

On a major surface of a semiconductor layer (drain layer) 2 of highly doped n$^+$-type silicon, first semiconductor pillar regions 3 of n-type silicon (hereinafter also simply referred to as "n-type pillar regions") and second semiconductor pillar regions 4 of p-type silicon (hereinafter also simply referred to as "p-type pillar regions") are periodically arranged in a direction substantially parallel to the major surface of the semiconductor layer 2. As shown in FIG. 2, the planar pattern of the n-type pillar regions 3 and the p-type pillar regions 4 has a striped configuration, for example.

The n-type pillar regions 3 and the p-type pillar regions 4 constitute a so-called "superjunction structure". That is, the n-type pillar region 3 and the p-type pillar region 4 are adjacent to each other to form a p-n junction.

The semiconductor device according to this embodiment is largely divided into a device region (cell section) 50 and an edge termination section 60. The edge termination section 60 is located outside the superjunction structure and a p-type base region 5 selectively provided thereon, and surrounds the device region 50. On the major surface of the semiconductor layer 2 in the edge termination section 60, no superjunction structure is provided, but a high-resistance semiconductor layer 12 is provided. The high-resistance semiconductor layer 12 is illustratively made of n-type silicon having a lower dopant concentration (higher resistance) than the n-type pillar region 3. The device region 50 is subdivided into a device central region (main cell section) 51 and a boundary region 52. The boundary region 52 is located nearer to the edge termination section 60 than a control electrode (gate electrode) 8. The superjunction structure in the boundary region 52 is adjacent to the high-resistance semiconductor layer 12.

On the p-type pillar region 4 in the device central region 51, a base region (first semiconductor region) 5 of p-type silicon is provided in contact with the p-type pillar region 4. Like the p-type pillar region 4, the base region 5 is also adjacent to the n-type pillar region 3 to form a p-n junction. A source region (second semiconductor region) 6 of n$^+$-type silicon is selectively provided in the surface of the base region 5. The planar pattern of the base regions 5 and the source regions 6, respectively, has a striped configuration, for example. The p-type base region 5 is formed also above the n-type pillar region 3 and the p-type pillar region 4 in the boundary region 52.

An insulating film 7 is provided on the portion extending from the n-type pillar region 3 through the base region 5 to the source region 6. The insulating film 7 is illustratively made of silicon oxide film and has a thickness of about 0.1 μm. A control electrode (gate electrode) 8 is provided on the insulating film 7.

A source electrode (second main electrode) 9 is provided on part of the source region 6 and the portion of the base region 5 between the source regions 6. A drain electrode (first main electrode) 1 is provided on the side opposite to the major surface of the semiconductor layer 2.

When a prescribed voltage is applied to the control electrode 8, a channel is formed in the vicinity of the surface of the base region 5 located directly below the control electrode 8 and allows conduction between the source region 6 and the n-type pillar region 3. As a result, a main current path is formed between the source electrode 9 and the drain electrode 1 through the source region 6, the n-type pillar region 3, and the semiconductor layer 2. Thus the path between the main electrodes is turned into the ON state.

As described above, a high-resistance semiconductor layer 12 is provided on the semiconductor layer (n$^+$-drain layer) 2 in the edge termination section 60, and a field insulating film 10 is provided on the surface of the high-resistance semiconductor layer 12. The source electrode 9 is provided on the field insulating film 10 in contact therewith. Hence, by the field plate effect, the decrease of breakdown voltage in the edge termination section 60 can be prevented. Furthermore, the edge termination section 60 has no superjunction structure, but has a high-resistance (lowly doped) layer 12, which facilitates extension of the depletion layer to achieve a higher edge termination breakdown voltage than the device region (cell section) 50.

Furthermore, the outermost portion of the edge termination section has a field stop layer 11 so that the depletion layer does not reach the dicing line upon application of high voltage. In FIG. 1, the field plate electrode is formed integrally with the source electrode 9. However, it is also possible to use a structure where the field plate electrode is connected to the gate electrode 8. Alternatively, the field stop electrode may be formed at the top of the field stop layer 11. The high-resistance semiconductor layer 12 is preferably of n-type for preventing the increase of electric field on the field stop layer 11 side during application of high voltage. The dopant concentration in the high-resistance semiconductor layer 12 is preferably about $\frac{1}{100}$ to $\frac{1}{10}$ of that in the n-type pillar region 3 for achieving high edge termination breakdown voltage.

In the superjunction structure, one pillar region is sandwiched on both sides between pillar regions having the opposite conductivity type, and depletion layers extend from both sides. Thus a high breakdown voltage is held. If the edge termination section has no superjunction structure, the outermost pillar region in contact with the high-resistance semiconductor layer neighbors a pillar region only on one side, and hence the depletion layer extends only from one side. Therefore the amount of dopant in the outermost pillar region needs to be half that in the inner pillar region (pillar region nearer to the device central region). However, halving the amount of dopant only in the outermost portion is less controllable, and variation in the amount of dopant induces the decrease of breakdown voltage only in the outermost portion.

In this context, this embodiment proposes a structure having less breakdown voltage variation without a superjunction structure in the edge termination section. More specifically, in this embodiment, in the boundary region 52 between the device central region 51 and the edge termination section 60, the depth of the n-type pillar region 3 and the p-type pillar region 4 adjacent to the high-resistance semiconductor layer 12 (the depth in the direction from the source electrode 9 toward the drain electrode 1) decreases stepwise as they approach the edge termination section 60.

In the example shown in FIG. 1, with regard to a pair of adjacent pillar regions in the boundary region 52, the right pillar region, that is, the pillar region on the edge termination section side, is shallower than the left adjacent pillar region by e.g. about the width of one pillar region. The portion of a pillar region having no right adjacent pillar region is in contact with the high-resistance semiconductor layer 12. In the boundary region 52, the edge of the n-type pillar region 3 and the p-type pillar region 4 on the drain electrode 1 side is varied in a staircase pattern.

Thus the depth of the pillar region is varied stepwise. In this case, the portion with no pillar region neighboring on one side, that is, the portion with imbalanced presence of pillar region, extends not entirely, but partially, along the depth of one pillar region. That is, the portion with imbalanced presence of pillar region is dispersed, and hence the decrease of breakdown voltage is reduced.

In FIG. 1, a p-type pillar region 4 is located in the outermost portion, that is, the portion nearest to the edge termination section. However, it may be an n-type pillar region 3. Furthermore, in FIG. 1, the depth of the n-type pillar region 3 and the p-type pillar region 4 in the boundary region 52 is varied in five steps. However, the depth variation is not limited thereto, but the depth can be varied in any number of steps other than five steps. Moreover, the depth can be varied nonuniformly as long as the depth of the n-type pillar region 3 and the p-type pillar region 4 is varied stepwise.

Figure 3A:
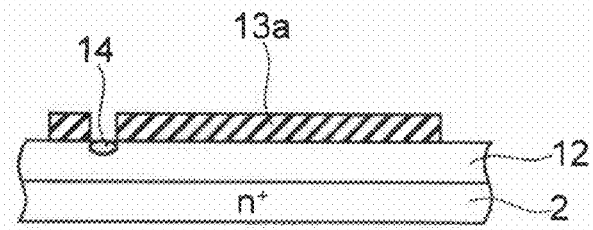
FIGS. 3 and 4 are process cross-sectional views illustrating the main part of a process for manufacturing a semiconductor device according to the embodiment of the invention.
Figure 3B:
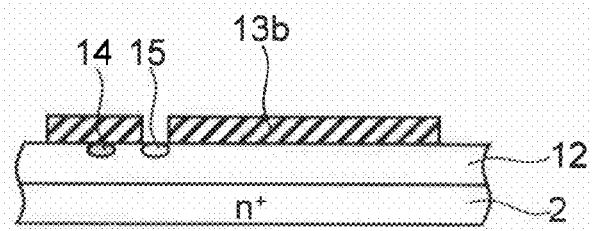
Figure 3C:
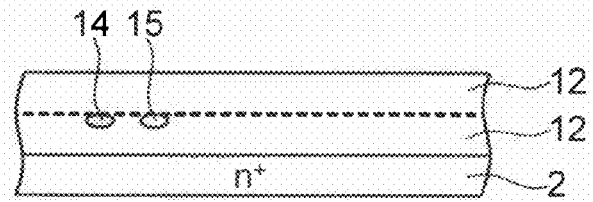
Figure 3D:
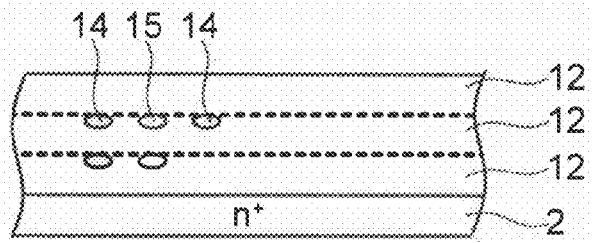
Figure 4A:
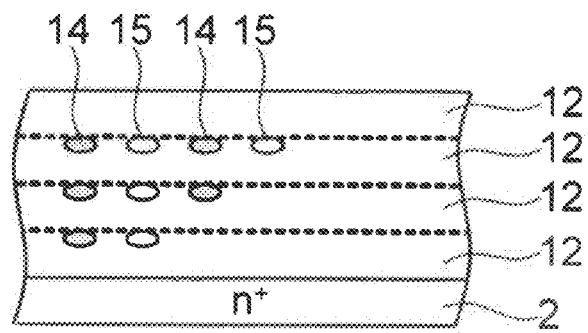
Figure 4B:
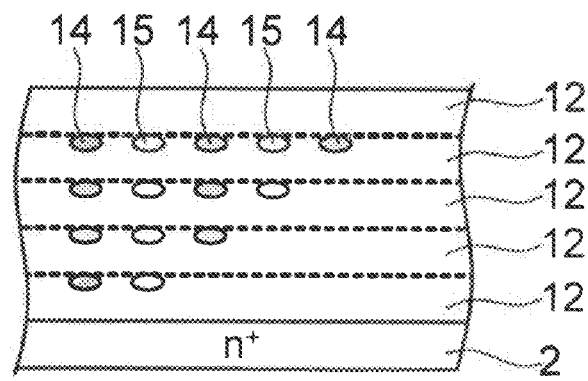

The superjunction structure in the boundary region shown in FIG. 1 can be realized by the process flow as shown in FIGS. 3 and 4.

Figure 4C:
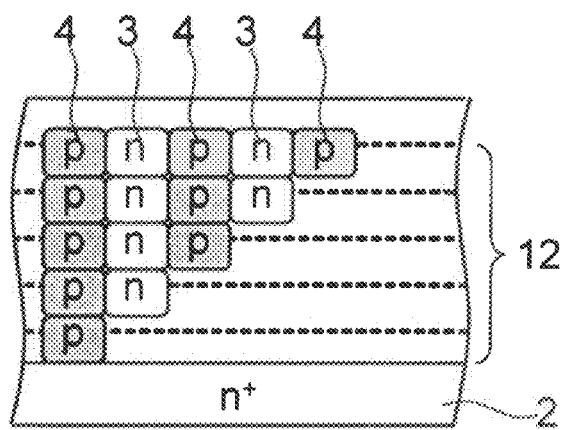

First, as shown in FIG. 3A, a high-resistance semiconductor layer 12 formed on a major surface of an $n^+$-type semiconductor layer 2 is subjected to ion implantation of boron 14, for example, which is a dopant for forming a p-type pillar region, by using a resist or other mask 13a. Next, as shown in FIG. 3B, a mask 13b is used to perform ion implantation of phosphorus 15, for example, which is a dopant for forming an n-type pillar region. Subsequently, as shown in FIGS. 3C to 4B, the ion implanted layer is buried under a high-resistance semiconductor layer 12, which is again subjected to ion implantation, and this process is repeated. Here, the outermost mask opening nearer to the edge termination section is shifted for each layer to control the site of ion implantation. As shown in FIG. 4C, the subsequent step of diffusing implanted ions results in a superjunction structure where the depth of the n-type pillar region 3 and the p-type pillar region 4 is varied stepwise.

Thus only the mask opening location for forming the outermost pillar region needs to be shifted for each layer, and the mask opening width does not need to be varied. Hence there is no need to halve the mask opening width for halving the amount of dopant in response to the one-sided depletion. Only a simple control is needed as to whether a pillar region is formed or not (ion implantation is performed or not) at a location. Thus variation in the amount of dopant is reduced, and the decrease of breakdown voltage can be prevented. That is, it is possible to provide a semiconductor device having a superjunction structure where the decrease of breakdown voltage due to process variation is reduced. Because of the small decrease of breakdown voltage due to process variation, the dopant concentration in the superjunction structure can be further increased, and the ON resistance can be reduced as well.

The process for forming a superjunction structure having stepwise varied depth is not limited to the multiple repetition of buried growth. As shown in FIG. 5, it is also possible to use a mask having stepwise varied thickness for stepwise controlling the implantation depth by accelerated ion implantation.

Figure 5A:
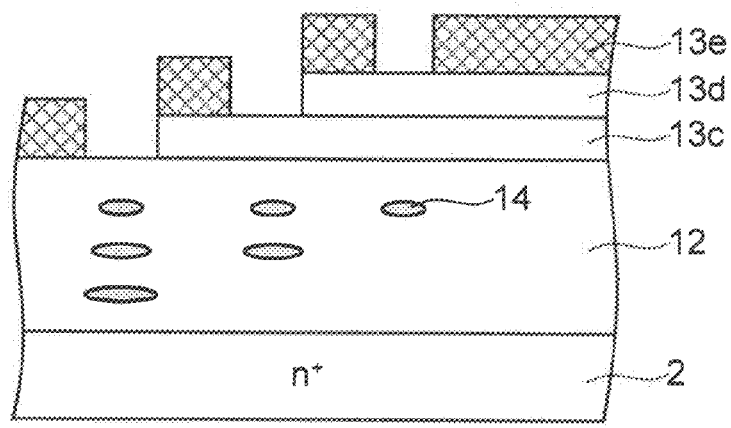
FIG. 5 is a process cross-sectional view illustrating the main part of a process for manufacturing a semiconductor device according to another example of the embodiment of the invention.
Figure 5B:
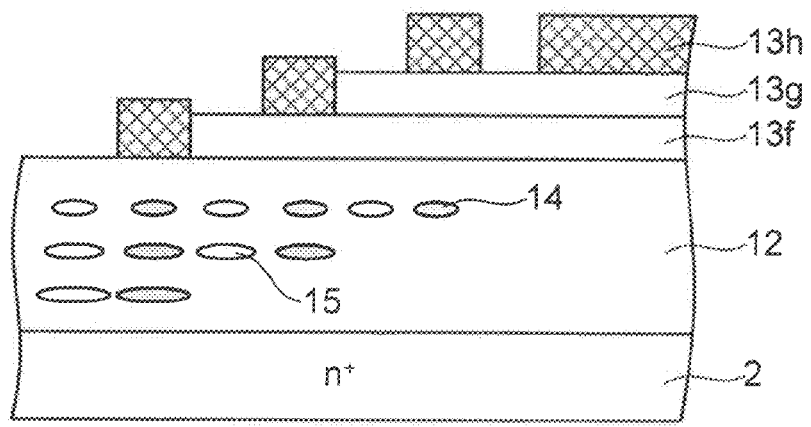

More specifically in FIG. 5A, a plurality of resist films or metal films 13c to 13e are combined into a mask having stepwise varied thickness, which is used to implant e.g. boron for controlling the implantation depth stepwise by accelerated ion implantation. In FIG. 5B, a plurality of resist films or metal films 13f to 13h are combined into a mask having stepwise varied thickness, which is used to implant e.g. phosphorus 15 for controlling the implantation depth stepwise by accelerated ion implantation.

Figure 6A:
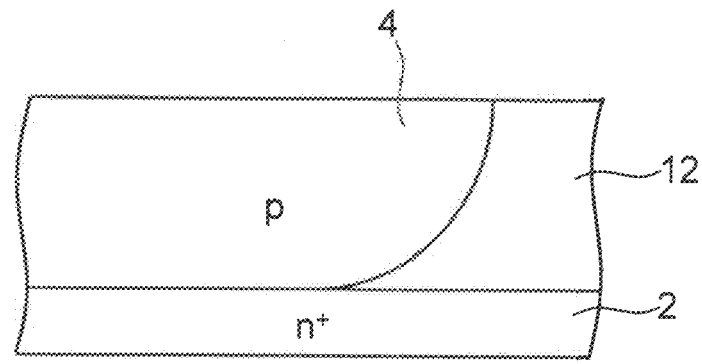
FIG. 6 is a process cross-sectional view illustrating the main part of a process for manufacturing a semiconductor device according to still another example of the embodiment of the invention.
Figure 6B:
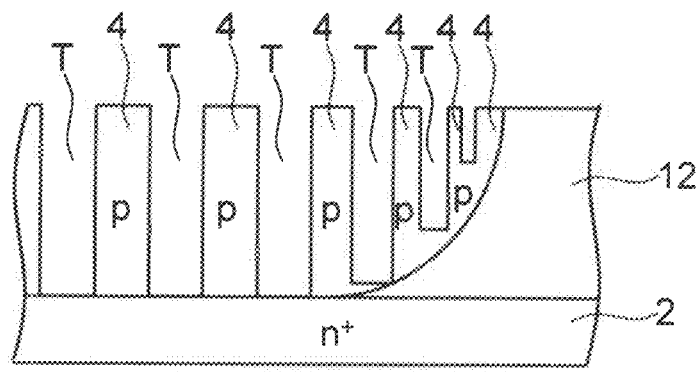
Figure 6C:
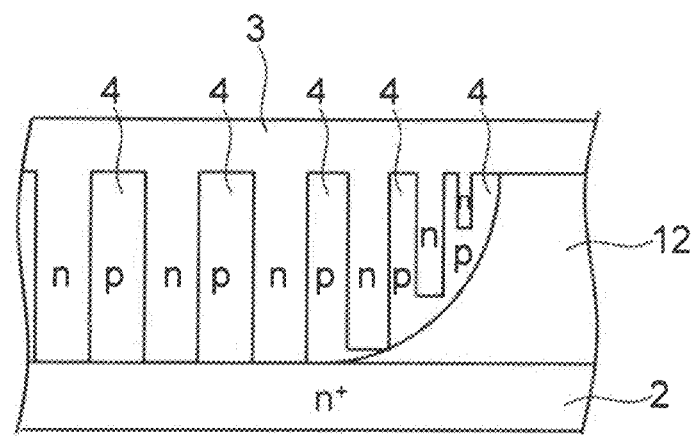

In another possible process, as shown in FIG. 6A, a p-type pillar region 4 is formed in a high-resistance semiconductor layer 12 by ion implantation and subsequent diffusion. Then, as shown in FIG. 6B, trenches T are formed in the p-type pillar region 4 by RIE (Reactive Ion Etching), for example. Then, as shown in FIG. 6C, the trench T is filled in with n-type semiconductor to form an n-type pillar region 3.

By narrowing the opening width of the trenches T toward the edge termination section (right side in FIG. 6), the etching depth of RIE decreases toward the edge termination section. Hence the depth of the n-type pillar region 3 can be varied stepwise. Furthermore, by utilizing lateral diffusion of dopants, the depth of the p-type pillar region 4 can be also varied stepwise.

If the edge of the outermost pillar region (which is a p-type pillar region 4 in FIG. 1) nearest to the edge termination section is close to the edge of the outermost p-base region 5, electric field concentration at the pillar region edge is likely to be combined with electric field concentration at the p-base edge to cause the decrease of breakdown voltage. Hence the edge of the outermost pillar region needs to be located more inside than the p-base edge. In order to avoid influence of electric field concentration at the p-base edge, the distance from the p-base edge to the outermost pillar region edge spaced inside is preferably longer than the width of one pillar region (the extending distance of the depletion layer).

However, if the outermost pillar region is a p-type pillar region 4 having the same conductivity type as the p-base region 5 and this p-type pillar region 4 is brought close to the edge of the p-base region 5, then there may be an effect of increasing the curvature radius at the p-base corner. In this case, alleviation of electric field concentration at the p-base corner can be expected.

Figure 7:
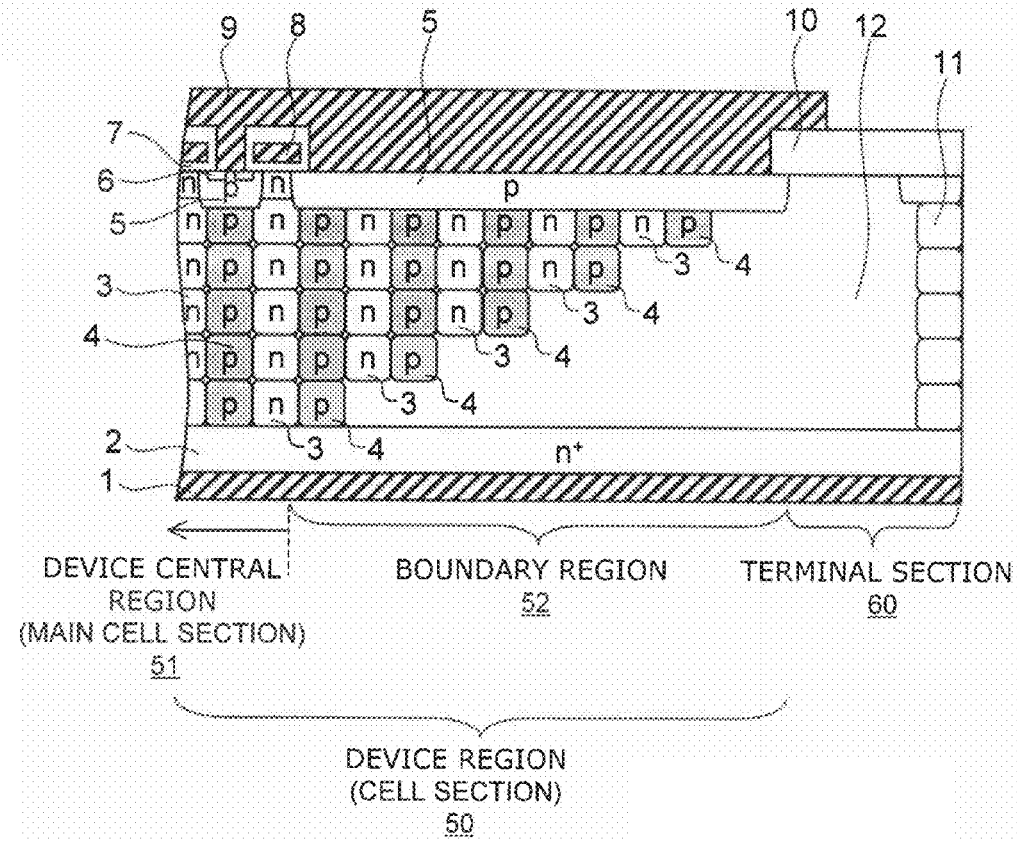
FIG. 7 is a schematic cross-sectional view showing a variation of the semiconductor device according to the first embodiment.

In the example shown in FIG. 1, the depth of the n-type pillar regions 3 and the p-type pillar regions 4 is varied alternately for each pillar region. However, as shown in FIG. 7, the depth may be varied for each set of a plurality of pillar regions. In FIG. 7, the depth is varied for each set of two pillar regions. However, the depth can be varied for each set of three or more pillar regions.

Figure 8:
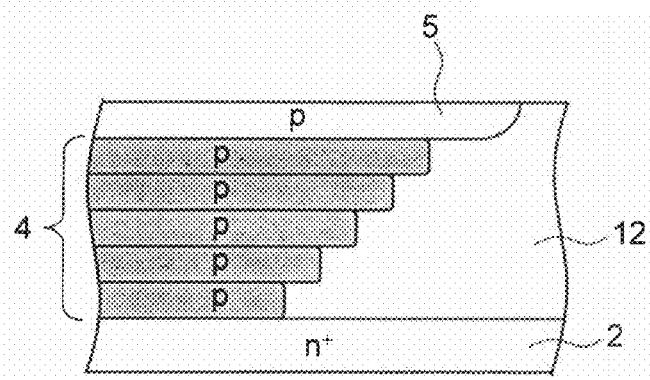
FIG. 8 is a cross-sectional view taken along the line B-B in FIG. 2.

When the superjunction structure is formed in a striped planar pattern as shown in FIG. 2, the depth of the pillar region may be varied stepwise also at the edge in the stripe extending direction as shown in FIG. 8, which shows the B-B cross section in FIG. 2. In the example shown in FIG. 8, a p-type pillar region 4 is formed in a staircase pattern so as to be shallowed stepwise toward the edge termination section (right side in FIG. 8). Similarly, the depth of the n-type pillar region 3 is also varied stepwise at the edge in the stripe extending direction in conformity with the p-type pillar region 4.

When the process shown in FIGS. 3 and 4 is used, the position of the edge of the superjunction structure in the stripe extending direction may involve deviation due to misalignment in the lithography process for forming each buried layer. The deviation tends to cause local imbalance of p/n-pillar regions at the above-mentioned edge. However, when the pillar region is formed under intentional control in a staircase pattern as shown in FIG. 8, the imbalance of p/n-pillar regions due to misalignment in lithography is less likely to occur. The shifted distance of the edge position of the pillar region for each buried layer is preferably set to a length for which the misalignment in the lithography process is negligible (e.g. 1 μm or more).

In the following, other embodiments of the invention are described. Elements similar to those described earlier are marked with like reference numerals and not described in detail.

Second Embodiment

Figure 9A:
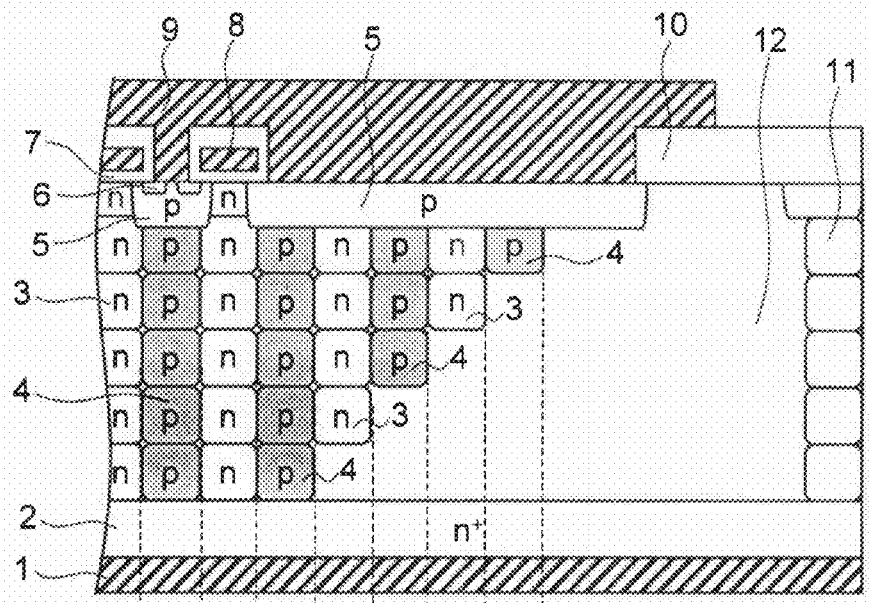
FIG. 9A is a schematic view illustrating the cross-sectional structure of the main part of a semiconductor device according to a second embodiment of the invention.
Figure 9B:
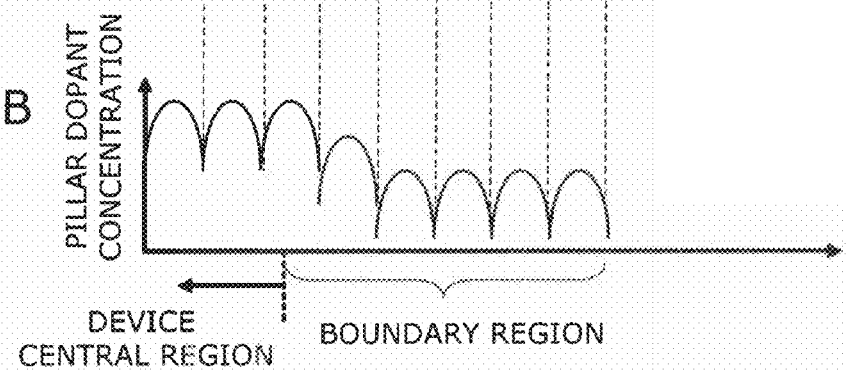
FIG. 9B is a schematic diagram showing horizontal variation (variation along the direction from the device central region toward the edge termination section) in dopant concentration in the pillar regions shown in FIG. 9A.

FIG. 9A is a schematic view illustrating the cross-sectional structure of the main part of a semiconductor device according to a second embodiment of the invention, and FIG. 9B is a schematic diagram showing horizontal variation (variation along the direction from the device central region toward the edge termination section) in dopant concentration in the pillar regions shown in FIG. 9A. The vertical axis in FIG. 9B represents the dopant concentration in the pillar region.

In the embodiment shown in FIG. 9, the dopant concentration in the n-type pillar region 3 and the p-type pillar region 4 in the boundary region having stepwise varied depth is lower than the dopant concentration in the n-type pillar region 3 and the p-type pillar region 4 in the device central region (main cell section). By the stepwise varied depth of the n-type pillar region 3 and the p-type pillar region 4, the portion with no pillar region neighboring on one side is localized. Hence the breakdown voltage tends to decrease relative to the case where the superjunction structure is entirely formed. By decreasing the dopant concentration in the pillar region of the boundary region, the breakdown voltage can be made higher than the device central region (main cell section) despite any local presence imbalance of p/n-pillar regions.

Figure 10A:
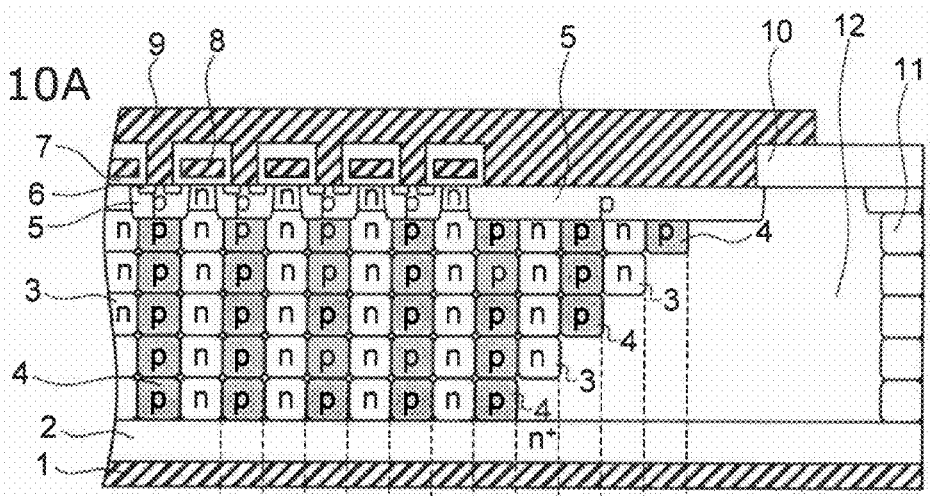
FIG. 10A is a schematic view illustrating the cross-sectional structure of the main part of a variation of the semiconductor device according to the second embodiment of the invention.
Figure 10B:
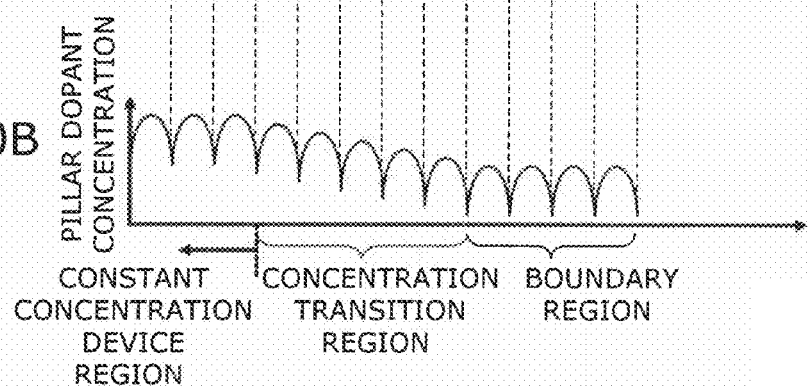
FIG. 10B is a schematic diagram showing horizontal variation in dopant concentration in the pillar regions shown in FIG. 10A.

In the structure shown in FIG. 9, the dopant concentration is drastically varied from the device central region (main cell section) to the boundary region. However, as shown in FIG. 10, the dopant concentration may be gradually stepwise decreased from the device central region (main cell section) having substantially constant dopant concentration to the boundary region.

Stepwise variation of dopant concentration can be realized by stepwise varying the opening width of the ion implantation mask. Preferably, the dopant concentration in the p-type pillar region 4 decreases with the same slope as the dopant concentration in the n-type pillar region 3, and the dopant concentration in an n-type pillar region 3 is the average of the dopant concentrations in the two p-type pillar regions 4 adjacent thereto. This can be realized by successively narrowing the opening width of the n-type pillar region formation mask with the same proportion as the opening width of the p-type pillar region formation mask. For example, if the opening width of the p-type pillar region formation mask is varied as 2 μm, 1.8 μm, 1.6 μm, and 1.4 μm, then the width of the opening of the n-type pillar region formation mask located therebetween can be varied as 1.9 μm, 1.7 μm, and 1.5 μm. By providing the concentration transition region as shown in FIG. 10 where the dopant concentration is gradually varied, rather than drastically varying the dopant concentration as shown in FIG. 9, the influence of variation of the mask opening width is reduced, and high breakdown voltage is easily achieved.

Figure 11:
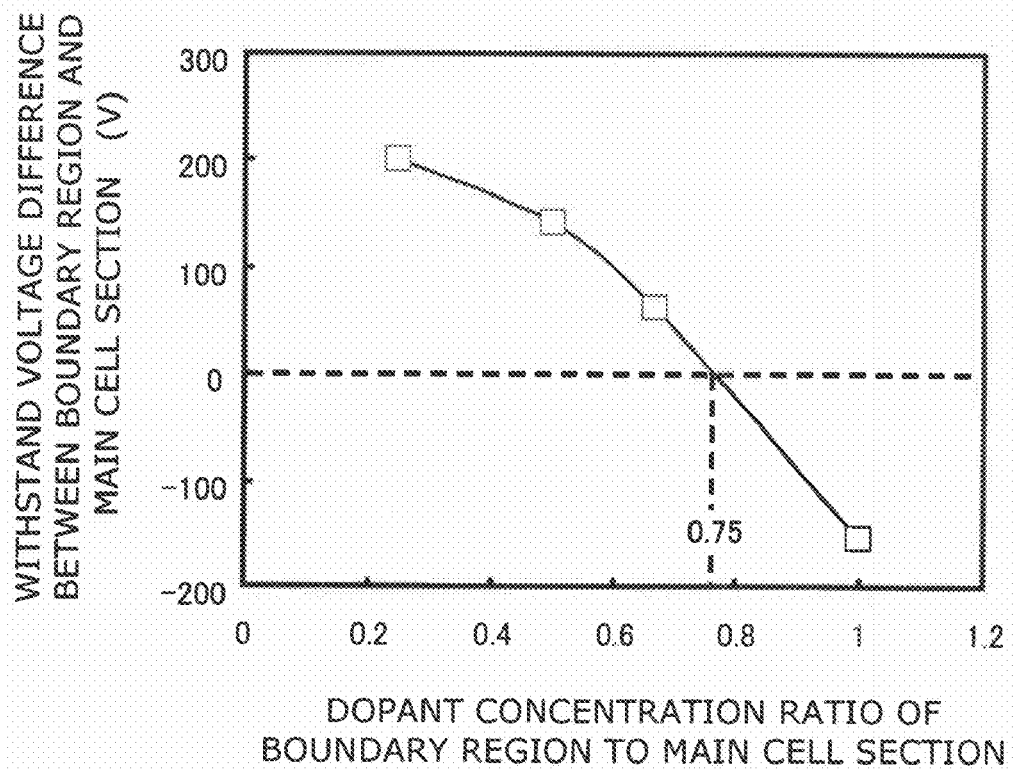
FIG. 11 is a graph showing variation in breakdown voltage difference between the boundary region and the main cell section that occurs when the dopant concentration ratio between the pillar region of the main cell section (device central region) and the pillar region of the boundary region is varied.

FIG. 11 is a graph showing variation in breakdown voltage difference between the boundary region and the main cell section that occurs when the dopant concentration ratio between the pillar region of the main cell section (device central region) and the pillar region of the boundary region is varied. The horizontal axis represents the ratio of the dopant concentration in the pillar region of the main cell section versus the dopant concentration in the pillar region of the boundary region. The vertical axis represents (breakdown voltage of the boundary region)−(breakdown voltage of the main cell section).

According to the result shown in FIG. 11, the breakdown voltage of the boundary region can be made higher than that of the main cell section by setting the dopant concentration in the pillar region of the boundary region to 0.75 times or less the dopant concentration in the pillar region of the main cell section. Power semiconductor devices tend to operate stably when the edge termination section and its nearby portion have high breakdown voltage. Hence it is preferable that the dopant concentration in the pillar region of the boundary region be 0.75 times or less the dopant concentration in the pillar region of the main cell section. By controlling the opening width of the ion implantation mask, it is possible to control the dopant concentration difference between the pillar region of the boundary region and the pillar region of the main cell section.

Third Embodiment

Figure 12:
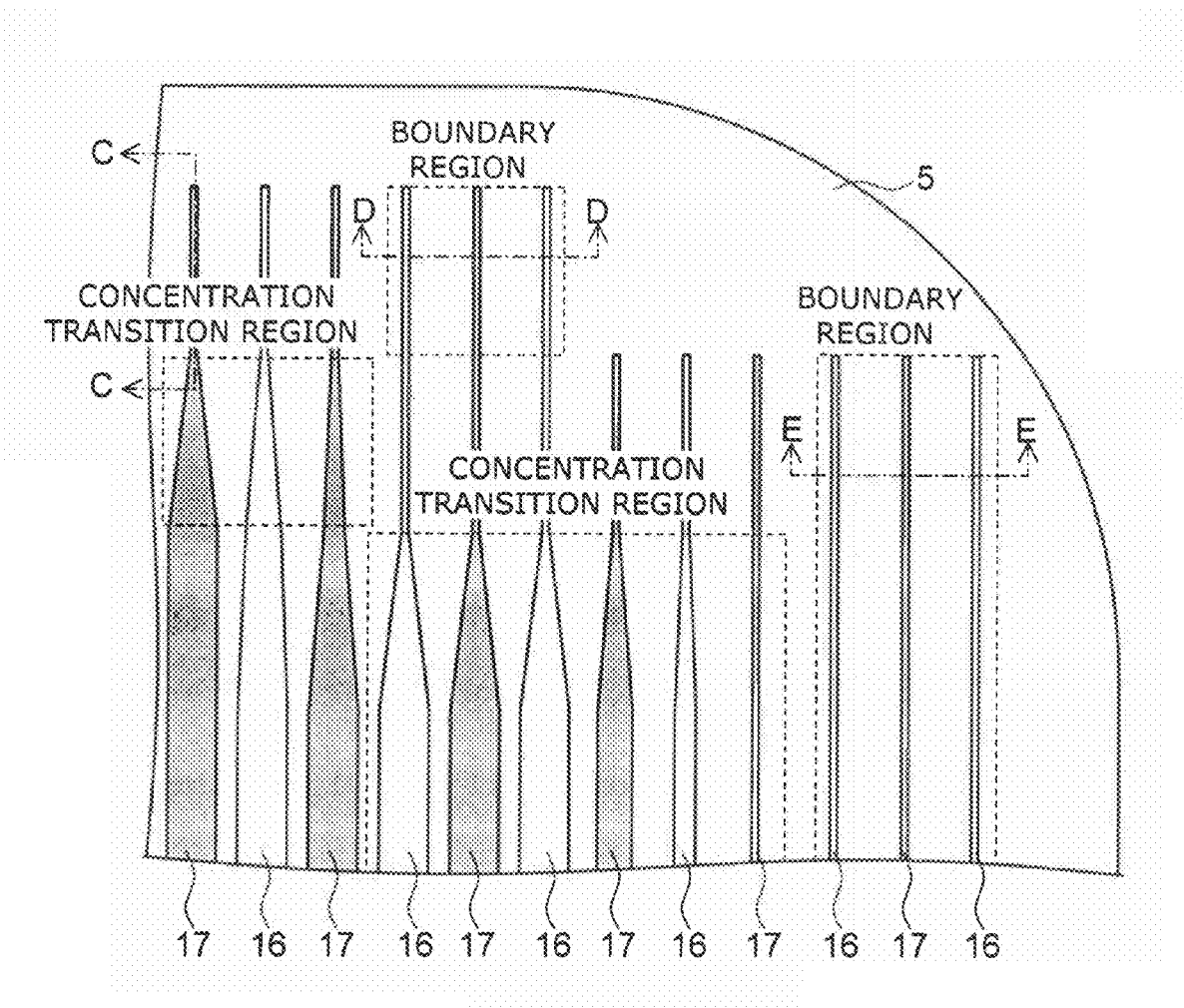
FIG. 12 is a schematic view illustrating the opening pattern of a pillar region formation mask for the semiconductor device according to a third embodiment of the invention.

FIG. 12 is a schematic view illustrating the opening pattern of a pillar region formation mask for the semiconductor device according to a third embodiment of the invention.

Figure 13:
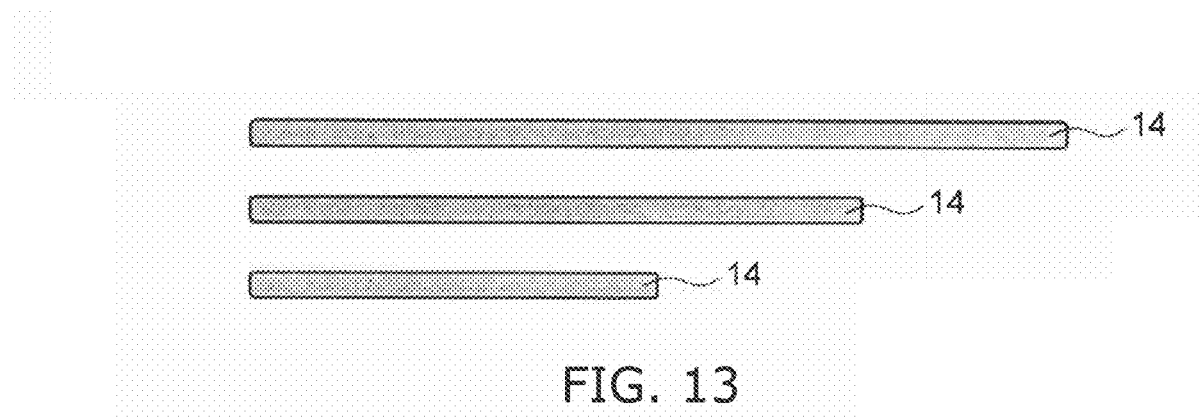
FIG. 13 is a schematic view illustrating dopants implanted into the C-C cross-sectional portion in FIG. 12.

FIG. 13 is a schematic view illustrating dopants implanted into the C-C cross-sectional portion in FIG. 12.

Figure 14:
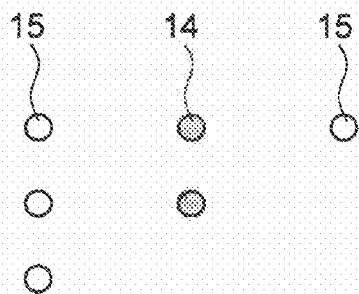
FIG. 14 is a schematic view illustrating dopants implanted into the D-D cross-sectional portion in FIG. 12.

FIG. 14 is a schematic view illustrating dopants implanted into the D-D cross-sectional portion in FIG. 12.

Figure 15:
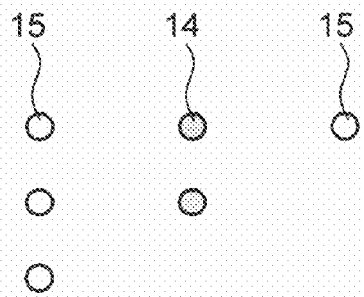
FIG. 15 is a schematic view illustrating dopants implanted into the E-E cross-sectional portion in FIG. 12.

FIG. 15 is a schematic view illustrating dopants implanted into the E-E cross-sectional portion in FIG. 12.

The opening pattern of the pillar region formation mask shown in FIG. 12 is an example pattern for forming a superjunction structure in a striped configuration. A dopant for forming the p-type pillar region, e.g. boron 14, is implanted through the opening 17 of the p-type pillar region formation mask. A dopant for forming the n-type pillar region, e.g. phosphorus 15, is implanted through the opening 16 of the n-type pillar region formation mask.

By gradually narrowing the mask opening width toward the edge of the p/n-pillar region in the stripe extending direction, the pillar region dopant concentration is decreased. This reduces the decrease of breakdown voltage even if misalignment occurs between the buried layers at the edge in the stripe extending direction.

Also in the direction orthogonal to the stripe extending direction, the mask opening width is gradually narrowed to gradually decrease the pillar concentration, thereby decreasing the pillar region dopant concentration in the boundary region relative to the pillar region dopant concentration in the device central region (main cell section). This reduces the decrease of breakdown voltage due to the imbalance of pillar regions in the boundary region.

Furthermore, for forming the superjunction structure along the corner of the p-base region 5, the boundary region is provided in a staircase pattern near inside the corner. The outer periphery of the p-base region 5 is susceptible to electric field concentration upon application of high voltage. The curvature radius at the corner of the p-base region 5 needs to be increased for preventing this electric field concentration, and is preferably set to about 2 to 3 times the drift layer thickness (the thickness of the superjunction structure). However, in this case, the area of the curved region increases. Without the superjunction structure at the corner, the device active area decreases, and the chip ON resistance increases.

Hence the superjunction structure needs to be arranged along the corner of the p-base region 5. To this end, in this embodiment, as shown in FIG. 12, the opening of the mask for forming the concentration transition region having gradually decreased dopant concentration is arranged in a staircase pattern, and on its outside (in the portion nearer to the edge termination section), the opening of the mask for forming the boundary region having stepwise decreased pillar depth is arranged in a staircase pattern. This staircase arrangement of the mask pattern enables a superjunction structure to be formed along the p-base corner, thereby reducing the loss of the device active area and decreasing the chip ON resistance.

Fourth Embodiment

Figures 16A, 16B:
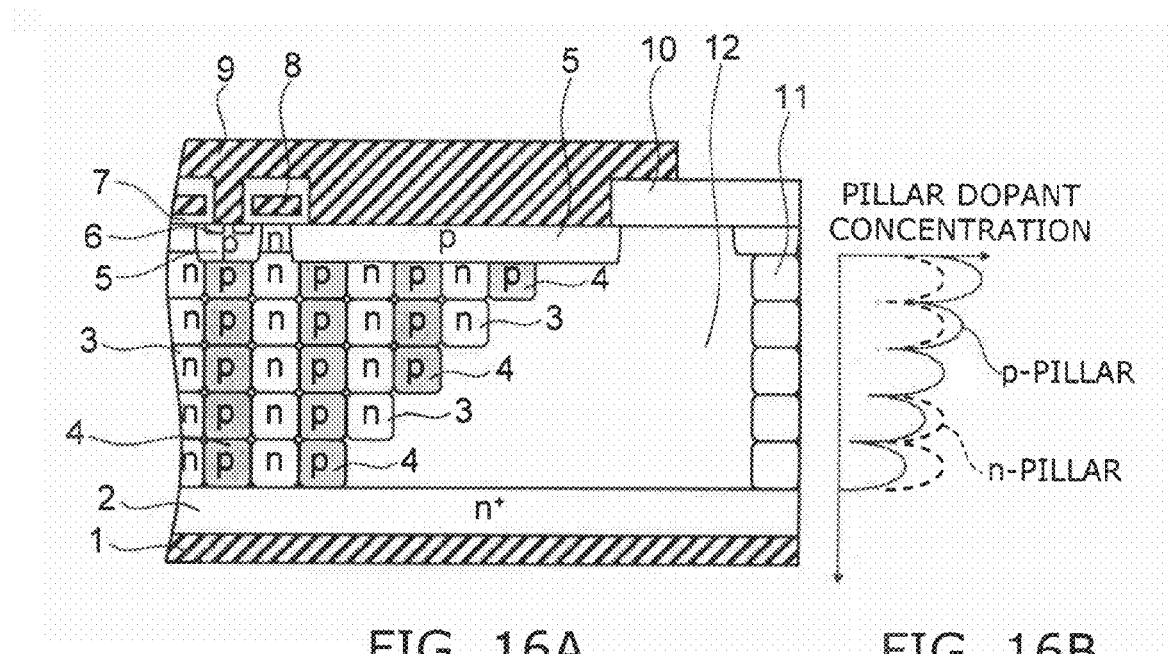
FIG. 16A is a schematic view illustrating the cross-sectional structure of the main part of a semiconductor device according to a fourth embodiment of the invention.
FIG. 16B is a schematic diagram showing vertical variation (variation along the depth) in dopant concentration in the pillar regions shown in FIG. 16A.

FIG. 16A is a schematic view illustrating the cross-sectional structure of the main part of a semiconductor device according to a fourth embodiment of the invention, and FIG. 16B is a schematic diagram showing vertical variation (variation along the depth) in dopant concentration in the pillar regions shown in FIG. 16A. In FIG. 16B, the solid line represents the dopant concentration profile of the p-type pillar region 4, and the dashed line represents the dopant concentration profile of the n-type pillar region 3.

In this embodiment, the dopant concentration in the p-type pillar region 4 decreases stepwise in the direction from the source electrode 9 side toward the drain electrode 1 side. That is, the dopant concentration in the p-type pillar region 4 is higher than in the n-type pillar region 3 on the source electrode 9 side, and lower than in the n-type pillar region 3 on the drain electrode 1 side. By such a dopant concentration profile, a stable breakdown voltage and a high avalanche withstanding capability can be achieved.

More specifically, if the dopant concentration profile is sloped along the depth as in this embodiment, the decrease of breakdown voltage occurring when the amount of dopant in the n-type pillar region 3 is equal to that in the p-type pillar region 4 can be made smaller than that for no slope. Thus the decrease of breakdown voltage due to process variation is reduced, and a stable breakdown voltage is obtained.

Furthermore, the avalanche withstanding capability is increased because the electric field decreases at the upper and lower end of the superjunction structure. When an avalanche breakdown occurs, a large amount of carriers are generated in the drift layer, and the electric field at the upper and lower end of the drift layer increases. If the electric field at the upper and lower end of the drift layer exceeds a certain limit, electric field concentration continues to proceed and produces negative resistance, thereby destroying the device. This dictates the avalanche withstanding capability. When the dopant concentration profile along the depth is sloped to decrease the electric field at the upper and lower end beforehand, the negative resistance is prevented, and a high avalanche withstanding capability can be achieved.

The slope of the dopant concentration profile as in this embodiment can be realized by varying the ion implantation dose in each burying process. The electric field at the upper and lower end in the superjunction structure can be decreased by a configuration where the amount of dopant is larger in the p-type pillar region 4 than in the n-type pillar region 3 on the source electrode 9 side and smaller on the drain electrode 1 side. In FIG. 16, the amount of dopant in the p-type pillar region 4 is varied. However, it is also possible to increase the amount of dopant in the n-type pillar region 3 toward the drain electrode 1 with the amount of dopant in the p-type pillar region 4 kept constant. Alternatively, it is also possible to vary the amount of dopant in both the p-type pillar region 4 and the n-type pillar region 3.

Fifth Embodiment

Figure 17:
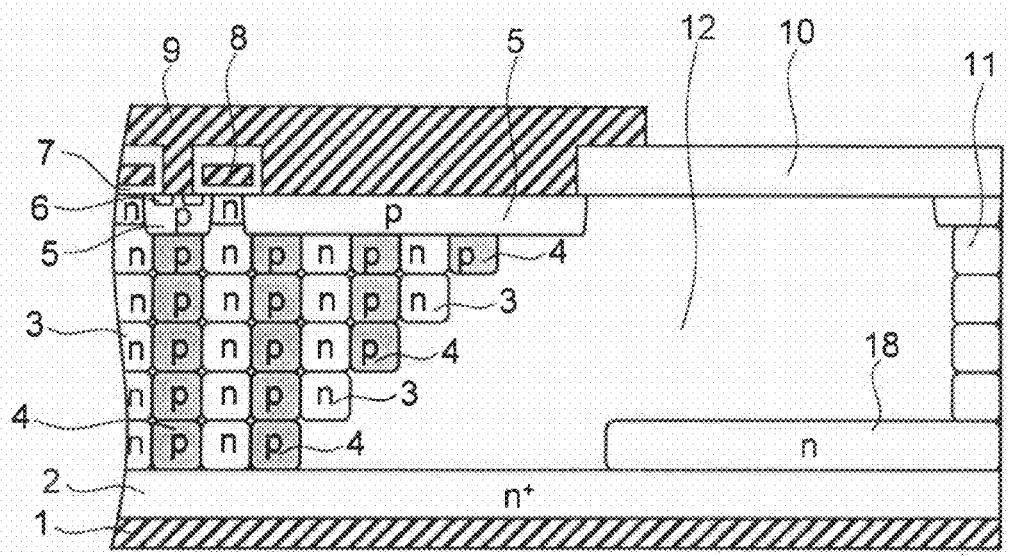
FIG. 17 is a schematic view illustrating the cross-sectional structure of the main part of a semiconductor device according to a fifth embodiment of the invention.

FIG. 17 is a schematic view illustrating the cross-sectional structure of the main part of a semiconductor device according to a fifth embodiment of the invention.

In this embodiment, a buffer layer 18 illustratively made of n-type silicon is provided on the $n^+$-drain layer 2 in the edge termination section. If the portion of the edge termination section above the $n^+$-drain layer 2 is entirely occupied by the high-resistance semiconductor layer 12, the breakdown voltage of the edge termination section is higher than the superjunction structure section. However, when an avalanche breakdown occurs in the edge termination section by application of voltage higher than the edge termination section breakdown voltage, the electric field at the upper and lower end of the edge termination section tends to increase and to suffer from negative resistance. Thus the edge termination section alone has a low avalanche withstanding capability. However, the electric field on the lower side can be decreased by providing the n-type buffer layer 18 on the drain electrode 1 side as shown in FIG. 17 to increase the avalanche withstanding capability.

Figure 18:
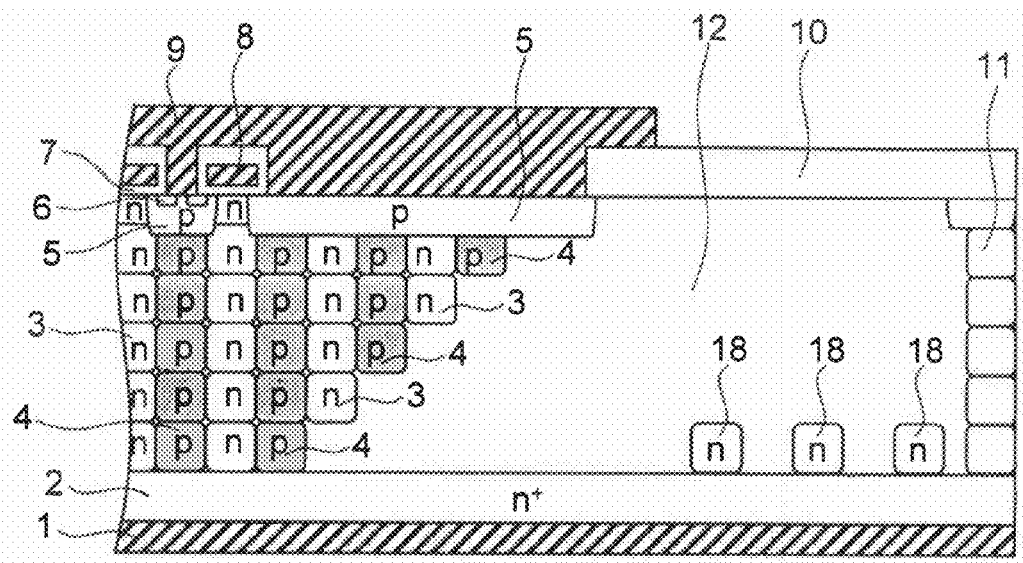
FIG. 18 is a schematic view illustrating the cross-sectional structure of the main part of a variation of the semiconductor device according to the fifth embodiment of the invention.
Figure 19:
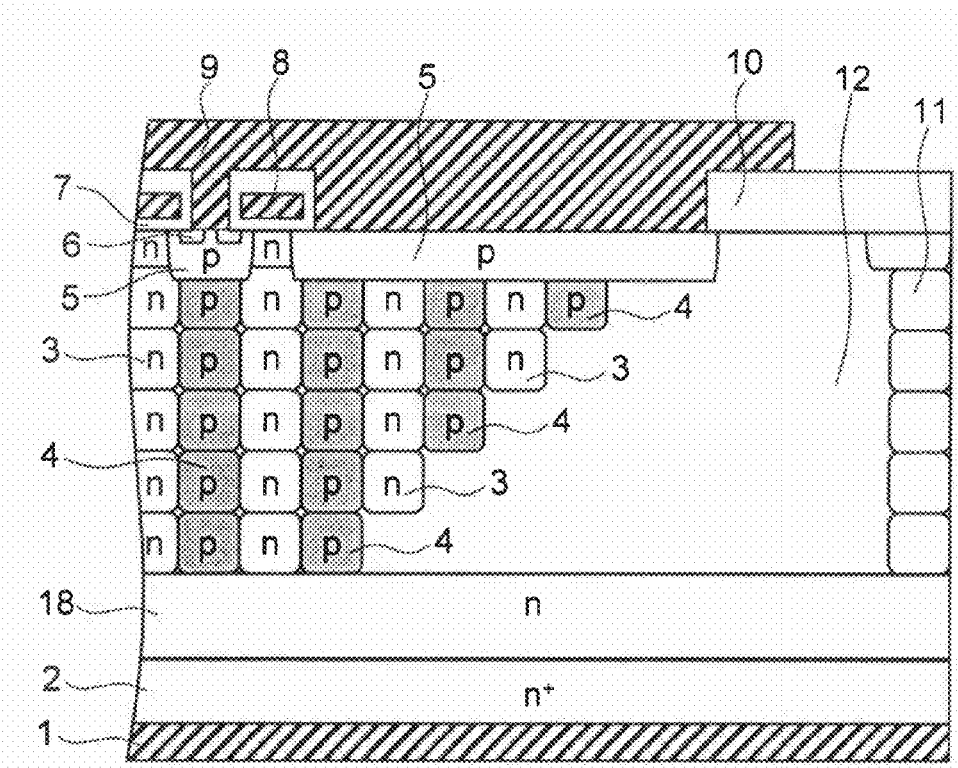
FIG. 19 is a schematic view illustrating the cross-sectional structure of the main part of another variation of the semiconductor device according to the fifth embodiment of the invention.

As shown in FIG. 18, the n-type buffer layer 18 may be periodically provided like the n-type pillar region 3. Furthermore, as shown in FIG. 19, the n-type buffer layer 18 may be provided on the $n^+$-drain layer 2 in both the superjunction structure section and the edge termination section. In FIG. 19, the n-type buffer layer 18 is interposed between the superjunction structure section and the $n^+$-drain layer 2, as well as between the high-resistance semiconductor layer 12 and the $n^+$-drain layer 2.

Sixth Embodiment

Figure 20:
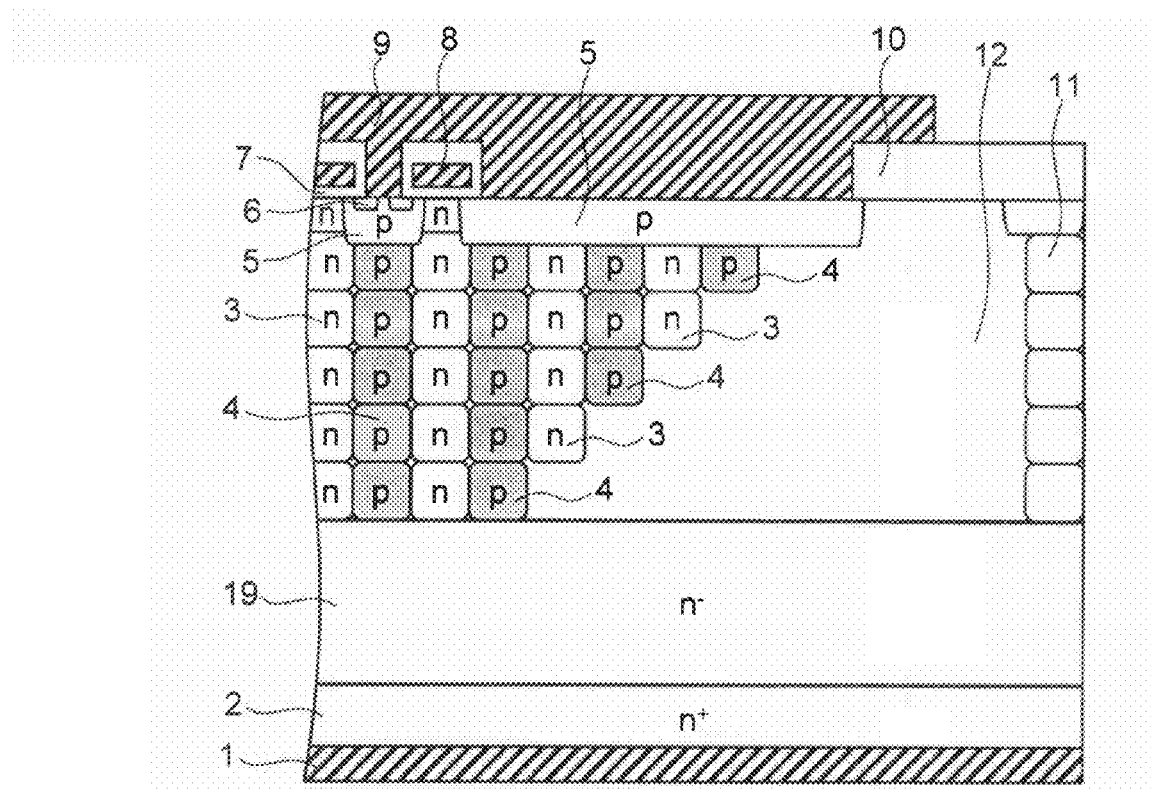
FIG. 20 is a schematic view illustrating the cross-sectional structure of the main part of a semiconductor device according to a sixth embodiment of the invention.

FIG. 20 is a schematic view illustrating the cross-sectional structure of the main part of a semiconductor device according to a sixth embodiment of the invention.

In this embodiment, an $n^-$-layer 19 illustratively made of $n^-$-type silicon having a lower dopant concentration than the n-type pillar region 3 is provided between the superjunction structure section (n-type pillar region 3 and p-type pillar region 4) and the $n^+$-drain layer 2, as well as between the high-resistance semiconductor layer 12 and the $n^+$-drain layer 2. Thus, during application of high voltage, the depletion layer extends to the $n^-$-layer 19, and the voltage can be held also in the $n^-$-layer 19.

This facilitates achieving high breakdown voltage because the voltage is held by both the superjunction structure section and the $n^-$-layer 19. Because the depletion layer extends into the $n^-$-layer 19 during application of high voltage, the characteristic of drain-source capacitance (Cds) versus drain-source voltage (Vds) is made gradual, and recovery of the body diode is softened. Furthermore, the electric field on the drain electrode 1 side during application of high voltage decreases. Hence it is also possible to achieve high avalanche withstanding capability as in the case of forming an n-type buffer layer described above.

Seventh Embodiment

Figure 21:
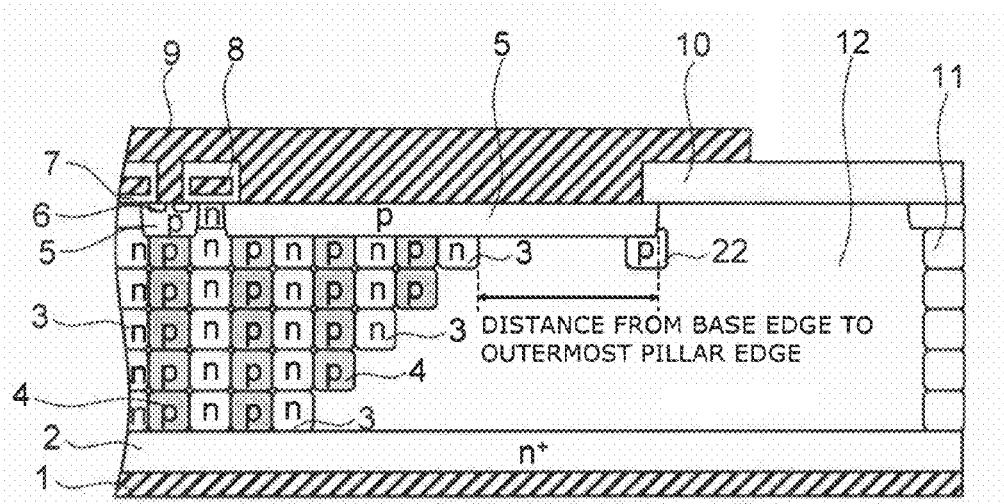
FIG. 21 is a schematic view illustrating the cross-sectional structure of the main part of a semiconductor device according to a seventh embodiment of the invention.

FIG. 21 is a schematic view illustrating the cross-sectional structure of the main part of a semiconductor device according to a seventh embodiment of the invention.

Figure 22:
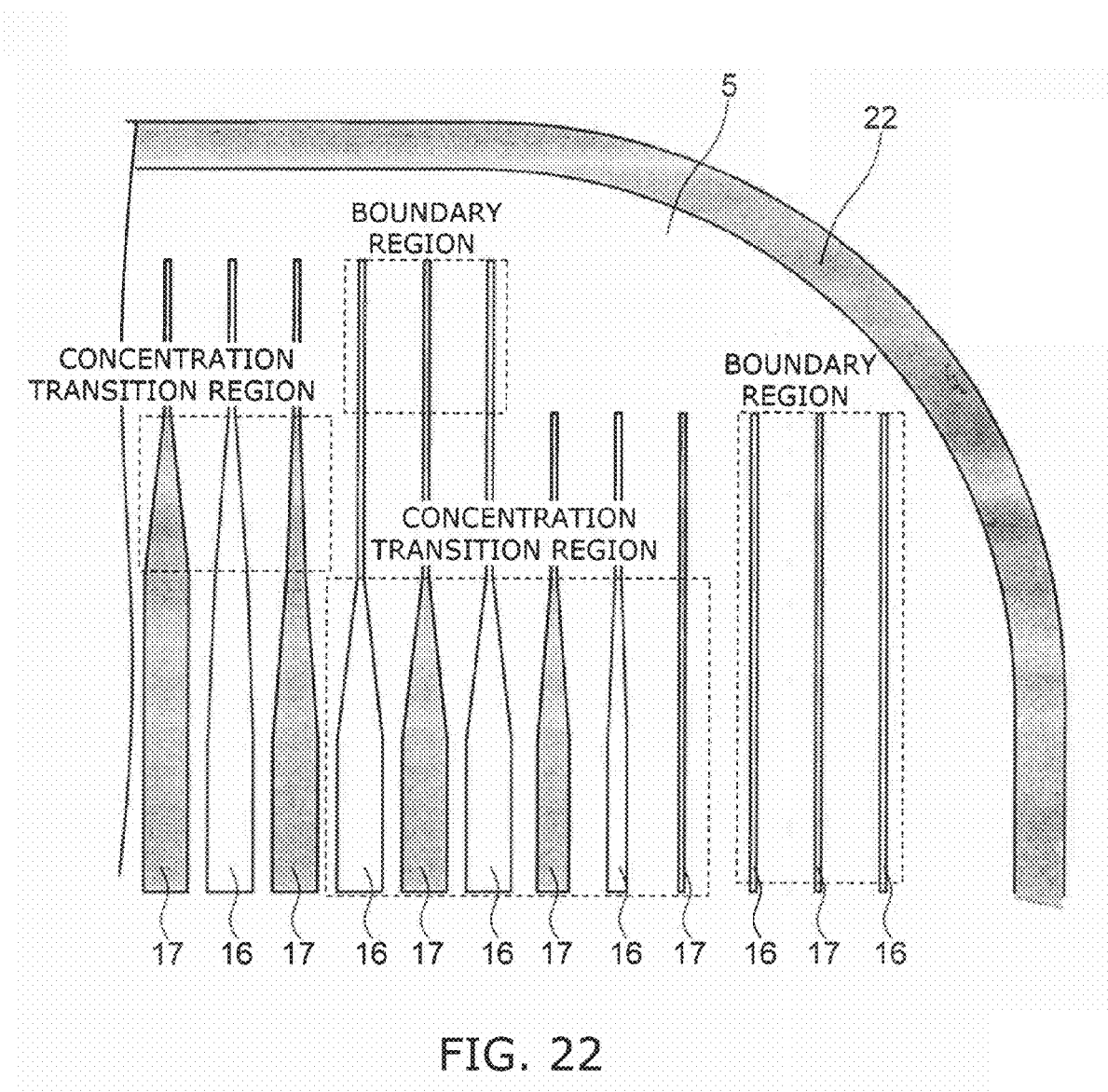
FIG. 22 is a schematic view illustrating the positional relationship between the opening pattern of a pillar region formation mask and the buried guard ring layer 22 in the semiconductor device according to this embodiment.

FIG. 22 is a schematic view illustrating the positional relationship between the opening pattern of a pillar region formation mask and the buried guard ring layer 22 in the semiconductor device according to this embodiment.

In this embodiment, a buried guard ring layer 22 made of the same p-type semiconductor as the p-base region 5 is formed at the edge (corner) of the p-base region 5.

As shown in FIG. 22, the position of the outermost pillar edge of the boundary region is varied at the corner of the p-base region 5. Hence the distance between the outermost portion of the boundary region and the edge of the p-base region 5 is varied. Variation of this distance affects the electric field distribution at the boundary region edge, and the breakdown voltage varies with the position. In this embodiment, a buried guard ring layer 22 formed at the edge of the p-base region 5 stabilizes the breakdown voltage of the boundary region.

Figure 23:
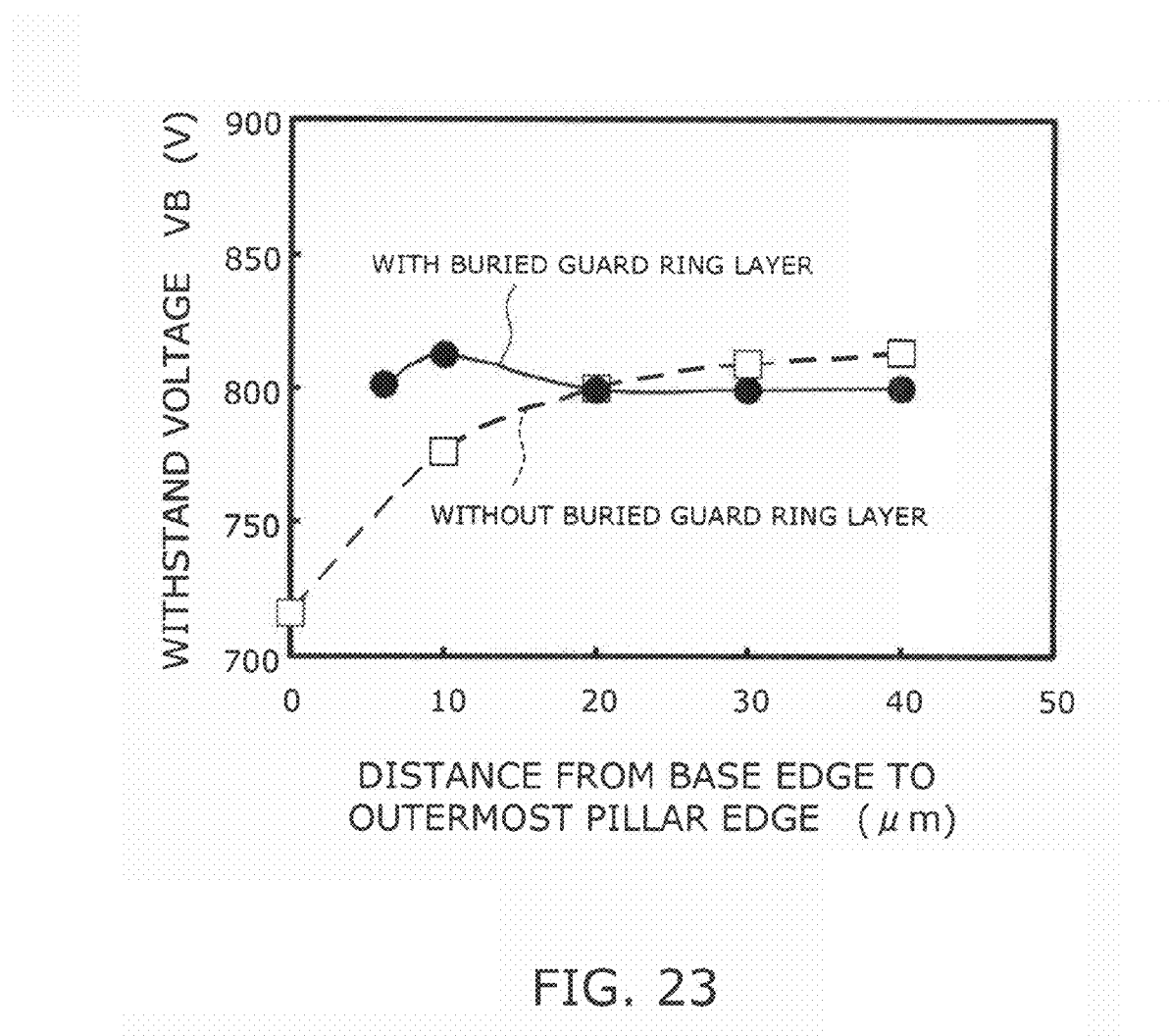
FIG. 23 is a graph showing the breakdown voltage variation with the distance from the p-base edge to the outermost pillar edge.

FIG. 23 is a graph showing the breakdown voltage variation with the distance from the p-base edge to the outermost pillar edge. The horizontal axis represents the distance (μm) from the edge of the p-base region 5 to the edge of the outermost pillar region (n-type pillar region 3). The vertical axis represents the breakdown voltage (V) of the boundary region.

When the buried guard ring layer 22 is not formed, the breakdown voltage varies in the range of distance from the p-base edge to the outermost pillar edge ranging from 0 to 40 μm. Hence, for achieving stable breakdown voltage, the outermost pillar region needs to be spaced from the p-base edge by 40 μm or more. Then the area of the cell section for current flow is decreased, and the chip ON resistance is increased.

On the other hand, when the buried guard ring layer 22 is formed, the breakdown voltage remains almost unchanged in the range of the distance from the p-base edge to the outermost pillar edge being 6 μm or more. Thus the buried guard ring layer 22 can reduce the distance in which the breakdown voltage varies. Hence the region inhibiting current flow can be decreased, and the chip ON resistance can be reduced.

Eighth Embodiment

Figure 24:
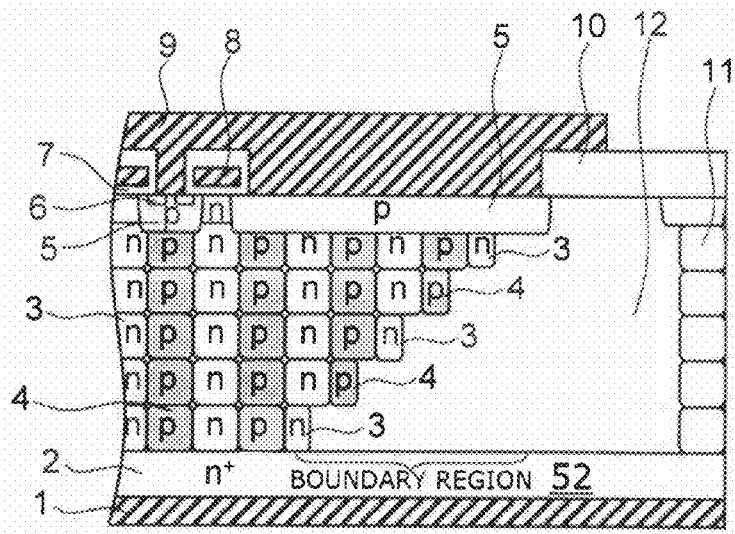
FIG. 24 is a schematic view illustrating the cross-sectional structure of the main part of a semiconductor device according to an eighth embodiment of the invention.

FIG. 24 is a schematic view illustrating the cross-sectional structure of the main part of a semiconductor device according to an eighth embodiment of the invention.

In the structure shown in FIG. 24, the amount of pillar dopant in the outermost portion of the boundary region 52 is halved. In the structure with gradually varied pillar depth, the influence of variation is reduced by halving the amount of pillar dopant only in the outermost portion rather than by halving it entirely. Even if any variation occurs in the portion with the halved amount of pillar dopant, the breakdown voltage in the portion without the pillar is determined by the amount of dopant in the high-resistance layer 12 and remains unchanged. This facilitates achieving high breakdown voltage.

This structure enables a high breakdown voltage to be achieved without providing the concentration transition region as shown in FIG. 10. Thus the device active area is increased, and the chip ON resistance can be reduced. Furthermore, for ensuring that the breakdown voltage is higher in the boundary region than in the cell section, it is also possible to add a concentration transition region to the structure shown.

Figure 25:
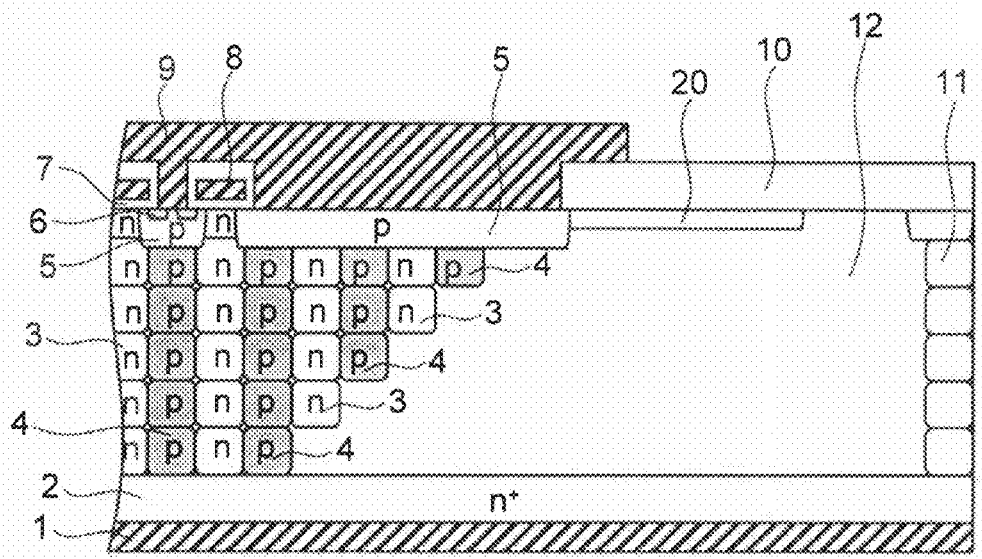
FIG. 25 is a schematic view illustrating the cross-sectional structure of the main part of a semiconductor device according to the embodiment of the invention where a RESURF structure is provided in the surface of the edge termination section.
Figure 26:
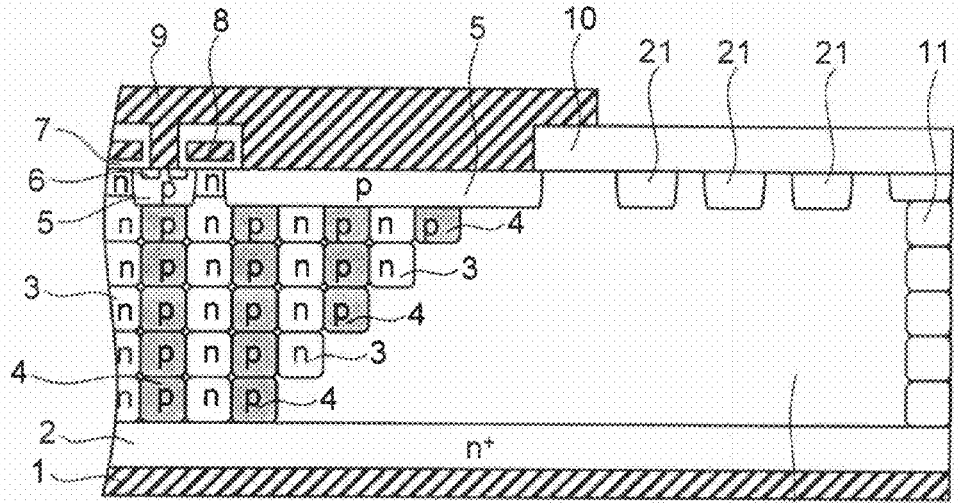
FIG. 26 is a schematic view illustrating the cross-sectional structure of the main part of a semiconductor device according to the embodiment of the invention where a guard ring structure is provided in the surface of the edge termination section.

In the embodiment, the field plate structure is provided in the edge termination section, however, the invention is not limited to this specific example. Instead of the field plate structure described above, the RESURF (Reduced Surface Field) 20 shown in FIG. 25, the guard ring structure 21 shown in FIG. 26, a floating field plate structure, or a combined structure of the field plate and the guard ring can be provided in the surface of the edge termination section. Similarly, the RESURF 20 shown in FIG. 25, the guard ring structure 21 shown in FIG. 26, a floating field plate structure, or a combined structure of the field plate and the guard ring can be provided in the surface of the edge termination section in any of the first through seventh embodiments of the invention.

Ninth Embodiment

Figure 27:
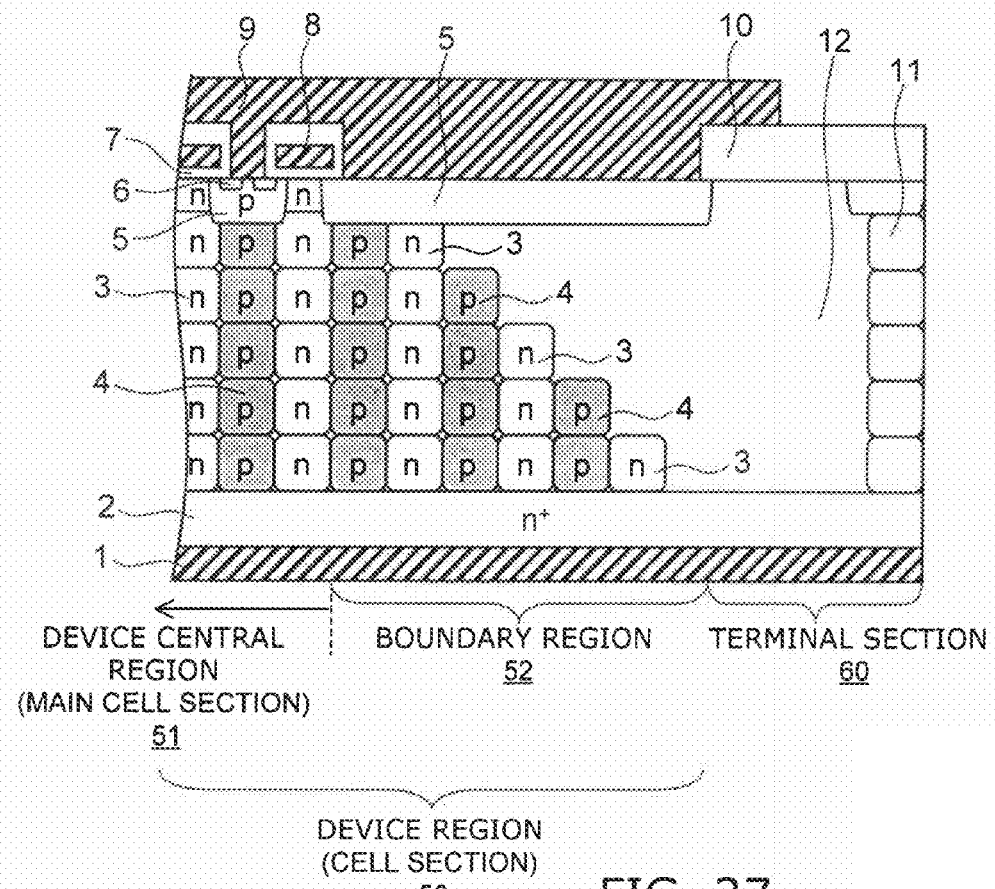
FIG. 27 is a schematic view illustrating the cross-sectional structure of the main part of a semiconductor device according to a ninth embodiment of the invention.

FIG. 27 is a schematic view illustrating the cross-sectional structure of the main part of a semiconductor device according to a ninth embodiment of the invention.

Figure 28:
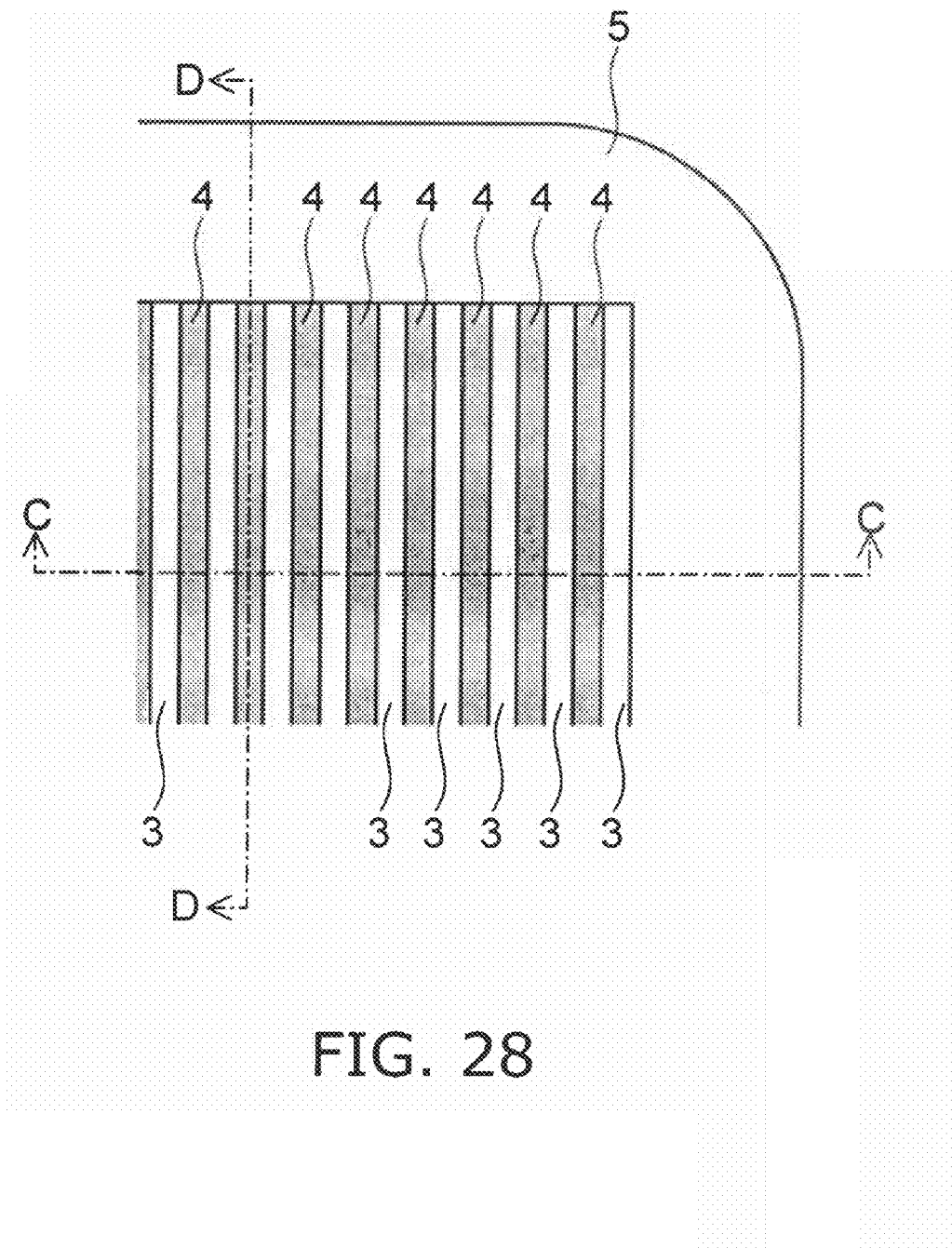
FIG. 28 is a schematic view showing an example planar pattern of pillar regions in the semiconductor device according to the ninth embodiment.

FIG. 28 is a schematic view showing an example planar pattern of pillar regions in the semiconductor device according to this embodiment.

Here, FIG. 27 shows the C-C cross section in FIG. 28.

This embodiment also proposes a structure having less variation of breakdown voltage without a superjunction structure in the edge termination section. More specifically, in this embodiment, in the boundary region 52 between the device central region 51 and the edge termination section 60, the depth of the n-type pillar region 3 and the p-type pillar region 4 adjacent to the high-resistance semiconductor layer 12 decreases stepwise as they approach the edge termination section 60.

With regard to a pair of adjacent pillar regions in the boundary region 52, the right pillar region, that is, the pillar region on the edge termination section side, is shallower than the left adjacent pillar region by e.g. about the width of one pillar region. The portion of a pillar region having no right adjacent pillar region is in contact with the high-resistance semiconductor layer 12. In the boundary region 52, the edge of the n-type pillar region 3 and the p-type pillar region 4 on the source electrode 9 side is varied in a staircase pattern.

Thus the depth of the pillar region is varied stepwise. In this case, the portion with no pillar region neighboring on one side, that is, the portion with imbalanced presence of pillar region, extends not entirely, but partially, along the depth of one pillar region. That is, the portion with imbalanced presence of pillar region is dispersed, and hence the decrease of breakdown voltage is reduced.

In the structure shown in FIG. 27, the pillar regions 4, 3 where the depth is varied stepwise are not in touch with the p-type base region 5. Thus, the boundary region 52 does not easily affect the electric field at the edge of the p-type base region 5. Therefore, it becomes possible to form the boundary region 52 closer to the edge of the p-type base region 5 than the structure shown in FIG. 1. As a result, a dead region where current can not be flown can be decreased.

In FIG. 27, an n-type pillar region 3 is located in the outermost portion, that is, the portion nearest to the edge termination section. However, it may be a p-type pillar region 4. Furthermore, in FIG. 27, the depth of the n-type pillar region 3 and the p-type pillar region 4 in the boundary region 52 is varied in five steps. However, the depth variation is not limited thereto, but the depth can be varied in any number of steps other than five steps. Moreover, the depth can be varied nonuniformly as long as the depth of the n-type pillar region 3 and the p-type pillar region 4 is varied stepwise.

Figure 29A:
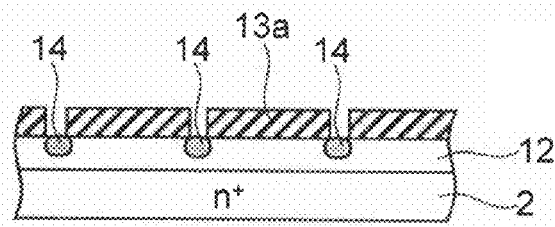
FIGS. 29 and 30 are process cross-sectional views illustrating the main part of a process for manufacturing a semiconductor device according to this embodiment.
Figure 29B:
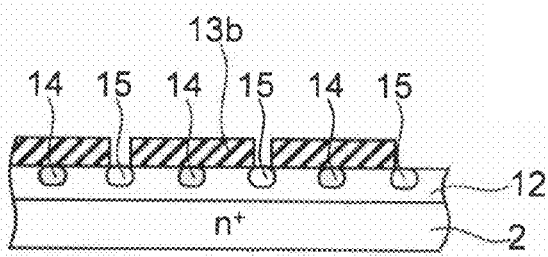
Figure 29C:
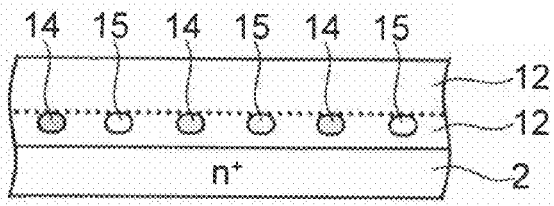
Figure 29D:
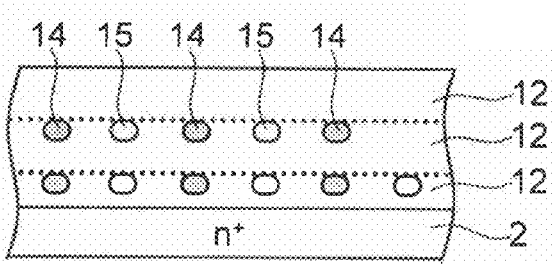
Figure 29E:
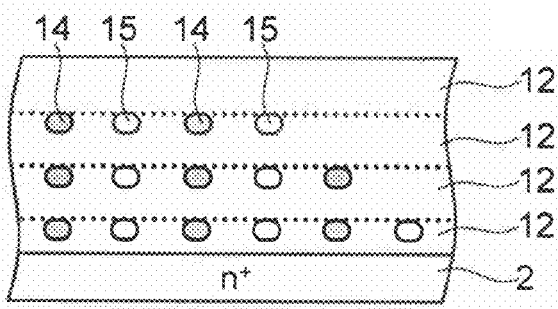
Figure 30A:
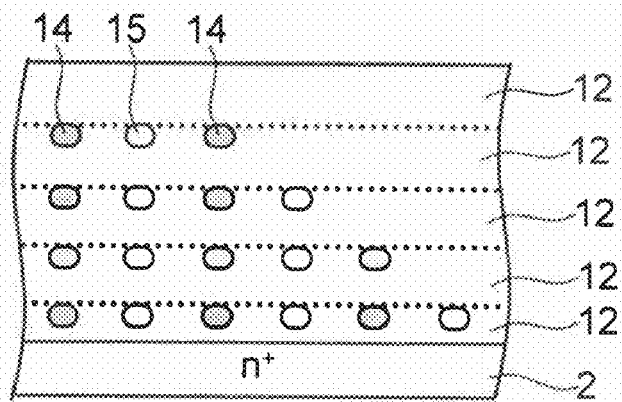
Figure 30B:
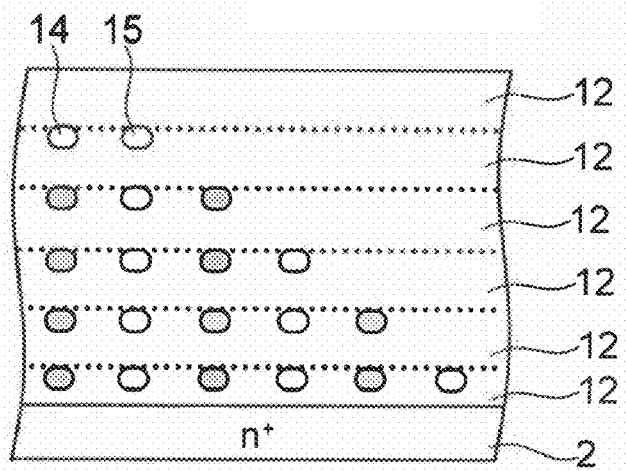

The superjunction structure in the boundary region shown in FIG. 27 can be realized by the process flow as shown in FIGS. 29 and 30.

Figure 30C:
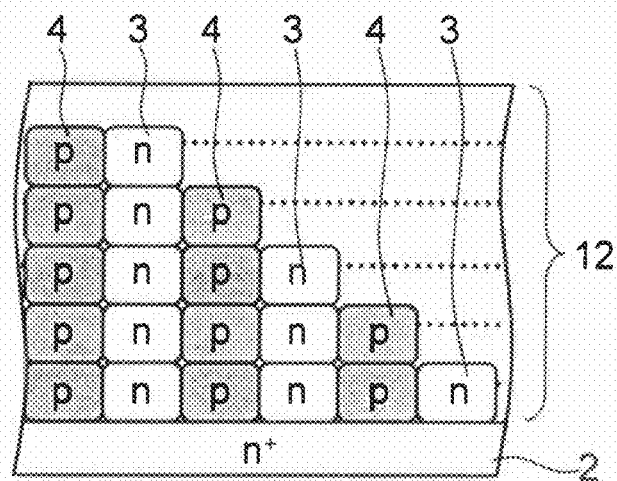

First, as shown in FIG. 29A, a high-resistance semiconductor layer 12 formed on a major surface of an $n^+$-type semiconductor layer 2 is subjected to ion implantation of boron 14, for example, which is a dopant for forming a p-type pillar region, by using a resist or other mask 13a. Next, as shown in FIG. 29B, a mask 13b is used to perform ion implantation of phosphorus 15, for example, which is a dopant for forming an n-type pillar region. Subsequently, as shown in FIGS. 29C to 30B, the ion implanted layer is buried under a high-resistance semiconductor layer 12, which is again subjected to ion implantation, and this process is repeated. Here, the outermost mask opening nearer to the edge termination section is shifted for each layer to control the site of ion implantation. As shown in FIG. 30C, the subsequent step of diffusing implanted ions results in a superjunction structure where the depth of the n-type pillar region 3 and the p-type pillar region 4 is varied stepwise.

Thus only the mask opening location for forming the outermost pillar region needs to be shifted for each layer, and the mask opening width does not need to be varied. Hence there is no need to halve the mask opening width for halving the amount of dopant in response to the one-sided depletion. Only a simple control is needed as to whether a pillar region is formed or not (ion implantation is performed or not) at a location. Thus variation in the amount of dopant is reduced, and the decrease of breakdown voltage can be prevented. That is, it is possible to provide a semiconductor device having a superjunction structure where the decrease of breakdown voltage due to process variation is reduced. Because of the small decrease of breakdown voltage due to process variation, the dopant concentration in the superjunction structure can be further increased, and the ON resistance can be reduced as well.

Figure 31:
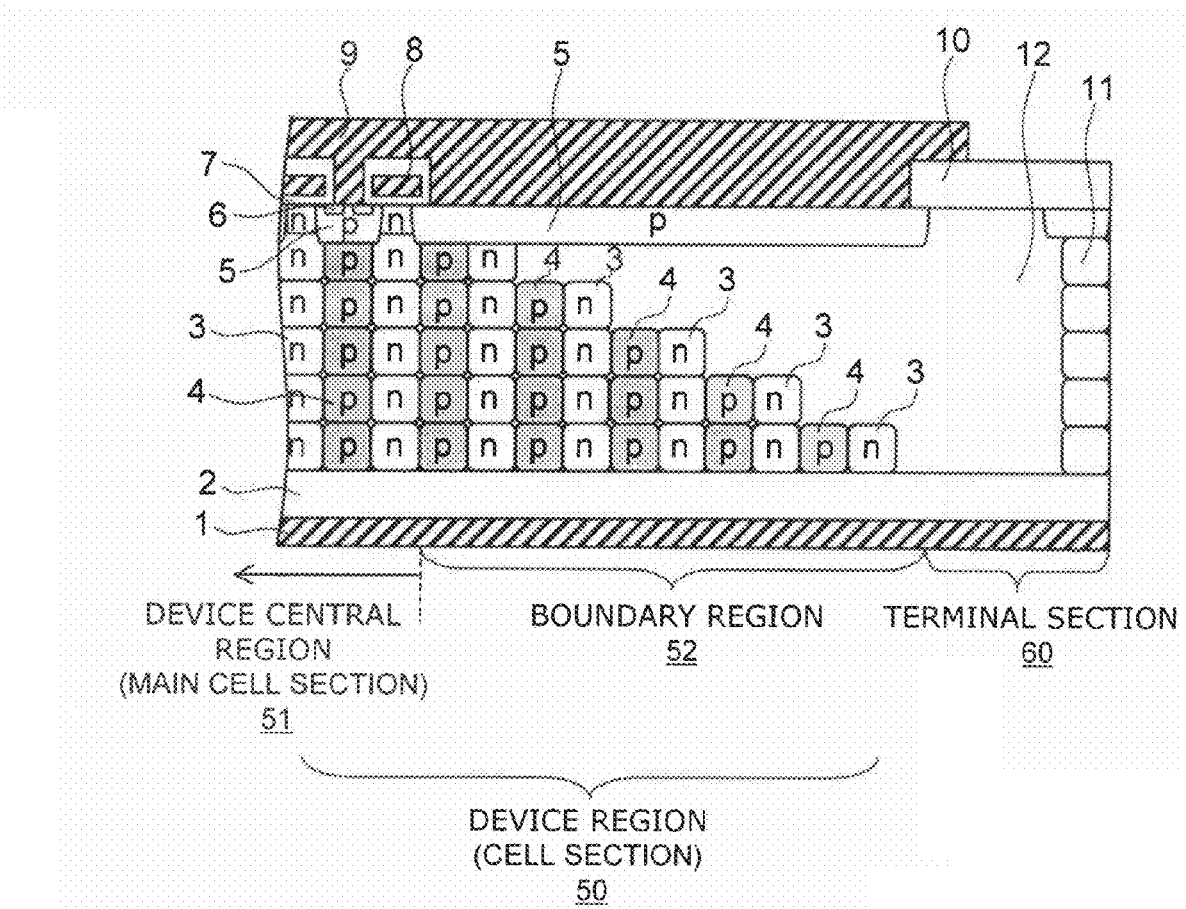
FIG. 31 is a schematic cross-sectional view showing a variation of the semiconductor device according to this embodiment.

In the example shown in FIG. 27, the depth of the n-type pillar regions 3 and the p-type pillar regions 4 is varied alternately for each pillar region. However, as shown in FIG. 31, the depth may be varied for each set of a plurality of pillar regions. In FIG. 31, the depth is varied for each set of two pillar regions. However, the depth can be varied for each set of three or more pillar regions.

Figure 32:
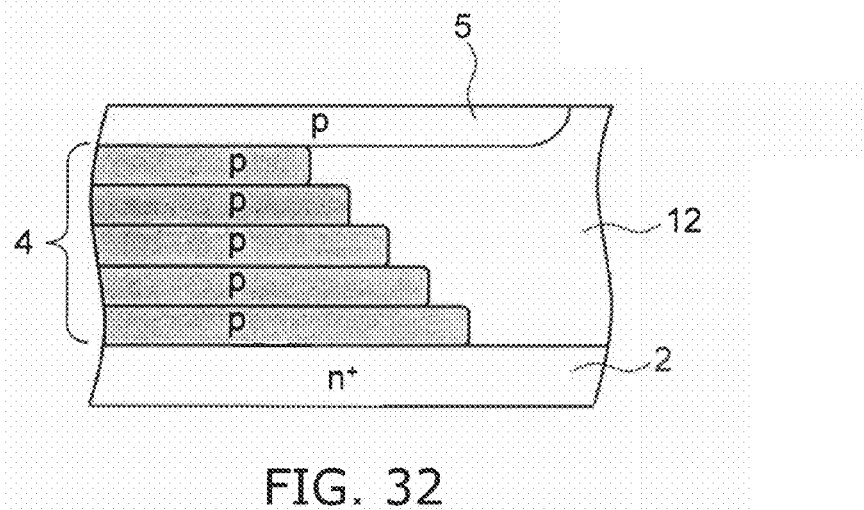
FIG. 32 is a cross-sectional view taken along the line D-D in FIG. 28.

When the superjunction structure is formed in a striped planar pattern as shown in FIG. 28, the depth of the pillar region may be varied stepwise also at the edge in the stripe extending direction as shown in FIG. 32, which shows the D-D cross section in FIG. 28. In the example shown in FIG. 32, a p-type pillar region 4 is formed in a staircase pattern so as to be shallowed stepwise toward the edge termination section (right side in FIG. 32). Similarly, the depth of the n-type pillar region 3 is also varied stepwise at the edge in the stripe extending direction in conformity with the p-type pillar region 4.

When the process shown in FIGS. 29 and 30 is used, the position of the edge of the superjunction structure in the stripe extending direction may involve deviation due to misalignment in the lithography process for forming each buried layer. The deviation tends to cause local imbalance of p/n-pillar regions at the above-mentioned edge. However, when the pillar region is formed under intentional control in a staircase pattern as shown in FIG. 32, the imbalance of p/n-pillar regions due to misalignment in lithography is less likely to occur. The shifted distance of the edge position of the pillar region for each buried layer is preferably set to a length for which the misalignment in the lithography process is negligible (e.g. 1 µm or more).

In the ninth embodiment, a field plate structure is used in the surface of the edge termination section. However, the invention is not limited to the surface structure. For example, it is possible to use a structure having a RESURF (Reduced Surface Field), a structure having a guard ring, a structure having the floating field plate structure, or the field plate structure combined with the guard ring structure.

Tenth Embodiment

Figure 33:
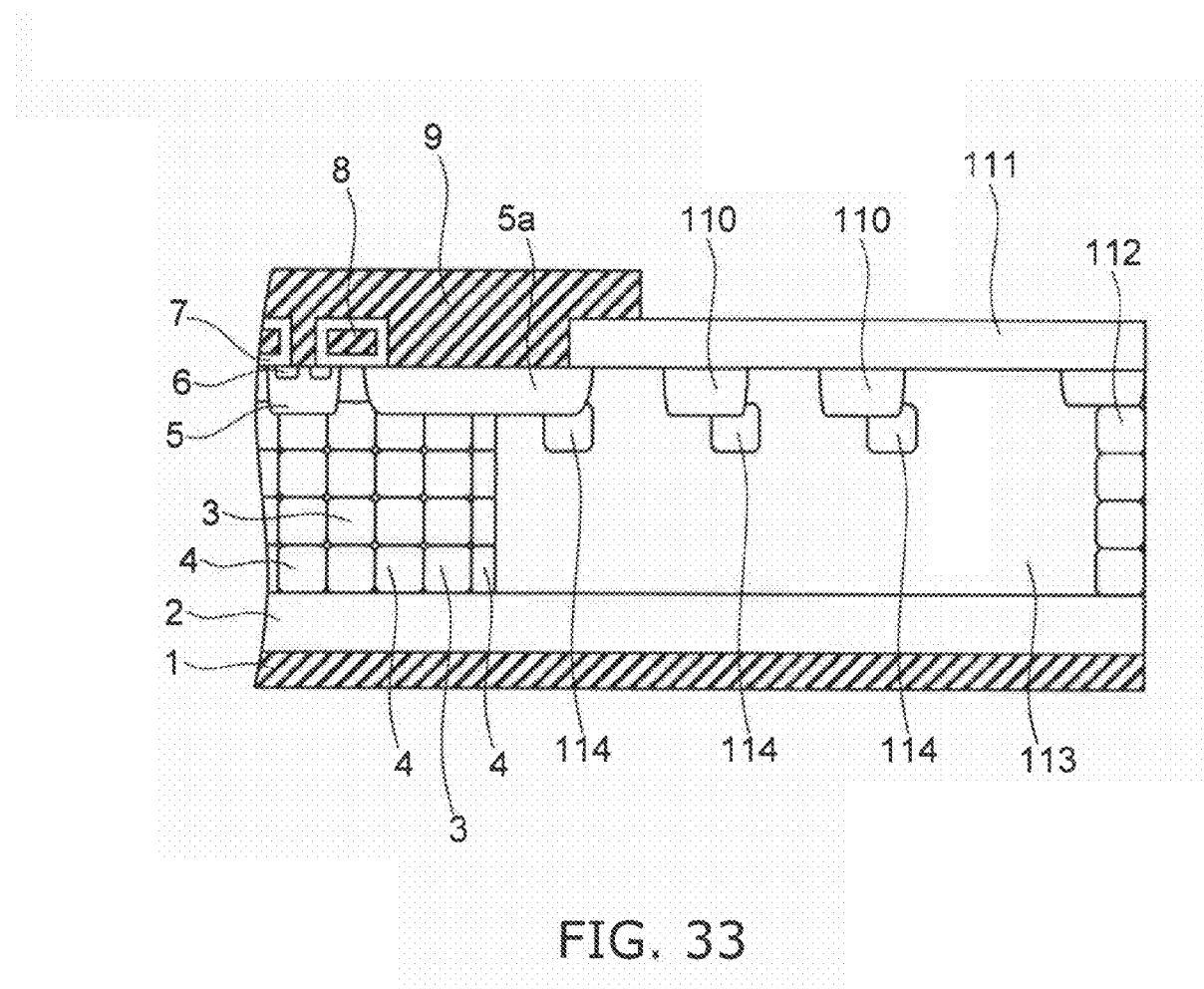
FIG. 33 is a schematic view illustrating the cross-sectional structure of the main part of a semiconductor device according to a tenth embodiment of the invention.

FIG. 33 is a schematic view illustrating the cross-sectional structure of the main part of a semiconductor device according to a tenth embodiment of the invention.

FIG. 34A is a schematic view showing an example planar pattern of the main part in FIG. 33, and FIG. 34B is an enlarged view of the main part.

Figure 35A:
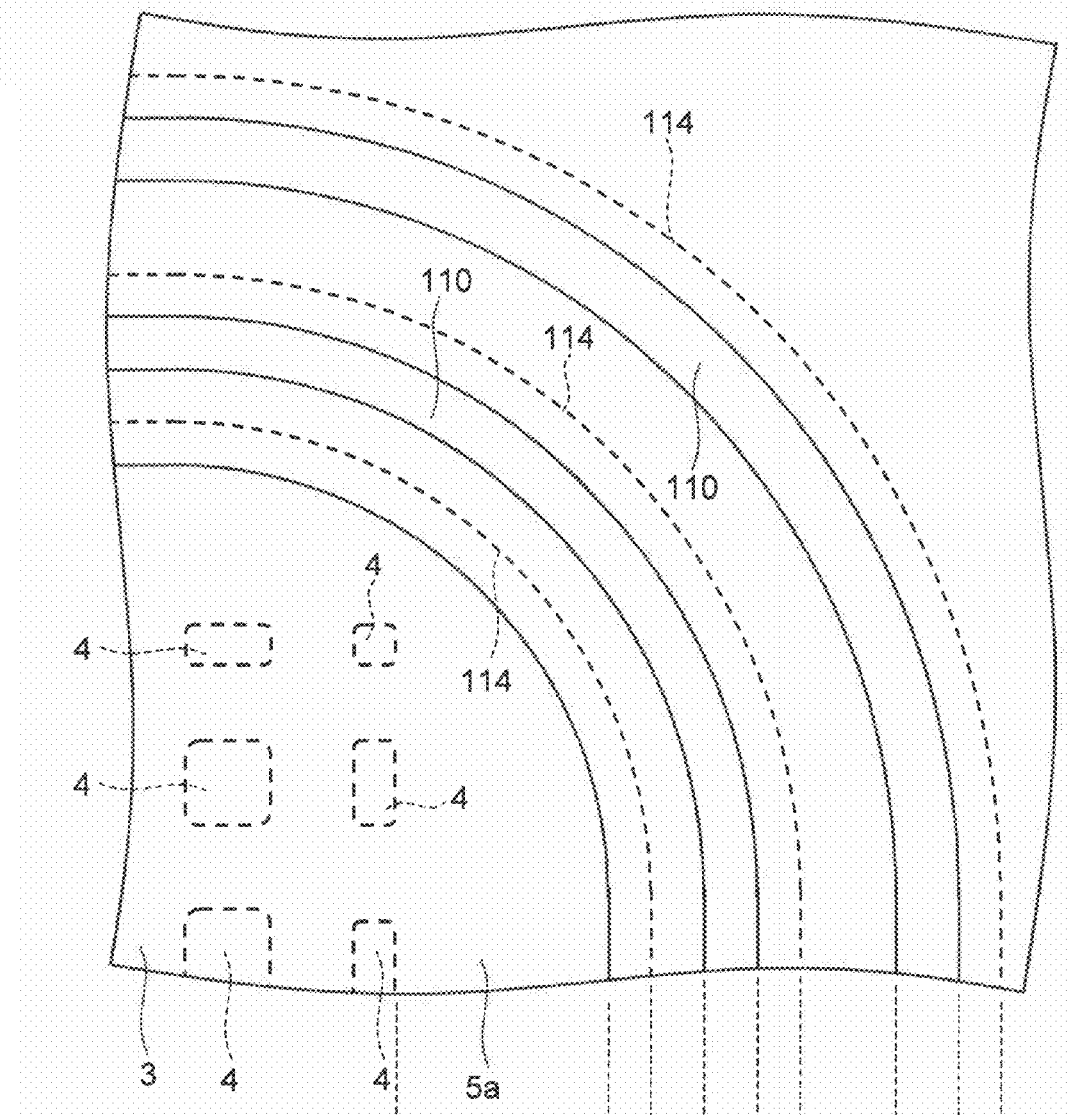
FIG. 35A is a schematic view showing another example planar pattern of the main part in FIG. 33.
Figure 35B:
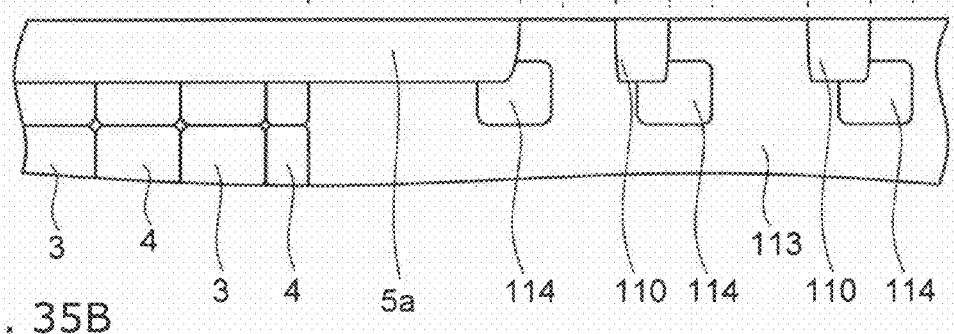
FIG. 35B is an enlarged view of the main part as in FIG. 34B.

FIG. 35A is a schematic view showing another example planar pattern of the main part in FIG. 33, and FIG. 35B is an enlarged view of the main part as in FIG. 34B.

On a major surface of a drain layer (first semiconductor layer) 2 of highly doped $n^+$-type silicon, first semiconductor pillar regions 3 of n-type silicon (hereinafter also simply referred to as "n-type pillar regions") and second semiconductor pillar regions 4 of p-type silicon (hereinafter also simply referred to as "p-type pillar regions") are periodically arranged in a direction substantially parallel to the major surface of the drain layer 2. The n-type pillar regions 3 and the p-type pillar regions 4 constitute a so-called "superjunction structure". That is, the n-type pillar region 3 and the p-type pillar region 4 are adjacent to each other to form a p-n junction. The planar pattern of the n-type pillar regions 3 and the p-type pillar regions 4 may be in a striped configuration as shown in FIG. 34, or a lattice configuration as shown in FIG. 35, for example.

The semiconductor device according to this embodiment is largely divided into a device section (cell section) having a periodic arrangement structure of n-type pillar regions 3 and p-type pillar regions 4, and an edge termination section surrounding outside the device section. On the major surface of the drain layer 2 in the edge termination section, no superjunction structure is provided, but a high-resistance layer (second semiconductor layer) 113 is provided. The high-resistance layer (second semiconductor layer) 113 is illustratively made of n-type silicon having a lower dopant concentration (higher resistance) than the n-type pillar region 3.

On the p-type pillar region 4 in the device section, a base region (first semiconductor region) 5 of p-type silicon is provided in contact with the p-type pillar region 4. Like the p-type pillar region 4, the base region 5 is also adjacent to the n-type pillar region 3 to form a p-n junction. A source region (second semiconductor region) 6 of $n^+$-type silicon is selectively provided in the surface of the base region 5. The outermost portion 5a of the base region 5 is provided on the n-type pillar region 3 and the p-type pillar region 4 near the boundary with the edge termination section. The outermost portion 5a of the base region 5 has no source region 6.

An insulating film 7 is provided on the portion extending from the n-type pillar region 3 through the base region 5 to the source region 6. The insulating film 7 is illustratively made of silicon oxide film and has a thickness of about 0.1 µm. A control electrode (gate electrode) 8 is provided on the insulating film 7.

A source electrode (second main electrode) 9 is provided on part of the source region 6 and the portion of the base region 5 between the source regions 6. A drain electrode (first main electrode) 1 is provided on the side opposite to the major surface of the drain layer 2.

The pillar region in the outermost portion of the superjunction structure may be a p-type pillar region 4 or an n-type pillar region 3. However, because the outermost pillar region has a higher dopant concentration than the high-resistance layer 113, the depletion layer does not extend from the high-resistance layer 113 toward the outermost pillar region, but extends exclusively from the adjacent pillar region, upon application of high voltage. The amount of dopant in the outermost pillar region is preferably about 0.35 to 0.65 times that in the other pillar regions for completely depleting the outermost pillar region.

The outermost portion of the edge termination section has an n-type field stop layer 112 so that the depletion layer does not reach the dicing line upon application of high voltage. The field stop layer 112 can be formed simultaneously with the n-type pillar region 3. It is also possible to form a field stop electrode above the field stop layer 112.

A guard ring layer 110 of p-type silicon is formed in the surface of the high-resistance layer 113 in the edge termination section. The surface of the high-resistance layer 113, the guard ring layer 110, and the field stop layer 112 is covered with a field insulating film 111. The guard ring layer 110 serves to prevent electric field concentration at the edge of the outermost base region 5a, thereby achieving high breakdown voltage. Furthermore, the edge termination section has no superjunction structure, but has a high-resistance (lowly doped) layer 113, which facilitates extension of the depletion layer to achieve a higher edge termination breakdown voltage than the device section. The dopant concentration in the high-resistance layer 113 is preferably about 1/100 to 1/10 of that in the n-type pillar region 3 for achieving high edge termination breakdown voltage.

A buried guard ring layer 114 of p-type silicon is buried in the high-resistance layer 113 so as to contiguously cover the outer corner of the outermost base region 5a and the guard ring layer 110. The dopant concentration in the buried guard ring layer 114 is preferably about 0.5 to 2 times that in the p-type pillar region 4 so that the buried guard ring layer 114 is completely depleted upon application of high voltage between the source and the drain.

In the planar pattern shown in FIG. 34, the guard ring layer 110 and the buried guard ring layer 114 have a curvature so as to be concentrically formed at the corner of the outermost base region 5a. The curvature radius of the outermost base region 5a is preferably about 2 to 4 times the thickness of the drift layer (n-type pillar region 3) for preventing electric field concentration at the corner of the outermost base region 5a.

The planar pattern of the buried guard ring layer 114 can be designed independently of the planar pattern of the superjunction structure of the device section. The planar pattern of the superjunction structure may be in a striped configuration as shown in FIG. 34, or a lattice configuration as shown in FIG. 35. It is also possible to use other planar patterns such as a houndstooth check configuration for p-type pillar regions 4.

FIG. 36A is a schematic cross-sectional view of the surface portion of the device section and the edge termination section, and FIG. 36B is a schematic diagram showing the electric field distribution in the portion extending from the outermost base region 5a to the edge termination section. In FIG. 36B, the dotted line represents the electric field distribution in the case without a buried guard ring layer 114, and the solid line represents the electric field distribution in the case with a buried guard ring layer 114.

In the structure without a buried guard ring layer 114, the electric field distribution has a sharp peak at the outer corner of the outermost base region 5a and the guard ring layer 110. The electric field distribution in the edge termination section varies with the voltage variation, the charge variation in the field insulating film 111, and the variation of carrier distribution in the semiconductor. Such electric field distribution may be able to temporarily hold high voltage. However, when the electric field distribution is affected by the above variations, the electric field distribution having a sharp peak in the design phase is likely to cause local avalanche breakdown in the vicinity of the electric field peak. Unfortunately, local avalanche breakdown is likely to cause the degradation of the field insulating film 111 by carriers generated by the breakdown, destruction due to current concentration, and other reliability degradation, and the decrease of avalanche withstanding capability and recovery capability.

In this embodiment, a buried guard ring layer 114 is buried in the portion susceptible to electric field concentration such as the outer corner of the outermost base region 5a and the guard ring layer 110. This can prevent local electric field concentration at that portion and alleviate the electric field.

The buried guard ring layer 114 increases the curvature radius at the outer corner of the outermost base region 5a and the guard ring layer 110. Upon application of high voltage, the buried guard ring layer 114 is depleted, and an electric field is also applied to the inside of the buried guard ring layer 114 and produces a gradual electric field distribution as shown by the solid line in FIG. 36B. The depletion of the buried guard ring layer 114 increases the electric field other than at the peak, but local avalanche breakdown becomes less likely to occur because the peak electric field is decreased. Thus high reliability and high withstanding capability can be achieved.

The buried guard ring layer 114 can be formed simultaneously with the p-type pillar region 4 as a lowly doped buried layer which is depleted upon application of high voltage. Here, a buried guard ring layer 114 formed too deep has an effect of thinning the high-resistance layer 113 and decreases the breakdown voltage. Hence the depth of the buried guard ring layer 114 is preferably smaller than that of the p-type pillar region 4.

The superjunction structure composed of n-type pillar regions 3 and p-type pillar regions 4 can be formed as follows, for example: The process of ion implantation into a high-resistance n$^-$-layer followed by buried crystal growth with another high-resistance n$^-$-layer is repeated a plurality of times, and the layers are connected along the depth by thermal diffusion. Alternatively, the process of multiple iterations of ion implantation into a high-resistance n$^-$-layer with varied acceleration voltage followed by buried crystal growth can be repeated a plurality of times to form the superjunction structure.

These processes for forming a superjunction structure can be based on a mask pattern by which a buried guard ring layer 114 is also formed when the p-type doped layer buried in the most superficial layer is formed by ion implantation. Then a buried guard ring layer 114 shallower than the p-type pillar region 4 can be formed. That is, the structure according to this embodiment can be readily achieved simply by changing the mask pattern in the existing process.

The number of guard ring layers 110 formed in the surface of the high-resistance layer 113 is not limited to two, but can be one, or three or more.

Figure 37:
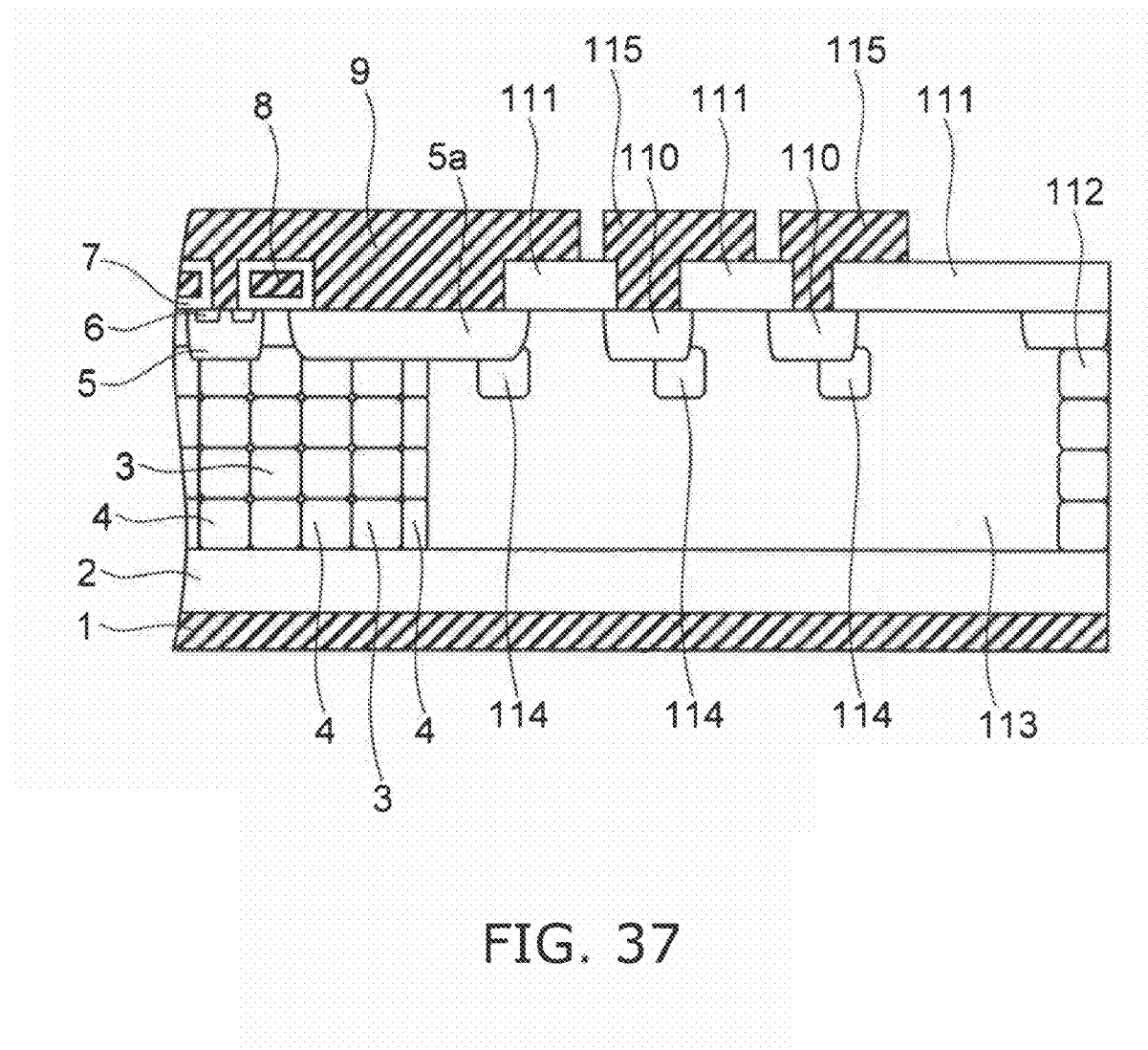
FIG. 37 is a schematic view showing another example of the semiconductor device according to the tenth embodiment.

As shown in FIG. 37, it is also possible to use a structure where a field plate electrode 115 is connected to the guard ring layer 114.

Figure 38:
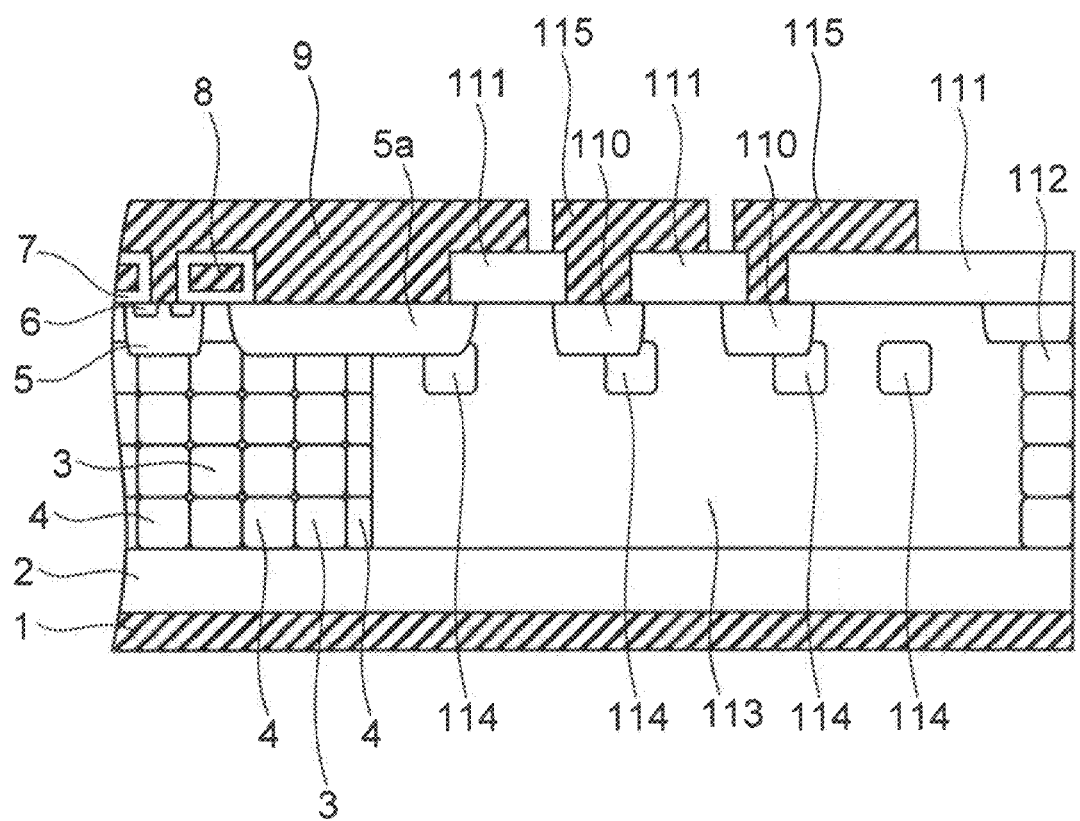
FIG. 38 is a schematic view showing still another example of the semiconductor device according to the tenth embodiment.

As shown in FIG. 38, a buried guard ring layer 114 may be provided directly below the edge of the field plate electrode 115 in the high-resistance layer 113 in order to prevent electric field concentration at the (outer) edge of the field plate electrode 115.

Figure 39:
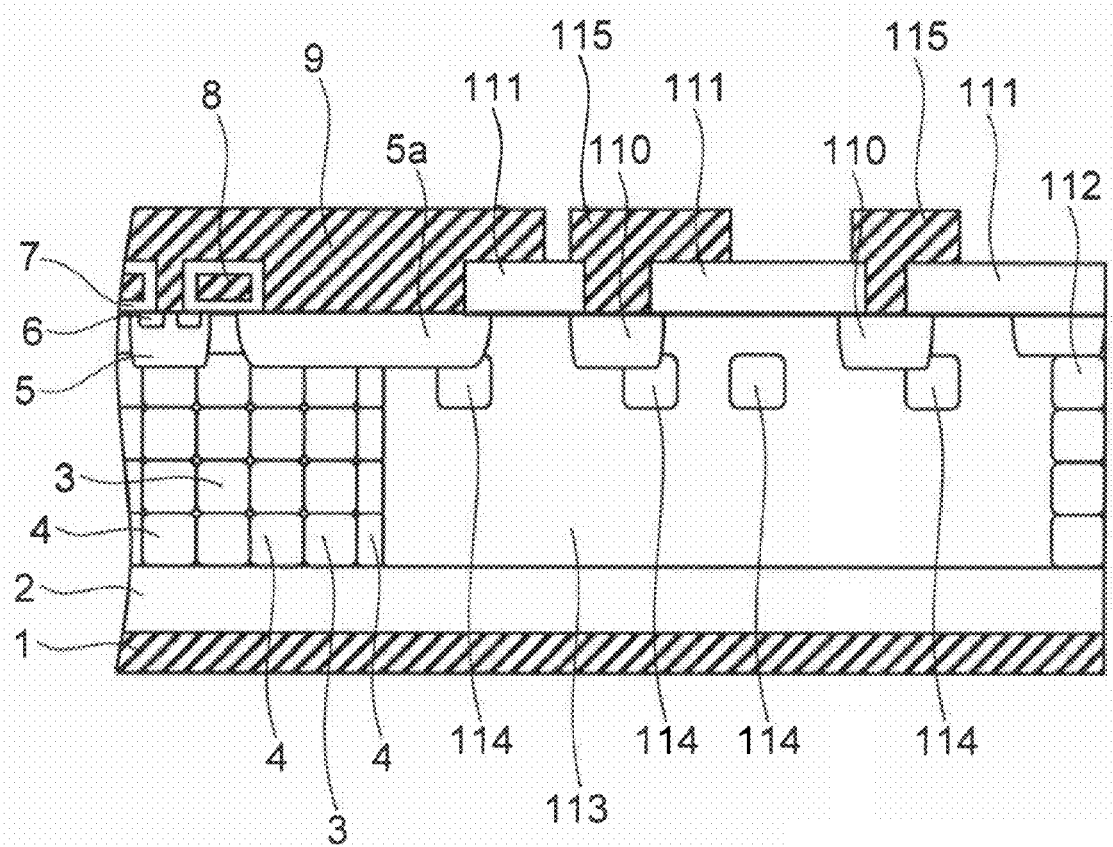
FIG. 39 is a schematic view showing still another example of the semiconductor device according to the tenth embodiment.

As shown in FIG. 39, when the spacing between the guard ring layers 110 is relatively large, a buried guard ring layer 114 can be placed between those guard ring layers 110 to prevent electric field concentration on the guard ring layers 110 inside the buried guard ring layer 114. Thus the guard ring layers 110 in the surface of the high-resistance layer 113 can be placed relatively freely. The guard ring layer 110 and the base region 5 can be formed in separate processes and have different diffusion depths, or can be formed simultaneously and have the same diffusion depth.

Eleventh Embodiment

Figure 40:
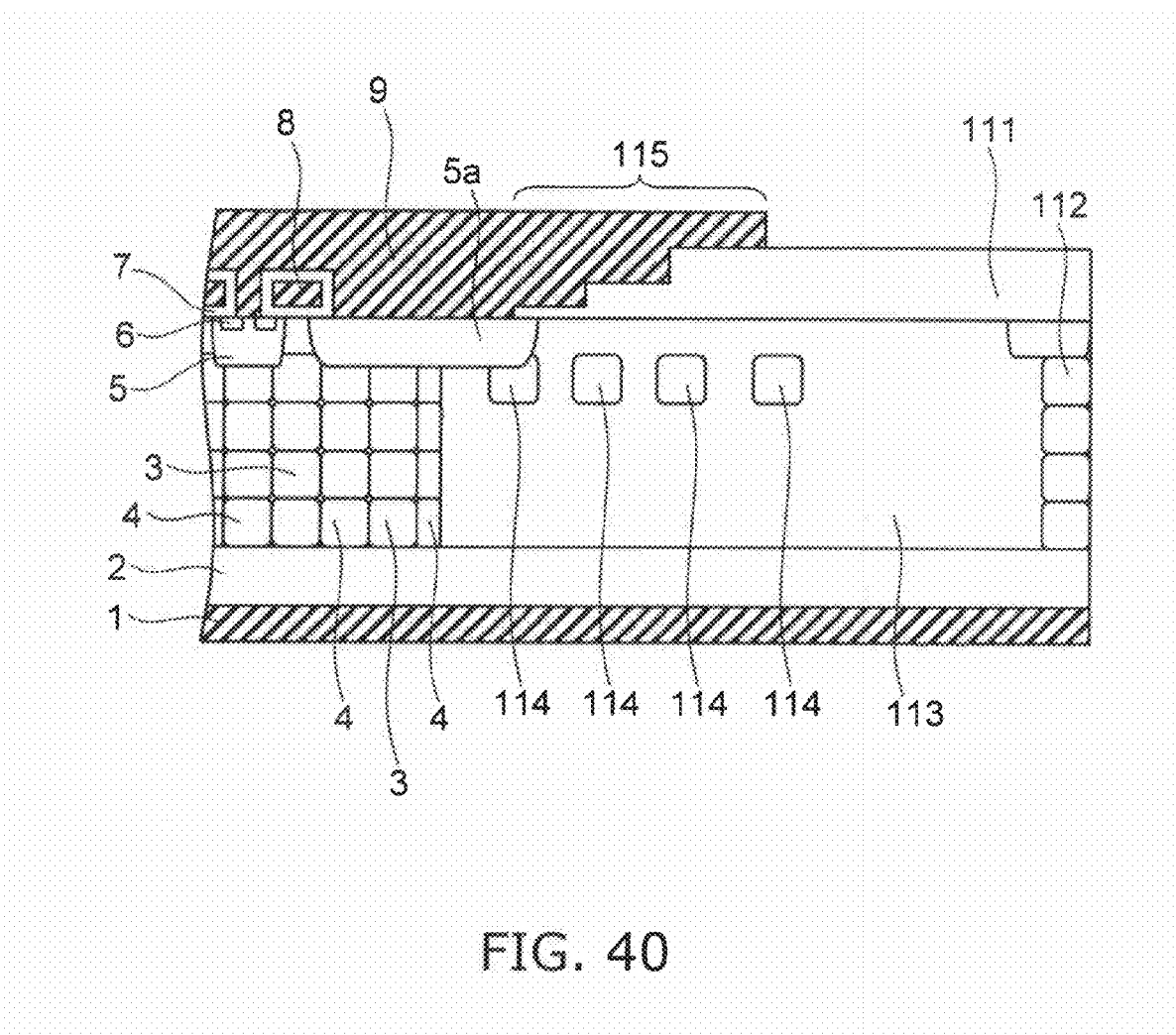
FIG. 40 is a schematic view illustrating the cross-sectional structure of the main part of a semiconductor device according to an eleventh embodiment of the invention.

FIG. 40 is a schematic view illustrating the cross-sectional structure of the main part of a semiconductor device according to an eleventh embodiment of the invention. The same elements as those in the foregoing embodiments are not described in detail, but only different elements are described here.

In the structure shown in FIG. 40, the thickness of the field insulating film 111 formed on the surface of the edge termination section is varied stepwise. More specifically, the field insulating film 111 is thickened stepwise from the edge of the outermost base region 5a toward the outermost portion of the edge termination section.

On the portion of the field insulating film 111 having stepwise varied thickness, a field plate electrode 115 is formed integrally with the source electrode 9. The field plate electrode 115 serves to prevent electric field concentration at the edge of the outermost base region 5a, and high breakdown voltage is achieved.

Also in the field plate structure shown in FIG. 40, like the guard ring edge termination structure shown in FIG. 33, a local electric field peak occurs at the corner of the outermost base region 5a edge and the field insulating film 111 having varied thickness. For reducing this electric field peak, also in this embodiment, buried guard ring layers 114 are buried in the high-resistance layer 113 below the corner of the outermost base region 5a edge and the field insulating film 111 having varied thickness and below the edge of the field plate electrode 115.

Like the guard ring layer 110 shown in FIGS. 34 and 35, the planar pattern of the field plate electrode 115 has a curvature so that the field plate electrode 115 is concentrically formed at the corner with respect to the outermost base region 5a.

Also in this embodiment, the buried guard ring layer 114 formed in the portion susceptible to electric field concentration increases the curvature radius at the corner of the field plate electrode 115 to alleviate the electric field concentration. Upon application of high voltage, the buried guard ring layer 114 is depleted, an electric field is also applied to the inside of the buried guard ring layer 114, and the electric field distribution is made gradual in the edge termination section. The depletion of the buried guard ring layer 114 increases the electric field other than at the peak, but local avalanche breakdown becomes less likely to occur because the peak electric field is decreased. Thus high reliability and high withstanding capability can be achieved.

In terms of alleviating the local electric field peak, the buried guard ring layer 114 is preferably placed below the edge of the outermost base region 5a, the portion of the field insulating film 111 having varied thickness, and the edge of the field plate electrode 115.

Figure 41:
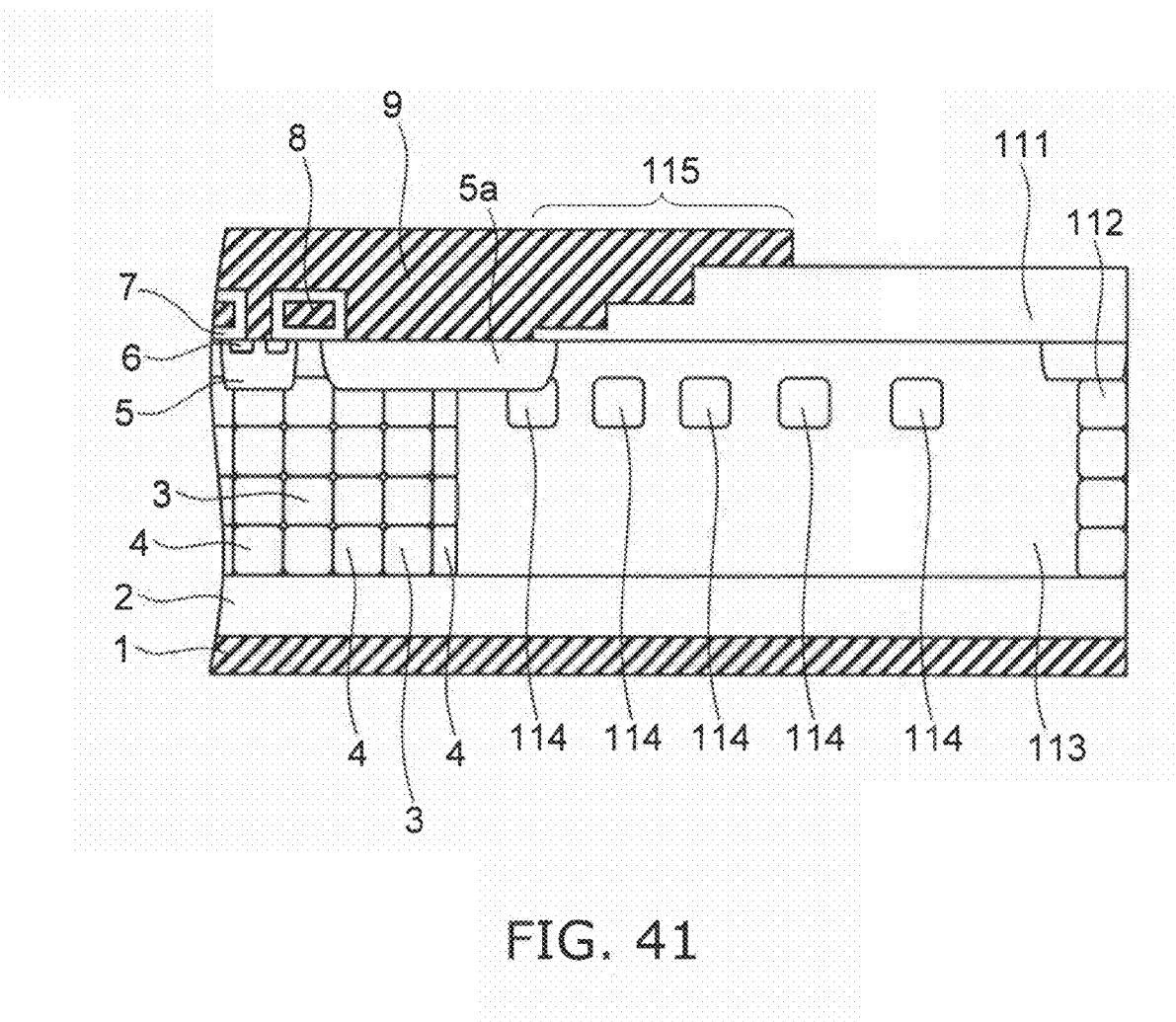
FIG. 41 is a schematic view showing another example of the semiconductor device according to the eleventh embodiment.

As shown in FIG. 41, a buried guard ring layer 114 can be placed outside the edge of the field plate electrode 115. A thin field insulating film 111 results in a large electric field at the edge of the field plate electrode 115. However, a buried guard ring layer 114 additionally placed outside the edge of the field plate electrode 115 can reduce the electric field at the edge of the field plate electrode 115, and enables the thickness of the field insulating film 111 to be configured relatively freely.

Figure 42:
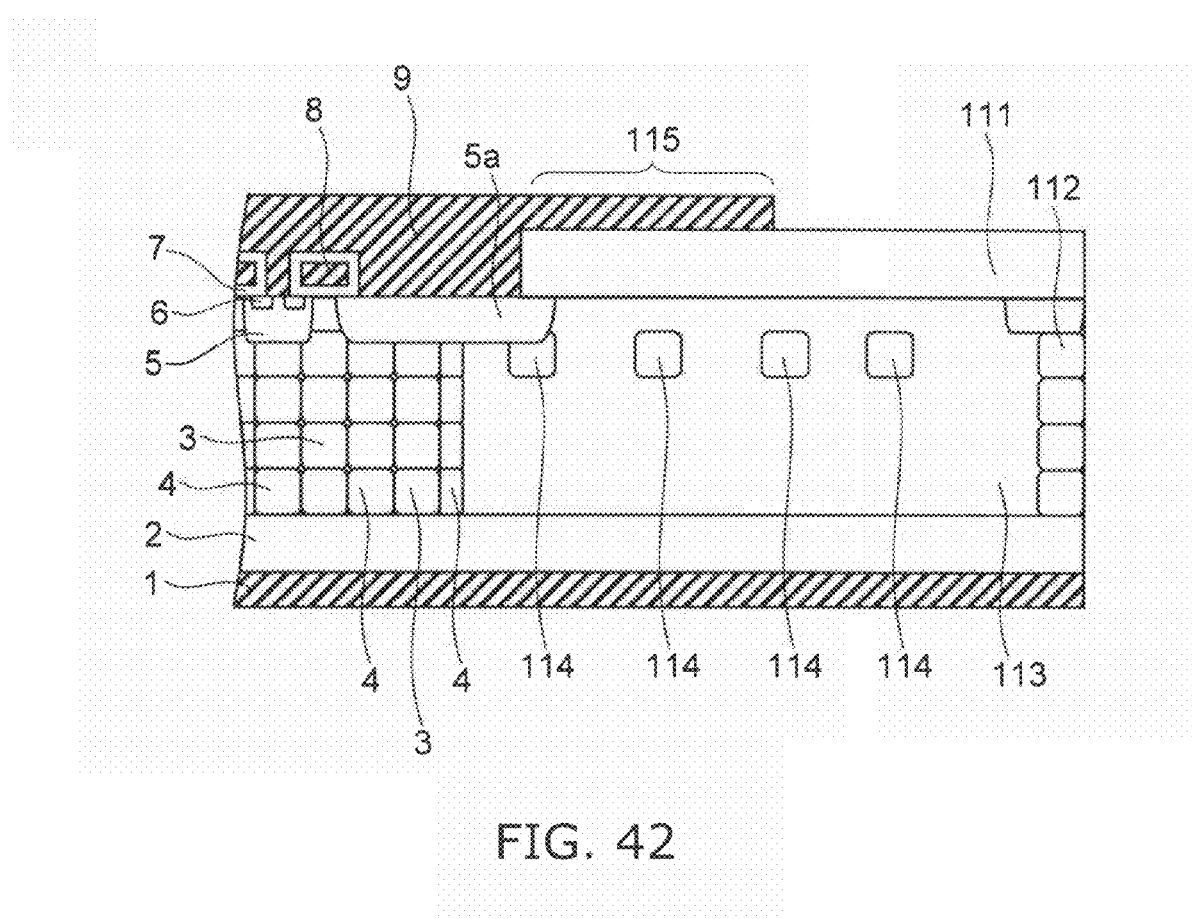
FIG. 42 is a schematic view showing still another example of the semiconductor device according to the eleventh embodiment.

As shown in FIG. 42, a buried guard ring layer 114 can be provided below the field plate electrode 115 where the thickness of the field insulating film 111 is not varied. A short field plate electrode 115 results in a large electric field at the edge of the outermost base region 5a. However, a buried guard ring layer 114 placed below the edge of the field plate electrode 115 can reduce the electric field, and enables the length of the field plate electrode 115 to be configured relatively freely.

In the structure shown in FIGS. 40 to 42, the field plate electrode 115 is connected to the source electrode 9. However, alternatively, the field plate electrode 115 can be connected to the gate electrode 8.

Twelfth Embodiment

Figure 43:
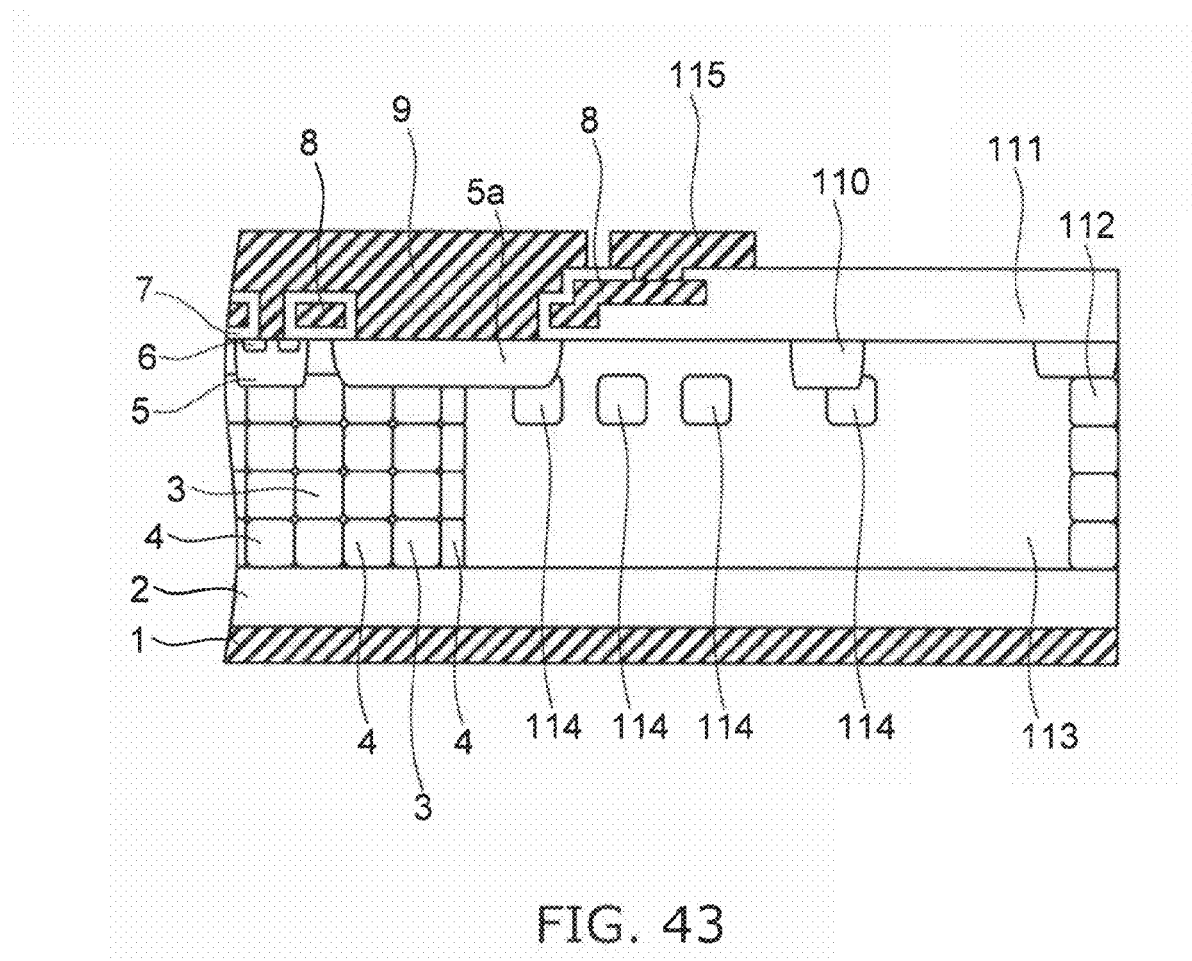
FIG. 43 is a schematic view illustrating the cross-sectional structure of the main part of a semiconductor device according to a twelfth embodiment of the invention.

FIG. 43 is a schematic view illustrating the cross-sectional structure of the main part of a semiconductor device according to a twelfth embodiment of the invention. The same elements as those in the foregoing embodiments are not described in detail, but only different elements are described here.

The edge termination structure shown in FIG. 43 is a combination of the field plate structure and the guard ring structure. A field plate electrode 115 is connected to the gate electrode 8, and a guard ring layer 10 is provided outside the field plate electrode 115.

Also in this embodiment, buried guard ring layers 114 are buried in the high-resistance layer 113 at positions corresponding to the portions susceptible to electric field concentration such as the edge of the outermost base region 5a, the edge of the field plate electrode 115, and the edge of the guard ring layer 110. Thus the electric field concentration in these portions can be reduced to achieve high reliability and high withstanding capability. In FIG. 43, the field plate electrode 115 is connected to the gate electrode 8. However, alternatively, the field plate electrode 115 can be connected to the source electrode 9.

Figure 44:
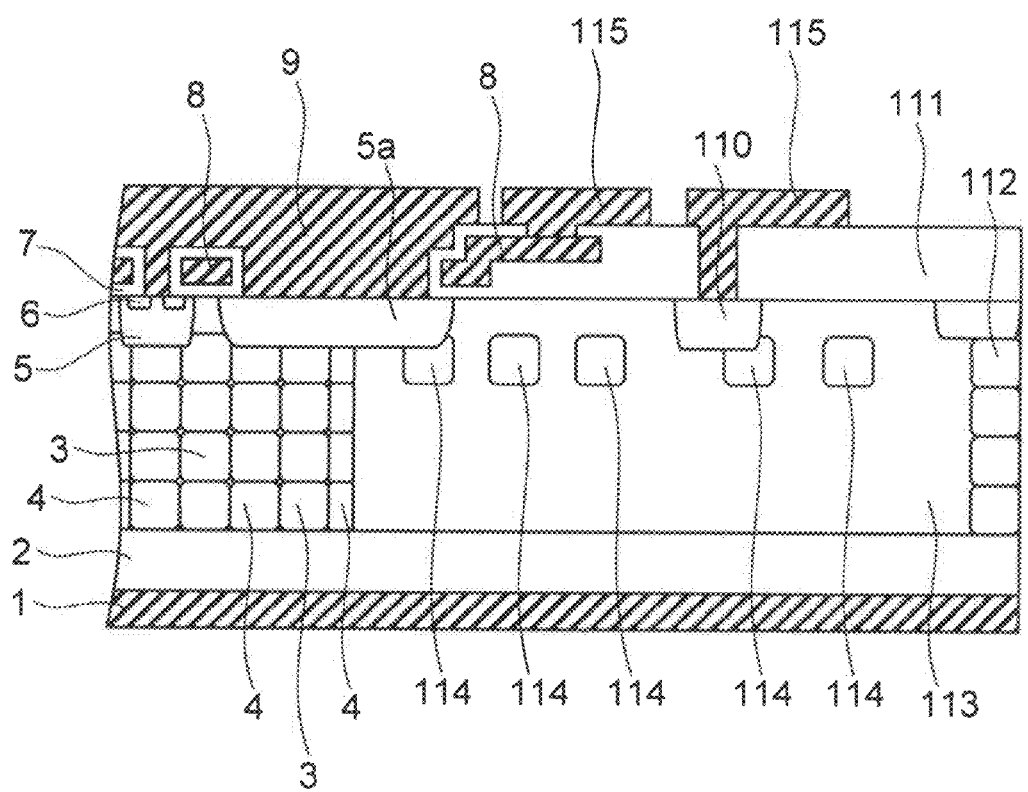
FIG. 44 is a schematic view showing another example of the semiconductor device according to the twelfth embodiment.

As shown in FIG. 44, the field plate electrode 115 can be connected to the guard ring layer 110. For preventing electric field concentration at the edge of the field plate electrode 115 connected to this guard ring layer 110, a buried guard ring layer 114 is preferably formed directly below the edge of the field plate electrode 115.

Thirteenth Embodiment

Figure 45:
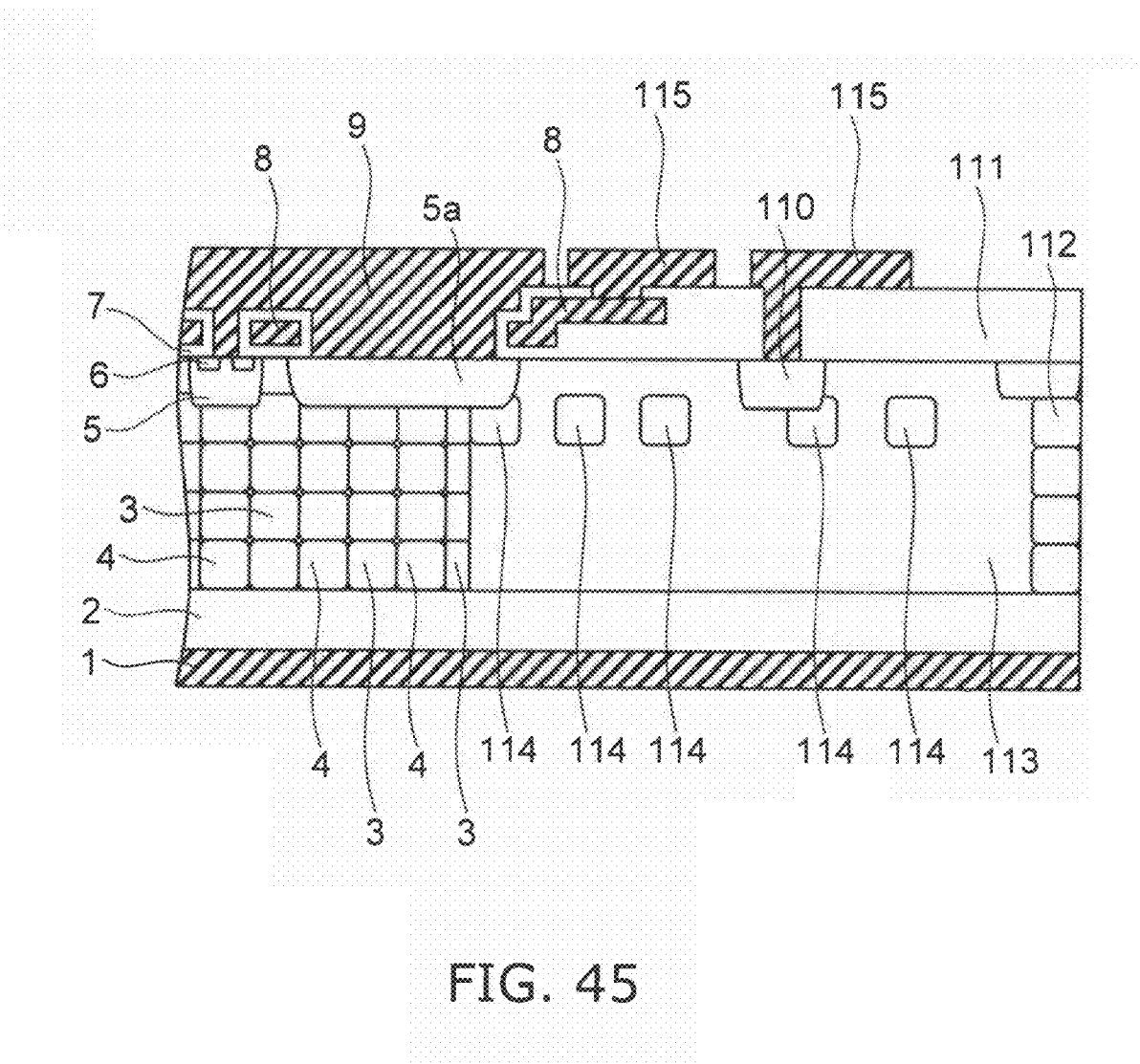
FIG. 45 is a schematic view illustrating the cross-sectional structure of the main part of a semiconductor device according to a thirteenth embodiment of the invention.

FIG. 45 is a schematic view illustrating the cross-sectional structure of the main part of a semiconductor device according to a thirteenth embodiment of the invention. The same elements as those in the foregoing embodiments are not described in detail, but only different elements are described here.

In the structure shown in FIG. 45, the outermost pillar region of the superjunction structure (e.g. n-type pillar region 3 in FIG. 45) is in contact with the buried guard ring layer 114 provided at the edge of the outermost base region 5a.

When the superjunction structure is formed near the edge of the outermost base region 5a, the breakdown voltage of the superjunction structure near the edge of the outermost base region 5a tends to decrease due to electric field concentration at the edge of the outermost base region 5a.

However, the buried guard ring layer 114 provided at the edge of the outermost base region 5a reduces the electric field concentration at the edge of the outermost base region 5a. Hence a high breakdown voltage can be achieved even if the superjunction structure extends to the vicinity of the edge of the outermost base region 5a. Extension of the superjunction structure to the vicinity of the edge of the outermost base region 5a enables the device active area to be increased and the chip ON resistance to be reduced.

Fourteenth Embodiment

Figure 46:
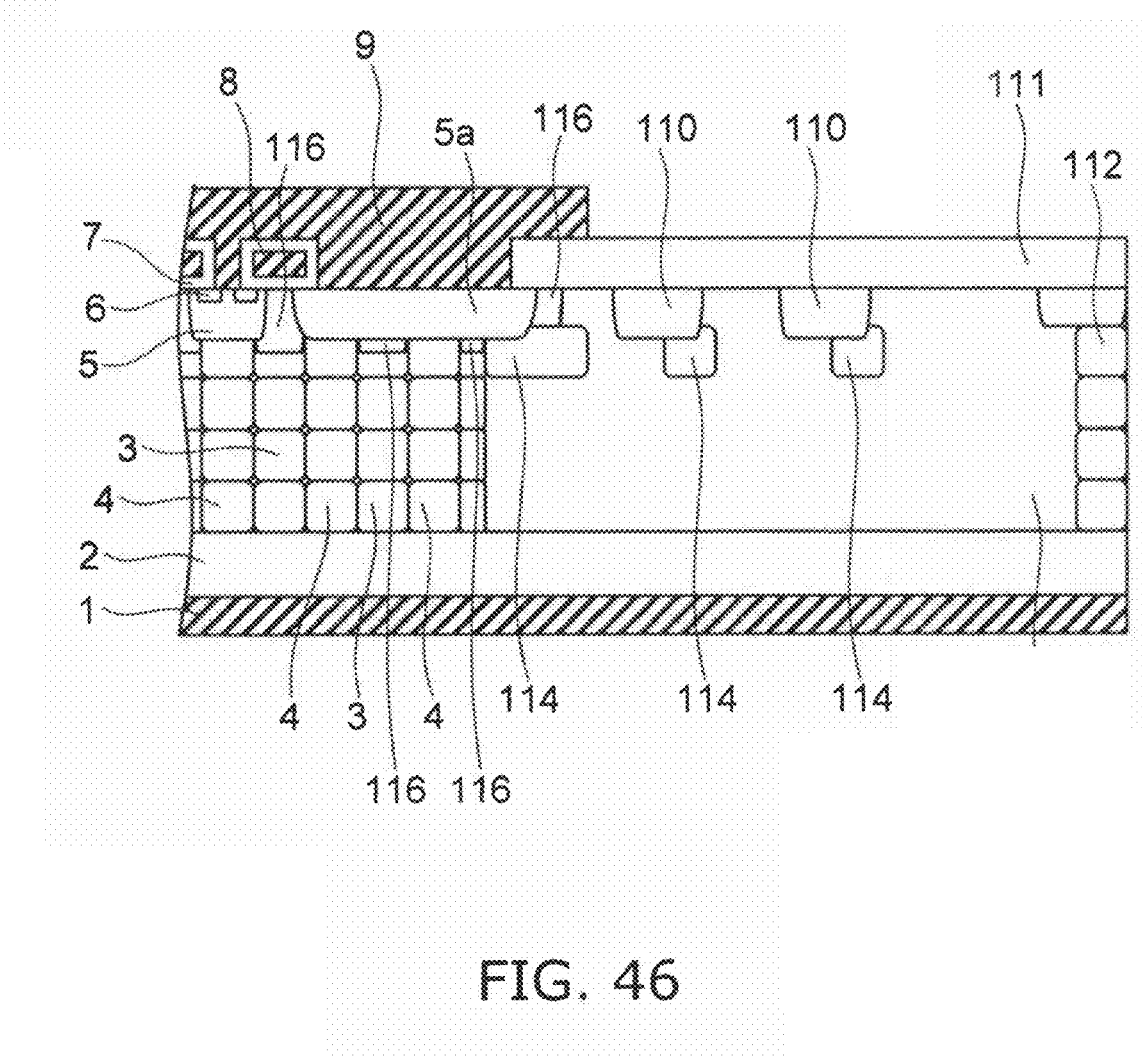
FIG. 46 is a schematic view illustrating the cross-sectional structure of the main part of a semiconductor device according to a fourteenth embodiment of the invention.

FIG. 46 is a schematic view illustrating the cross-sectional structure of the main part of a semiconductor device according to a fourteenth embodiment of the invention. The same elements as those in the foregoing embodiments are not described in detail, but only different elements are described here.

The structure shown in FIG. 46 includes a highly doped n-layer 116 having a higher dopant concentration than the n-type pillar region 3 and formed between the base regions 5 in the device section. Because the spacing between the base regions 5 is narrower than the width of the n-type pillar region 3, the resistance tends to increase. As the spacing between the base regions 5 becomes shorter, pinch-off is more likely to occur. To avoid this, the ON resistance can be reduced by increasing the dopant concentration in the highly doped n-layer 116 to the extent that the breakdown voltage does not decrease.

It is contemplated that the highly doped n-layer 116 can be formed simultaneously with the process for removing the field insulating film 111 in the device section. More specifically, after a field insulating film 111 is formed on the entire surface, a pattern for removing the field insulating film 111 in the device section is formed by lithography. Then the field insulating film 111 in the device section is etched away. Using this pattern of the field insulating film 111, ion implantation of n-type dopant, e.g. phosphorus (P), can be performed to form a highly doped n-layer 116. Thus the lithography process for etching the field insulating film 111 can be performed simultaneously with the lithography process for ion implantation in the highly doped n-layer 116, and the process steps can be reduced.

However, in this method, from the viewpoint of ensuring a desired diffusion depth of the highly doped n-layer 116, the highly doped n-layer 116 is formed before the base region 5 is formed. Hence the highly doped n-layer 116 is formed also outside the outermost base region 5a (nearer to the edge termination section). If the highly doped n-layer 116 is formed also outside the outermost base region 5a, electric field concentration occurs at the edge of the outermost base region 5a and decreases the breakdown voltage. However, a buried guard ring layer 114 formed at the edge of the outermost base region 5a can reduce the electric field at the edge of the outermost base region 5a and hold high breakdown voltage. The buried guard ring layer 114 is preferably formed so as to extend more outside the highly doped n-layer 116 for sufficiently reducing the electric field at the edge of the outermost base region 5a.

Because the electric field concentration at the edge of the outermost base region 5a is reduced by the buried guard ring layer 114 provided at the edge of the outermost base region 5a, the highly doped n-layer 116 formed outside the outermost base region 5a does not need to be replaced by a p-type layer in a separate process, for example. Thus the process steps can be reduced.

Figure 47:
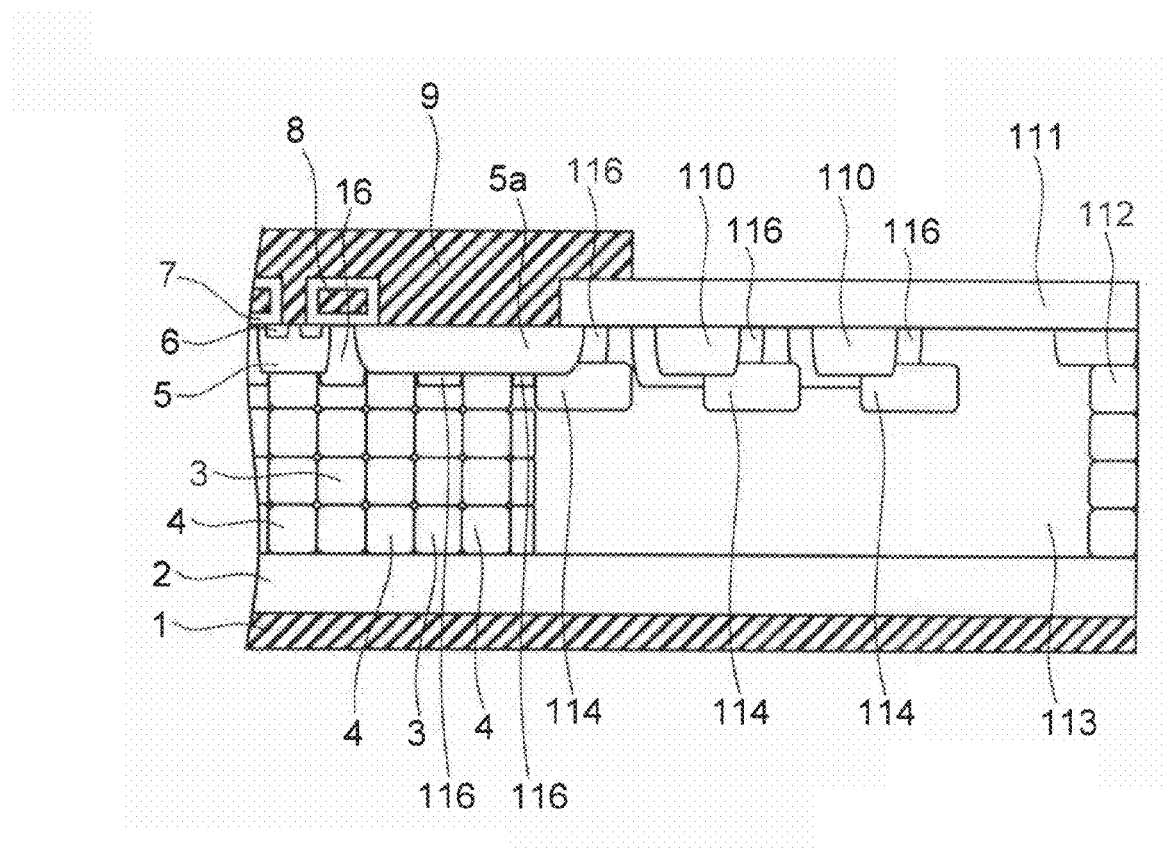
FIG. 47 is a schematic view showing another example of the semiconductor device according to the fourteenth embodiment.

When the guard ring layer 110 is formed simultaneously with the base region 5, the highly doped n-layer 116 is formed also outside the guard ring layer 110 as shown in FIG. 47. In this case, preferably, a buried guard ring layer 114 is formed so as to extend more outside the highly doped n-layer 116 formed outside the guard ring layer 110 for reducing the electric field at the edge of the guard ring layer 110.

Also in the field plate edge termination structure, when the lithography process for etching the field insulating film 111 is performed simultaneously with the lithography process for ion implantation in the highly doped n-layer 116 to reduce the process steps as in the guard ring edge termination structure, the highly doped n-layer 116 is formed also outside the outermost base region 5a. Hence, as in the foregoing, a buried guard ring layer 114 can be formed to the outside of the highly doped n-layer 116 to achieve high breakdown voltage.

Fifteenth Embodiment

Figure 48:
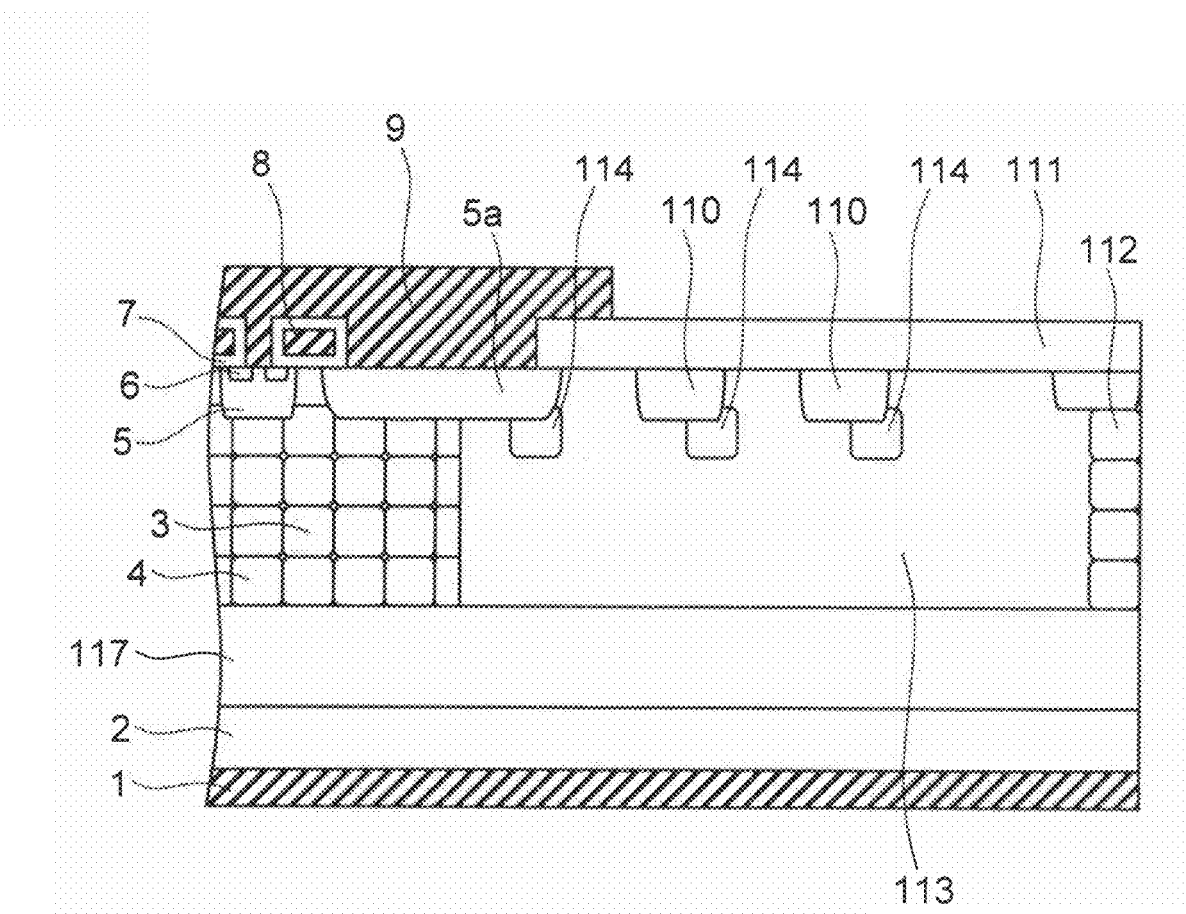
FIG. 48 is a schematic view illustrating the cross-sectional structure of the main part of a semiconductor device according to a fifteenth embodiment of the invention.

FIG. 48 is a schematic view illustrating the cross-sectional structure of the main part of a semiconductor device according to a fifteenth embodiment of the invention. The same elements as those in the foregoing embodiments are not described in detail, but only different elements are described here.

The structure shown in FIG. 48 includes an $n^-$-layer 117 on the drain layer 2, and the superjunction structure and the high-resistance layer 113 are formed on the $n^-$-layer 117. Upon application of voltage between the source and the drain, the $n^-$-layer 117 is depleted to hold the voltage. Thus the device breakdown voltage can be increased by the amount of the holding voltage of the $n^-$-layer 117. By varying the dopant concentration and the thickness of the $n^-$-layer 117, it is possible to vary the holding voltage of the $n^-$-layer 117, and hence the device breakdown voltage. Preferably, the $n^-$-layer 117 has a lower dopant concentration than the n-type pillar region 3 for sufficiently depleting the $n^-$-layer 117.

Sixteenth Embodiment

Figure 49:
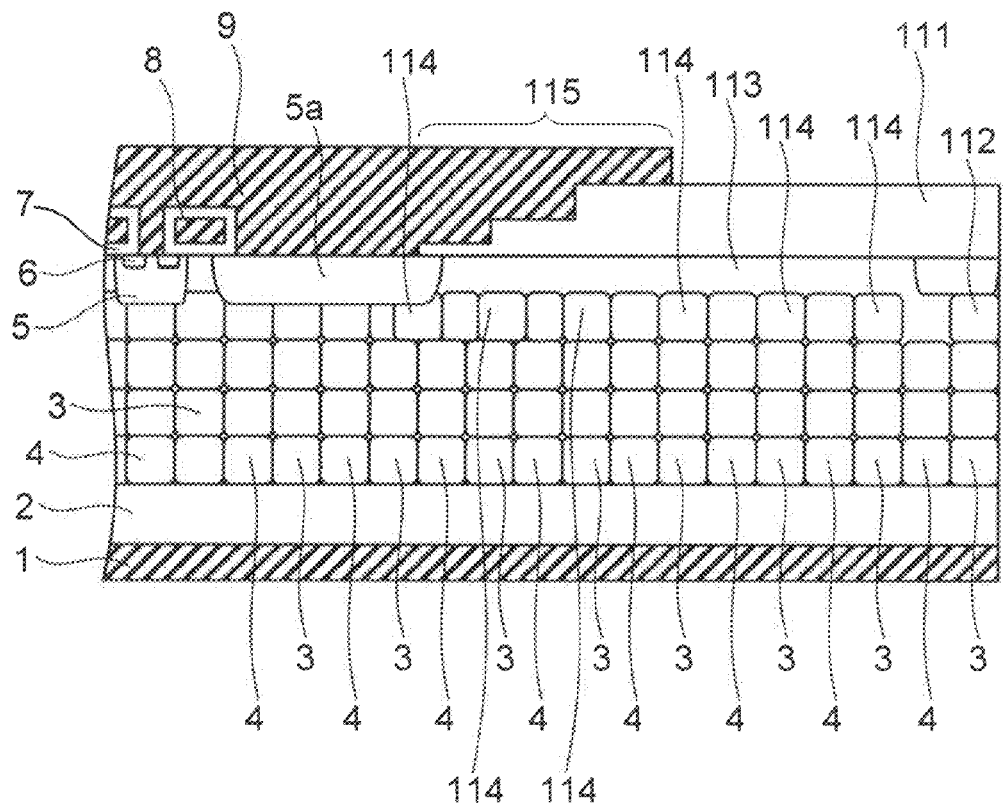
FIG. 49 is a schematic view illustrating the cross-sectional structure of the main part of a semiconductor device according to a sixteenth embodiment of the invention.

FIG. 49 is a schematic view illustrating the cross-sectional structure of the main part of a semiconductor device according to a sixteenth embodiment of the invention.

Figure 50A:
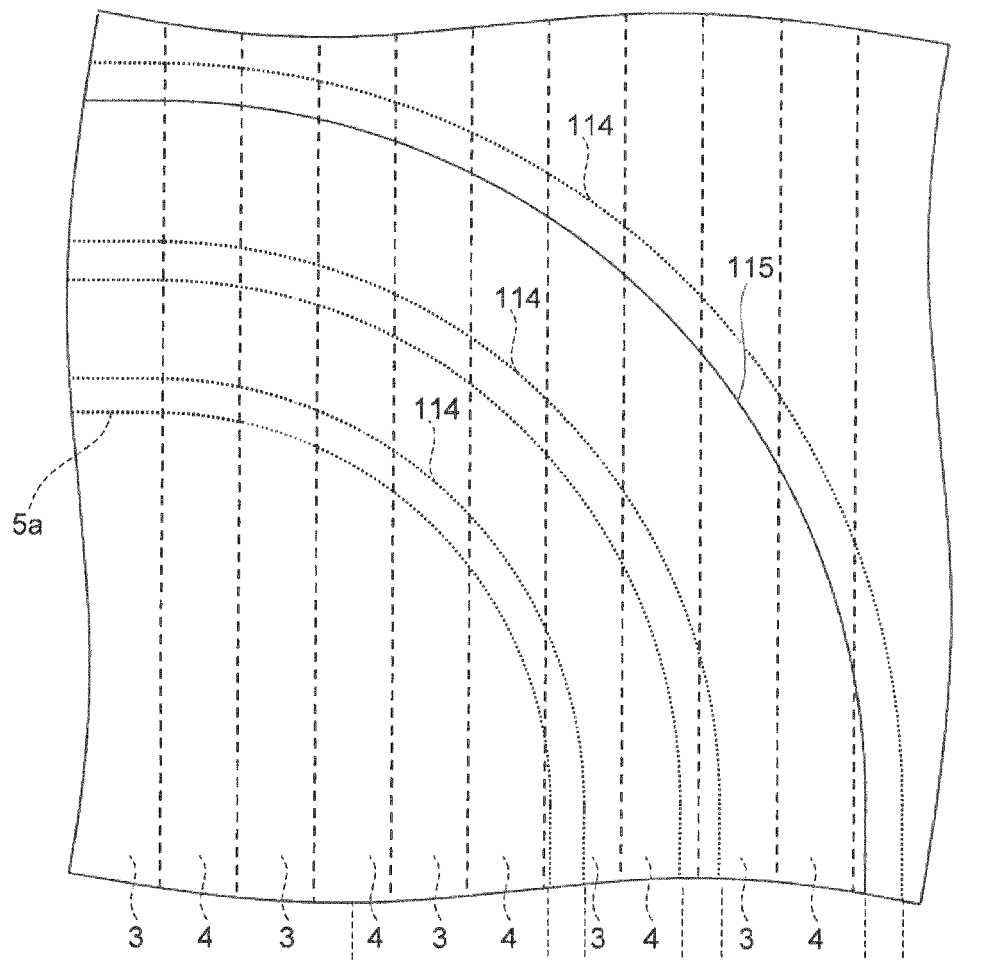
FIG. 50A is a schematic view showing an example planar pattern of the main part in FIG. 49.
Figure 50B:
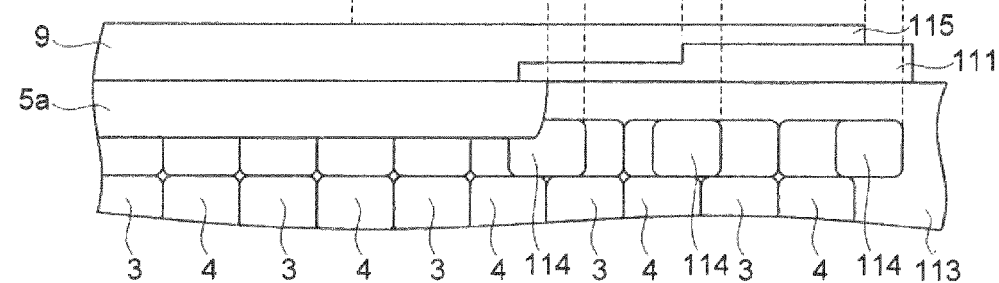
FIG. 50B is an enlarged view of the main part.

FIG. 50A is a schematic view showing an example planar pattern of the main part in FIG. 49, and FIG. 50B is an enlarged view of the main part.

FIG. 51A is a schematic view showing another example planar pattern of the main part in FIG. 49, and FIG. 51B is an enlarged view of the main part as in FIG. 50B.

In the structure shown in FIG. 49, the superjunction structure is formed also in the edge termination section. Also in this case, buried guard ring layers 114 can be formed at positions susceptible to electric field concentration such as the edge of the outermost base region 5a and the edge of the field plate electrode 115 to achieve high reliability and high withstanding capability.

The buried guard ring layers 114 can be placed independently of the position of the superjunction structure. For example, as shown in FIG. 50, the n-type pillar regions 3 and p-type pillar regions 4 are formed in a striped configuration, whereas the buried guard ring layers 114 concentrically enclose the corner of the outermost base region 5a and the corner of the field plate electrode 115.

As shown in FIG. 51, the p-type pillar regions 4 can be placed in a lattice configuration. Alternatively, the p-type pillar regions 4 can be placed in a houndstooth check configuration.

In order to increase the breakdown voltage of the edge termination section, the dopant concentration in the superjunction structure and the buried guard ring layers 114 of the edge termination section is preferably lower than that in the superjunction structure of the device section for facilitating depletion.

The same effect can be achieved whether the outermost portion of the superjunction structure of the device section is the p-type pillar region or the n-type pillar region.

The planar pattern of the MOS gate portion and the superjunction structure is not limited to the striped configuration, but may be in a lattice or houndstooth check configuration. While the MOS gate structure is described with reference to a planar structure, it is also possible to use a trench structure.

Figure 52:
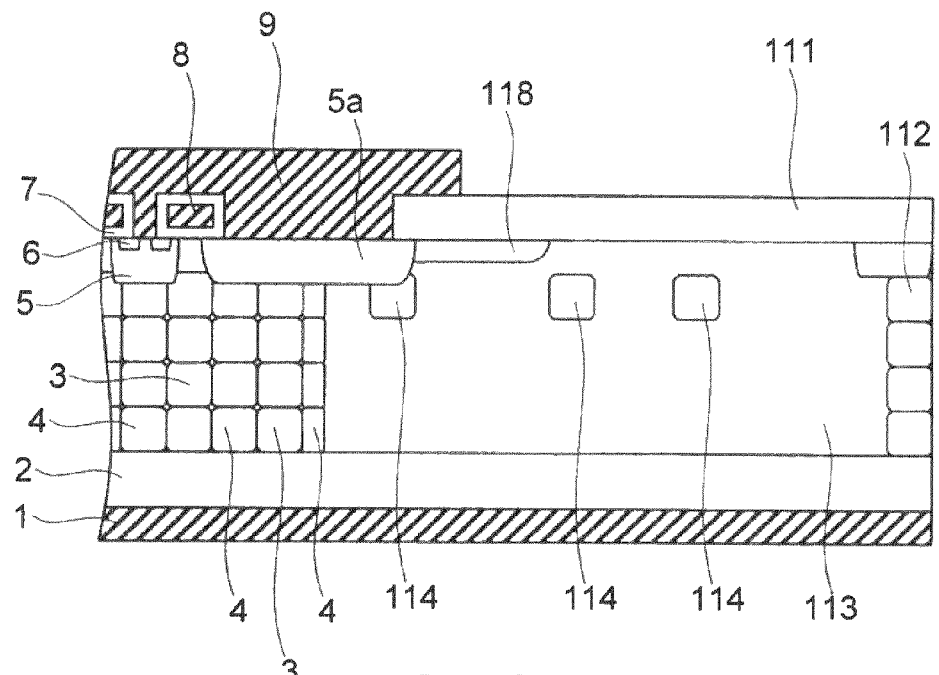
FIG. 52 is a schematic view illustrating another structure of the surface of the edge termination section in the semiconductor device according to the embodiment of the invention.
Figure 53:
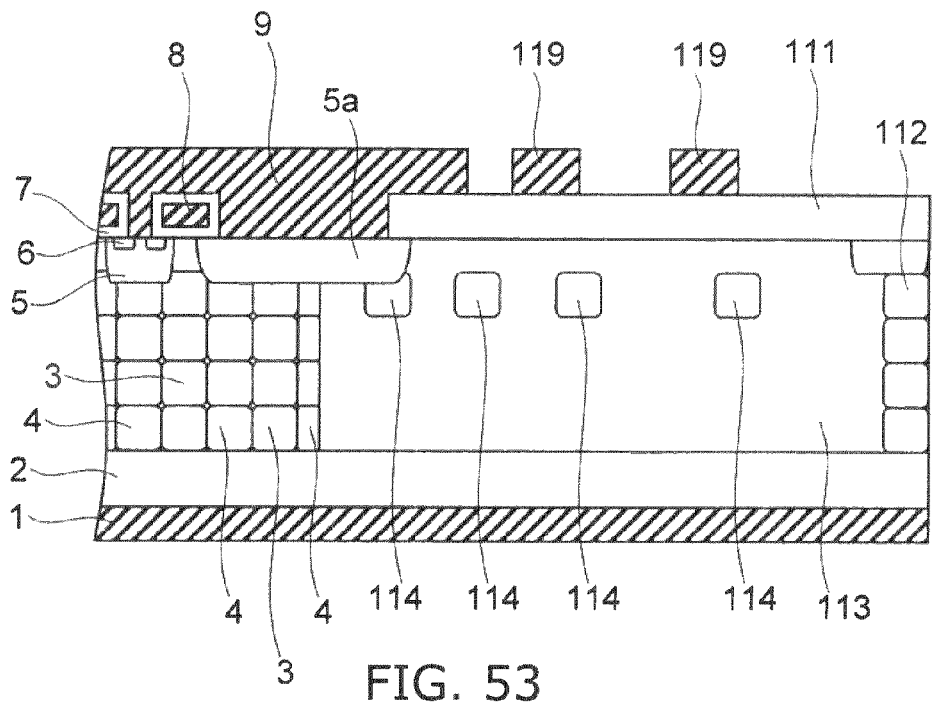
FIG. 53 is a schematic view illustrating still another structure of the surface of the edge termination section in the semiconductor device according to the embodiment of the invention.
Figure 54:
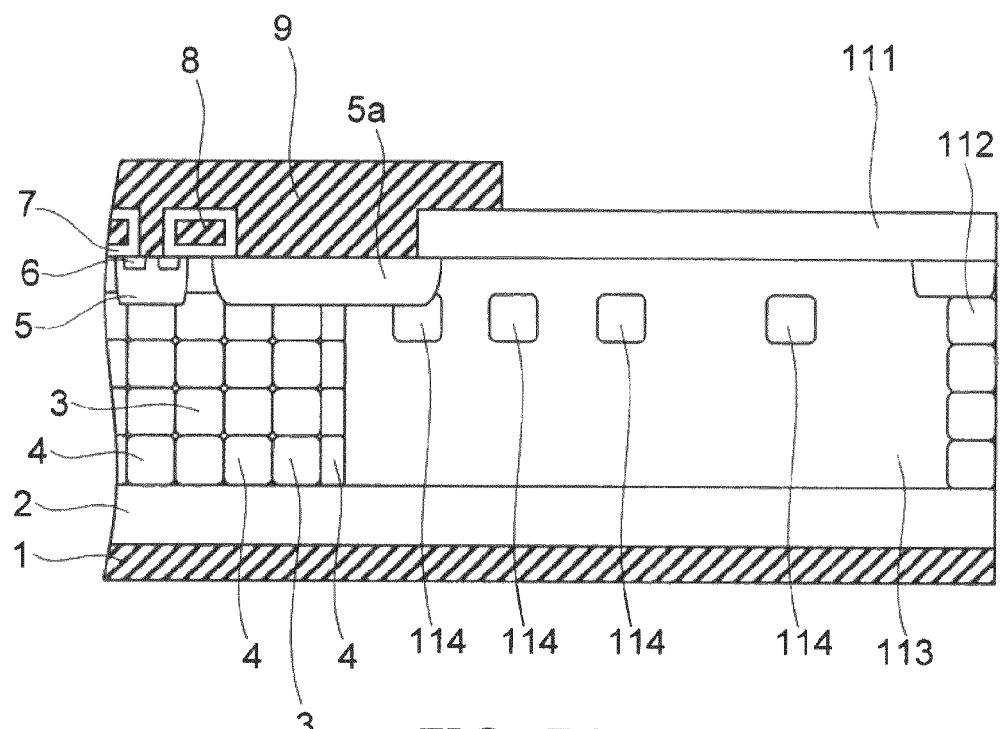
FIG. 54 is a schematic view illustrating still another structure of the surface of the edge termination section in the semiconductor device according to the embodiment of the invention.

In the foregoing embodiments, a guard ring structure or a field plate structure is used in the surface of the edge termination section. However, the invention is not limited to the surface structure of the edge termination section. For example, it is possible to use a structure having a RESURF (Reduced Surface Field) layer 118 in the surface of the high-resistance layer 113 as shown in FIG. 52, a structure having a floating field plate electrode 119 on the field insulating film 111 as shown in FIG. 53, and a structure only having a buried guard ring layer 114 as shown in FIG. 54.

In the structure having a plurality of buried guard ring layers 114, the electric field distribution in the edge termination section can be made more gradual if the spacing between adjacent buried guard ring layers 114 is increased toward the outermost portion of the edge termination section.

The p-type pillar region 4 does not need to be in contact with the drain layer 2. In the superjunction structure formed by ion implantation into the substrate surface with a high-resistance layer 113 grown thereon, the p-type pillar region 4 is in contact with the drain layer 2. However, by growing an n-type semiconductor layer on the drain layer 2, it is possible to form a structure where the p-type pillar region is not in contact with the drain layer 2.

Seventeenth Embodiment

Figure 55:
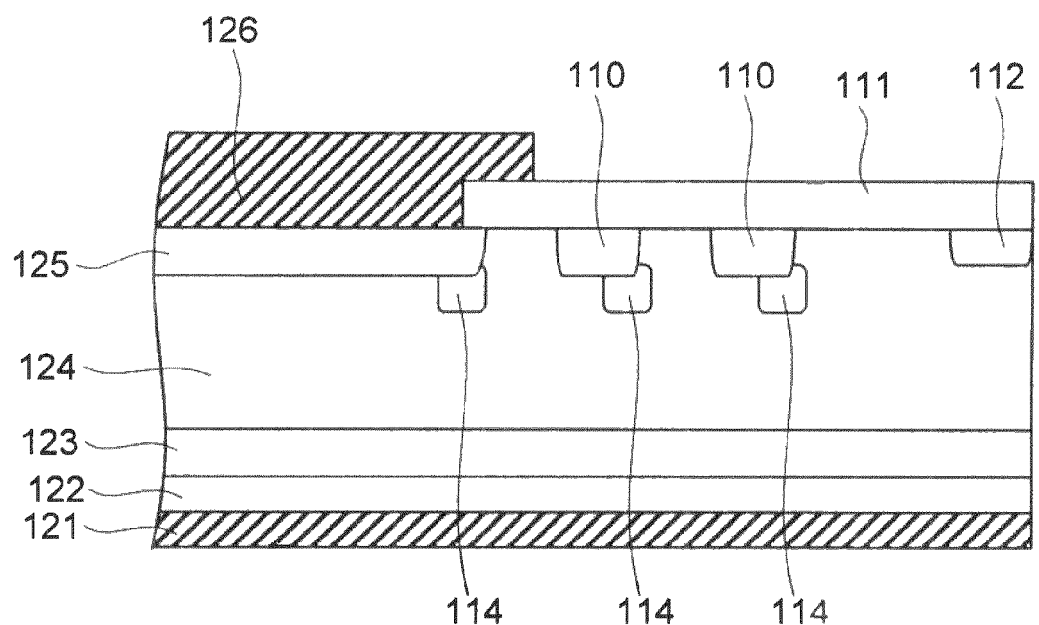
FIG. 55 is a schematic view illustrating the cross-sectional structure of the main part of a semiconductor device according to a seventeenth embodiment of the invention.

FIG. 55 is a schematic view illustrating the cross-sectional structure of the main part of a semiconductor device according to a seventeenth embodiment of the invention. The semiconductor device according to this embodiment is a pin (p-intrinsic-n) diode.

On a major surface of a cathode (first semiconductor layer) 122 of highly doped n$^+$-type silicon, a buffer layer 123 of n-type silicon is provided. A drift layer (second semiconductor layer) 124 of n$^-$-type silicon is provided on the buffer layer 123.

An anode region (semiconductor region) 125 of p$^+$-type silicon is provided on the drift layer 124 in the device section. An anode electrode (second main electrode) 126 is provided on the anode region 125 in contact therewith. A cathode electrode (first main electrode) 121 is provided on the side opposite to the major surface of the cathode layer 122.

A guard ring layer 110 of p-type silicon is formed in the surface of the drift layer 124 in the edge termination section. A buried guard ring layer 114 of p-type silicon is buried in the drift layer 124 of the edge termination section so as to contiguously cover the outer corner of the anode region 125 and the guard ring layer 110. The dopant concentration in the buried guard ring layer 114 is configured so that the buried guard ring layer 114 is completely depleted upon application of high voltage between the source and the drain.

Also in this embodiment, a buried guard ring layer 114 is buried in the portion susceptible to electric field concentration such as the outer corner of the anode region 125 and the guard ring layer 110. This can prevent local electric field concentration at that portion and alleviate the electric field. Upon application of high voltage between the anode and the cathode, the buried guard ring layer 114 is depleted, and an electric field is also applied to the inside of the buried guard ring layer 114 and produces a gradual electric field distribution in the edge termination section. The depletion of the buried guard ring layer 114 increases the electric field other than at the peak, but local avalanche breakdown becomes less likely to occur because the peak electric field is decreased. Thus high reliability and high withstanding capability can be achieved.

Like the p-type pillar region of the superjunction structure in the foregoing embodiments, the buried guard ring layer 114 can be formed by ion implantation followed by buried crystal growth or by accelerated ion implantation.

Eighteenth Embodiment

Figure 56:
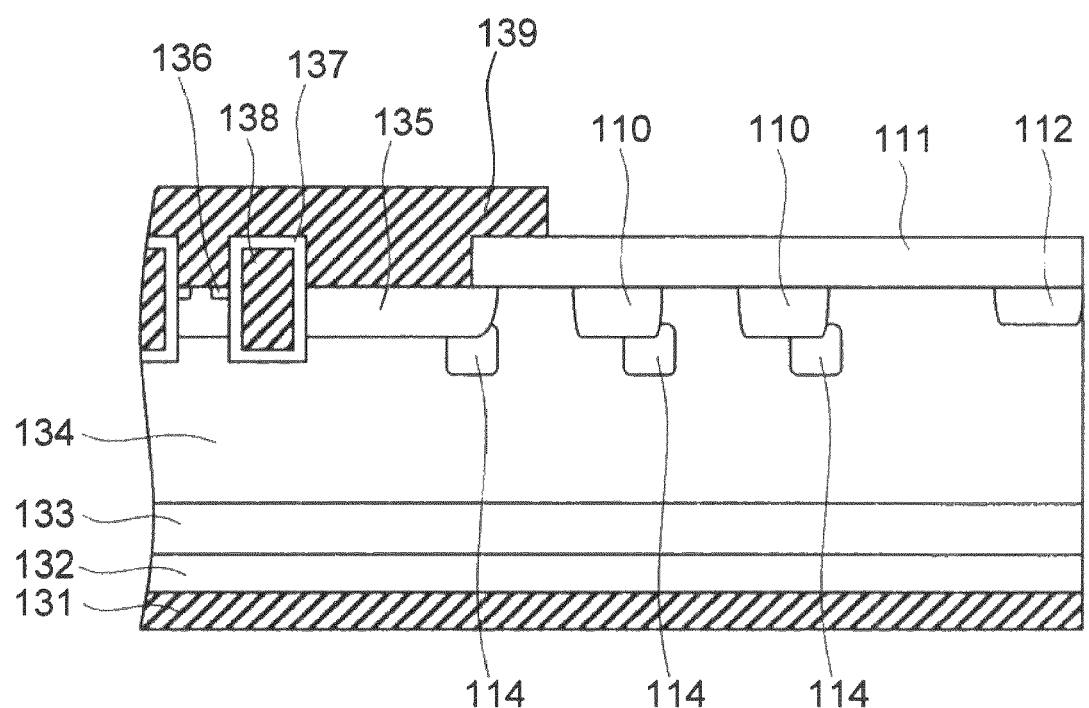
FIG. 56 is a schematic view illustrating the cross-sectional structure of the main part of a semiconductor device according to an eighteenth embodiment of the invention.

FIG. 56 is a schematic view illustrating the cross-sectional structure of the main part of a semiconductor device according to an eighteenth embodiment of the invention. The semiconductor device according to this embodiment is an IGBT (Insulated Gate Bipolar Transistor).

On a major surface of a collector layer (first semiconductor layer) 132 of highly doped p$^+$-type silicon, a buffer layer 133 of n-type silicon is provided. A base layer (second semiconductor layer) 134 of n-type silicon is provided on the buffer layer 133.

A base region (first semiconductor region) 135 of p-type silicon is provided in the surface of the base layer 134 in the device section. An emitter region (second semiconductor region) 136 of n-type silicon is selectively provided in the surface of the base region 135.

In the device section, a trench passing through the base region 135 and extending to the base layer 134 is selectively formed. The trench is filled in with a control electrode (gate electrode) 138 via an insulating film 137. The control electrode 138 is opposed across the insulating film 137 to the emitter region 136 and to the base region 135 between the emitter region 136 and the base layer 134.

An emitter electrode (second main electrode) 139 is provided in contact with the emitter region 136 and the base region 135. A collector electrode (first main electrode) 131 is provided on the side opposite to the major surface of the collector layer 132.

A guard ring layer 110 of p-type silicon is formed in the surface of the base layer 134 in the edge termination section. A buried guard ring layer 114 of p-type silicon is buried in the base layer 134 of the edge termination section so as to contiguously cover the outer corner of the base region 135 and the guard ring layer 110. The dopant concentration in the buried guard ring layer 114 is configured so that the buried guard ring layer 114 is completely depleted upon application of high voltage between the emitter and the collector.

Also in this embodiment, a buried guard ring layer 114 is buried in the portion susceptible to electric field concentration such as the outer corner of the base region 135 and the guard ring layer 110. This can prevent local electric field concentration at that portion and alleviate the electric field. Upon application of high voltage between the emitter and the collector, the buried guard ring layer 114 is depleted, and an electric field is also applied to the inside of the buried guard ring layer 114 and produces a gradual electric field distribution in the edge termination section. The depletion of the buried guard ring layer 114 increases the electric field other than at the peak, but local avalanche breakdown becomes less likely to occur because the peak electric field is decreased. Thus high reliability and high withstanding capability can be achieved.

Like the p-type pillar region of the superjunction structure in the foregoing embodiments, the buried guard ring layer 114 can be formed by ion implantation followed by buried crystal growth or by accelerated ion implantation. The IGBT can be also based on a planar gate structure or a non-punch-through structure.

The embodiments of the invention have been described. However, the invention is not limited to the above embodiments.

For example, the above embodiments assume the first conductivity type as n-type and the second conductivity type as p-type. However, it is also possible to assume the first conductivity type as p-type and the second conductivity type as n-type.

The outermost pillar region in the boundary region is not limited to the p-type pillar region, but can be the n-type pillar region to achieve an equivalent effect in a similar design.

The planar pattern of the MOS gate portion and the superjunction structure is not limited to a striped configuration, but can be formed in a lattice or houndstooth check configuration.

While the MOS gate structure is described with reference to a planar structure, it is also possible to use a trench structure.

The p-type pillar region 4 does not need to be in contact with the n$^+$-drain layer 2. Because the superjunction structure is formed by ion implantation into the substrate surface with a high-resistance layer grown thereon, the p-type pillar region 4 is in contact with the n$^+$-drain layer 2. However, by growing an n-type semiconductor layer on the n$^+$-drain layer 2, it is possible to form a structure where the p-type pillar region is not in contact with the n$^+$-drain layer.

In the MOSFETs described above, silicon (Si) is used as a semiconductor. However, the semiconductor can illustratively be any one of silicon carbide (SiC), gallium nitride (GaN), and other compound semiconductors, and diamond and other wide bandgap semiconductors.

The invention has been described with reference to a MOSFET having a superjunction structure. However, the structure according to the invention is also applicable to any devices having a superjunction structure, such as an SBD (Schottky Barrier Diode), a hybrid device of MOSFETs and SBDs, an SIT (Static Induction Transistor), and an IGBT (Insulated Gate Bipolar Transistor).

The invention claimed is:

1. A semiconductor device comprising:
   a first semiconductor layer of a first conductivity type;
   a first semiconductor pillar region of the first conductivity type provided on a major surface of the first semiconductor layer;
   a second semiconductor pillar region of a second conductivity type provided adjacent to the first semiconductor pillar region on the major surface of the first semiconductor layer, the second semiconductor pillar region forming a periodic arrangement structure substantially parallel to the major surface of the first semiconductor layer together with the first semiconductor pillar region;
   a first main electrode provided on a side opposite to the major surface of the first semiconductor layer;
   a first semiconductor region of the second conductivity type selectively provided on the first semiconductor pillar region and the second semiconductor pillar region;
   a second semiconductor region of the first conductivity type selectively provided in a surface of the first semiconductor region;
   a second main electrode provided in contact with the first semiconductor region and the second semiconductor region;
   a control electrode provided on the first semiconductor region, the second semiconductor region, and the first semiconductor pillar region via an insulating film;
   a second semiconductor layer of the first conductivity type provided on the first semiconductor layer in an edge termination section outside a device section including the periodic arrangement structure of the first semiconductor pillar region and the second semiconductor pillar region, the second semiconductor layer having a lower dopant concentration than the first semiconductor pillar region;
   a buried guard ring layer of the second conductivity type semiconductor selectively buried in the second semiconductor layer, the buried guard ring layer being a low-dopant concentrated layer which is depleted upon application of high voltage; and
   a guard ring layer of the second conductivity type semiconductor selectively buried in a surface of the second semiconductor layer in the edge termination section, the buried guard ring layer being provided in contact with an outer corner on the edge termination section side of a bottom of the guard ring layer.

2. The semiconductor device according to claim 1, wherein the buried guard ring layer and the guard ring layer are provided concentrically.

3. A semiconductor device comprising:
   a first semiconductor layer of a first conductivity type;
   a first semiconductor pillar region of the first conductivity type provided on a major surface of the first semiconductor layer;
   a second semiconductor pillar region of a second conductivity type provided adjacent to the first semiconductor pillar region on the major surface of the first semiconductor layer, the second semiconductor pillar region forming a periodic arrangement structure substantially parallel to the major surface of the first semiconductor layer together with the first semiconductor pillar region;
   a first main electrode provided on a side opposite to the major surface of the first semiconductor layer;
   a first semiconductor region of the second conductivity type selectively provided on the first semiconductor pillar region and the second semiconductor pillar region;
   a second semiconductor region of the first conductivity type selectively provided in a surface of the first semiconductor region;
   a second main electrode provided in contact with the first semiconductor region and the second semiconductor region;
   a control electrode provided on the first semiconductor region, the second semiconductor region, and the first semiconductor pillar region via an insulating film;
   a second semiconductor layer of the first conductivity type provided on the first semiconductor layer in an edge termination section outside a device section including the periodic arrangement structure of the first semiconductor pillar region and the second semiconductor pillar region, the second semiconductor layer having a lower dopant concentration than the first semiconductor pillar region;
   a guard ring layer of the second conductivity type semiconductor selectively buried in a surface of the second semiconductor layer in the edge termination section; and
   a buried guard ring layer of the second conductivity type semiconductor selectively buried in the second semiconductor layer, the buried guard ring layer being a low-dopant concentrated layer which is depleted upon application of high voltage, the buried guard ring layer provided in contact with an outer corner on the edge termination section side of a bottom of an outermost region in the first semiconductor region.

4. The semiconductor device according to claim 1, further comprising:
   a field insulating film provided on a surface of the second semiconductor layer, the field insulating film having a stepwise varied thickness,
   wherein the buried guard ring layer is provided below a corner of the field insulating film having the stepwise varied thickness.

5. The semiconductor device according to claim 1, further comprising:
   a field plate electrode provided on the second semiconductor layer, the field plate electrode being connected to the second main electrode or the control electrode,
   wherein the buried guard ring layer is provided below an edge of the field plate electrode.

6. The semiconductor device according to claim 3, wherein the buried guard ring layer and the guard ring layer are provided concentrically.

7. The semiconductor device according to claim 3, further comprising:
   a buffer layer of the first conductivity type semiconductor provided between the semiconductor layer, and the first semiconductor pillar region and the second semiconductor pillar region.

8. The semiconductor device according to claim 7, wherein the dopant concentration in the buffer layer is lower than the dopant concentration in the first semiconductor pillar region.

* * * * *